United States Patent
Kim et al.

(10) Patent No.: US 10,930,863 B2
(45) Date of Patent: Feb. 23, 2021

(54) ORGANOMETALLIC COMPOUND, ORGANIC LIGHT-EMITTING DEVICE INCLUDING ORGANOMETALLIC COMPOUND, AND DIAGNOSTIC COMPOSITION INCLUDING ORGANOMETALLIC COMPOUND

(71) Applicant: SAMSUNG ELECTRONICS CO., LTD., Suwon-si, Gyeonggi-do (KR)

(72) Inventors: Soyeon Kim, Seoul (KR); Jungin Lee, Hwaseong-si (KR); Kyuyoung Hwang, Anyang-si (KR); Jiyoun Lee, Anyang-si (KR); Seokhwan Hong, Seoul (KR); Yoonhyun Kwak, Seoul (KR); Ohyun Kwon, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 554 days.

(21) Appl. No.: 15/479,742

(22) Filed: Apr. 5, 2017

(65) Prior Publication Data
US 2018/0130964 A1 May 10, 2018

(30) Foreign Application Priority Data

Nov. 4, 2016 (KR) .......................... 10-2016-0146906

(51) Int. Cl.
H01L 51/00 (2006.01)
C09K 11/06 (2006.01)
(Continued)

(52) U.S. Cl.
CPC ...... H01L 51/0087 (2013.01); C07F 15/0086 (2013.01); C09K 11/025 (2013.01);
(Continued)

(58) Field of Classification Search
None
See application file for complete search history.

(56) References Cited

U.S. PATENT DOCUMENTS

2015/0105556 A1* 4/2015 Li .......................... C09K 11/06
546/4
2018/0244706 A1 8/2018 Lee et al.

FOREIGN PATENT DOCUMENTS

JP 2009-242293 A 10/2009

OTHER PUBLICATIONS

Priya Saxena et al. "Dimeric and monomeric fac-rhenium(I)tricarbonyl complexes containing 2-(imidazo[1,2-a]pyridin-2-yl)phenolate", Journal of Organometallic Chemistry 799-800 (2015) 82-89.

* cited by examiner

Primary Examiner — Jay Yang
(74) Attorney, Agent, or Firm — Cantor Colburn LLP

(57) ABSTRACT

An organometallic compound represented by Formula 1:

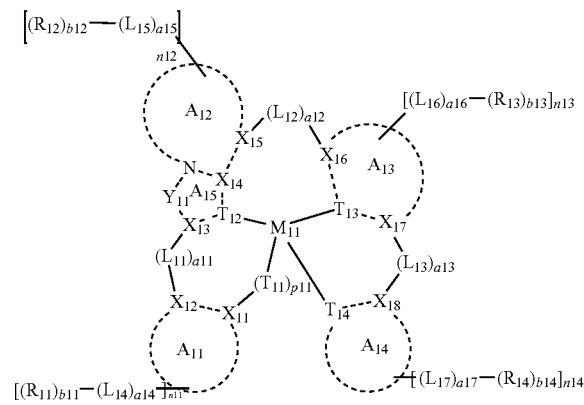

wherein, in Formula 1, groups and variables are the same as described in the specification.

21 Claims, 1 Drawing Sheet

(51) Int. Cl.
 *C09K 11/02* (2006.01)
 *C07F 15/00* (2006.01)
 *H01L 51/50* (2006.01)
 *H01L 51/56* (2006.01)
(52) U.S. Cl.
 CPC ...... *C09K 11/06* (2013.01); *C09K 2211/1007* (2013.01); *C09K 2211/1011* (2013.01); *C09K 2211/1014* (2013.01); *C09K 2211/1044* (2013.01); *C09K 2211/185* (2013.01); *H01L 51/001* (2013.01); *H01L 51/0081* (2013.01); *H01L 51/5016* (2013.01); *H01L 51/5056* (2013.01); *H01L 51/5072* (2013.01); *H01L 51/5092* (2013.01); *H01L 51/5096* (2013.01); *H01L 51/56* (2013.01); *H01L 2251/308* (2013.01)

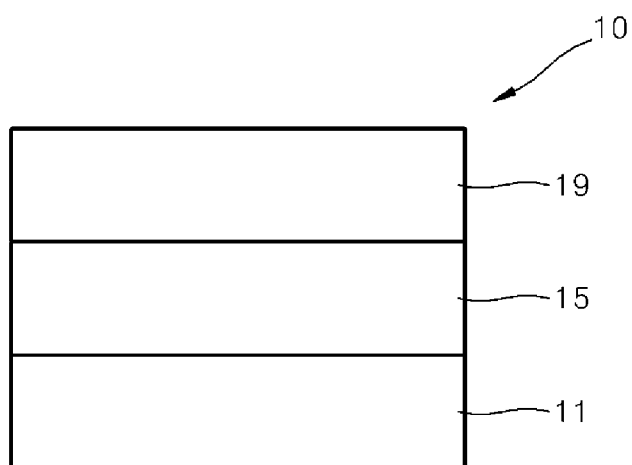

ORGANOMETALLIC COMPOUND, ORGANIC LIGHT-EMITTING DEVICE INCLUDING ORGANOMETALLIC COMPOUND, AND DIAGNOSTIC COMPOSITION INCLUDING ORGANOMETALLIC COMPOUND

CROSS-REFERENCE TO RELATED APPLICATION

This application claims priority to Korean Patent Application No. 10-2016-0146906, filed on Nov. 4, 2016, in the Korean Intellectual Property Office, and all the benefits accruing therefrom under 35 U.S.C. § 119, the content of which is incorporated herein in its entirety by reference.

BACKGROUND

1. Field

The present disclosure relates to an organometallic compound, an organic light-emitting device including the organometallic compound, and a diagnostic composition including the organometallic compound.

2. Description of the Related Art

Organic light-emitting devices (OLEDs) are self-emission devices that have wide viewing angles, exhibit excellent driving voltage and response speed characteristics, and produce full-color images.

Typical OLEDs include an anode, a cathode, and an organic layer disposed between the anode and the cathode, wherein the organic layer includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. The excitons may transition from an excited state to a ground state, thereby generating light.

Further, light-emitting compounds, e.g., phosphorescence-emitting compounds, can also be used to monitor, sense, or detect biological materials, including a variety of cells and proteins.

Various types of organic light emitting devices are known. However, there still remains a need in OLEDs having low driving voltage, high efficiency, high brightness, and long lifespan.

SUMMARY

Provided are an organometallic compound, an organic light-emitting device including the organometallic compound, and a diagnostic composition including the organometallic compound.

Additional aspects will be set forth in part in the description which follows and, in part, will be apparent from the description, or may be learned by practice of the presented embodiments.

According to an aspect of an embodiment, an organometallic compound is represented by Formula 1:

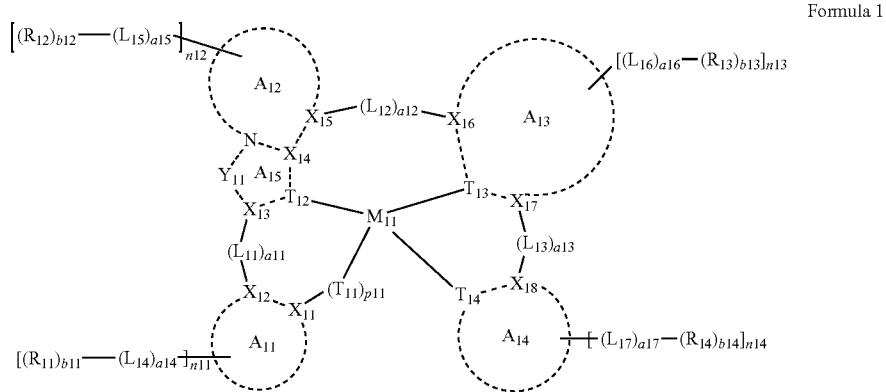

Formula 1 wherein, in Formula 1, $M_{11}$ is selected from beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver, (Ag), rhenium (Re), platinum (Pt), and gold (Au), $T_{11}$ is selected from oxygen (O) and sulfur (S), p11 is selected from 0 and 1; provided that when p11 is 0, *-$(T_{11})_{p11}$-*' is a single bond, $T_{12}$ to $T_{14}$ are each independently selected from nitrogen (N) and carbon (C), when p11 is 0, a bond between $X_{11}$ and $M_{11}$ is a covalent bond or a coordinate bond; when p11 is 1, provided that a bond between $T_{11}$ and $M_{11}$ is a covalent bond, i) when p11 is 0, two bonds selected from a bond between $X_{11}$ and $M_{11}$, a bond between $T_{12}$ and $M_{11}$, a bond between $T_{13}$ and $M_{11}$, and a bond between $T_{14}$ and $M_{11}$ may each be a covalent bond, and the other two bonds may each be a coordinate bond; or ii) when p11 is 1, two bonds selected from a bond between $T_{11}$ and $M_{11}$, a bond between $T_{12}$ and $M_{11}$, a bond between $T_{13}$ and $M_{11}$, and a bond between $T_{14}$ and $M_{11}$ may each be a covalent bond, and the other two bonds may each be a coordinate bond, $X_{11}$ to $X_{18}$ are each independently selected from C and N, a bond between $X_{11}$ and $X_{12}$, a bond between $X_{13}$ and $T_{12}$, a bond between $X_{13}$ and $Y_{11}$, a bond between $T_{12}$ and $X_{14}$, a bond between $X_{14}$ and N, a bond between $X_{14}$ and $X_{15}$, a bond between $Y_{11}$ and N, a bond between $X_{16}$ and $T_{13}$, a bond between $T_{13}$ and $X_{17}$, and a bond between $X_{18}$ and $T_{14}$ are each independently selected from a single bond and a double bond, $A_{11}$, $A_{13}$, and $A_{14}$ are each independently selected from a $C_5$-$C_{30}$ carbocyclic group and a $C_1$-$C_{30}$ heterocyclic group, $A_{12}$ and $A_{15}$ are each independently selected from a $C_1$-$C_{30}$ heterocyclic group, $L_{11}$ to $L_{13}$ are each independently selected from *—O—*', *—S—*', *—[C($R_{15}$)($R_{16}$)]$_{k11}$—*', *—C($R_{15}$)=*', *=C($R_{15}$)—*', *—C($R_{15}$)=C($R_{16}$)—*', *—C(=O)—*', *—C(=S)—*', *—C≡C—*', *—N($R_{15}$)—*', *—P($R_{15}$)—*', *—[Si($R_{15}$)($R_{16}$)]$_{k11}$—*', and *—P($R_{15}$)($R_{16}$)—*', $R_{15}$ and $R_{16}$ may optionally be bound via a first linking group to form a substituted or unsubstituted $C_5$-$C_{30}$ carbocyclic group or a substituted or unsubstituted $C_1$-$C_{30}$ heterocyclic group, k11 is selected from 1 and 2, a11 to a13 are each independently selected from 0, 1, 2, and 3; when a11 is 0, *-($L_{11}$)$_{a11}$-*' is a single bond; when a12 is 0, *-($L_{12}$)$_{a12}$-*' is a single bond; when a13 is 0, *-($L_{13}$)$_{a13}$-*' is a single bond, $Y_{11}$ is selected from N($R_{17}$), N, C($R_{17}$)($R_{18}$), C($R_{17}$), Si($R_{17}$)($R_{18}$), Si($R_{17}$), and C(=O), $R_{17}$ and $R_{18}$ may optionally be bound via a second linking group to form a substituted or unsubstituted $C_5$-$C_{30}$ carbocyclic group or a substituted or unsubstituted $C_1$-$C_{30}$ heterocyclic group, $L_{14}$ to $L_{17}$ are each independently selected from a substituted or unsubstituted $C_5$-$C_{30}$ carbocyclic group and a substituted or unsubstituted $C_1$-$C_{30}$ heterocyclic group, a14 to a17 are each independently selected from 0, 1, 2, 3, 4, and 5, $R_{11}$ to $R_{18}$ are each independently selected from hydrogen, deuterium, —F, —Cl, —Br, —I, —SF$_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(=O)($Q_8$)($Q_9$), b11 to b14 are each independently selected from 1, 2, 3, 4, and 5, n11 to n14 are each independently selected from 0, 1, 2, 3, 4, and 5, two adjacent groups $R_{11}$ of a plurality of groups $R_{11}$ may optionally be bound to form a substituted or unsubstituted $C_5$-$C_{30}$ carbocyclic group or a substituted or unsubstituted $C_1$-$C_{30}$ heterocyclic group, two adjacent groups $R_{12}$ of a plurality of groups $R_{12}$ may optionally be bound to form a substituted or unsubstituted $C_5$-$C_{30}$ carbocyclic group or a substituted or unsubstituted $C_1$-$C_{30}$ heterocyclic group, two adjacent groups $R_{13}$ of a plurality of groups $R_{13}$ may optionally be bound to form a substituted or unsubstituted $C_5$-$C_{30}$ carbocyclic group or a substituted or unsubstituted $C_1$-$C_{30}$ heterocyclic group, two adjacent groups $R_{14}$ of a plurality of groups $R_{14}$ may optionally be bound to form a substituted or unsubstituted $C_5$-$C_{30}$ carbocyclic group or a substituted or unsubstituted $C_1$-$C_{30}$ heterocyclic group, at least two of $R_{11}$ to $R_{14}$, wherein the at least two of $R_{11}$ to $R_{14}$ are adjacent to each other, may optionally be bound to form a substituted or unsubstituted $C_5$-$C_{30}$ carbocyclic group or a substituted or unsubstituted $C_1$-$C_{30}$ heterocyclic group, wherein $Q_1$ to $Q_9$ are each independently selected from hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group; a $C_1$-$C_{60}$ alkyl group substituted with at least one of deuterium, a $C_1$-$C_{60}$ alkyl group, and a $C_6$-$C_{60}$ aryl group; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group; a $C_6$-$C_{60}$ aryl group substituted with at least one of deuterium, a $C_1$-$C_{60}$ alkyl group, and a $C_6$-$C_{60}$ aryl group; a $C_6$-$C_{60}$ aryloxy group; a $C_6$-$C_{60}$ arylthio group; a $C_1$-$C_{60}$ heteroaryl group; a monovalent non-aromatic condensed polycyclic group; and a monovalent non-aromatic condensed heteropolycyclic group, and

* and *' each independently indicate a binding site to an adjacent atom.

According to an aspect of another embodiment, an organic light-emitting device includes:

a first electrode;

a second electrode; and an organic layer disposed between the first electrode and the second electrode, wherein the organic layer includes an emission layer and at least one organometallic compound represented by Formula 1.

According to an aspect of another embodiment, there is provided a diagnostic composition including at least one organometallic compound represented by Formula 1.

BRIEF DESCRIPTION OF THE FIGURE

These and/or other aspects will become apparent and more readily appreciated from the following description of the embodiments, taken in conjunction with the accompanying FIGURE, which is a schematic cross-sectional view of an organic light-emitting device according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the FIGURE, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

An organometallic compound represented by Formula 1 may be neutral, and may not include ion pairs of cations and anions:

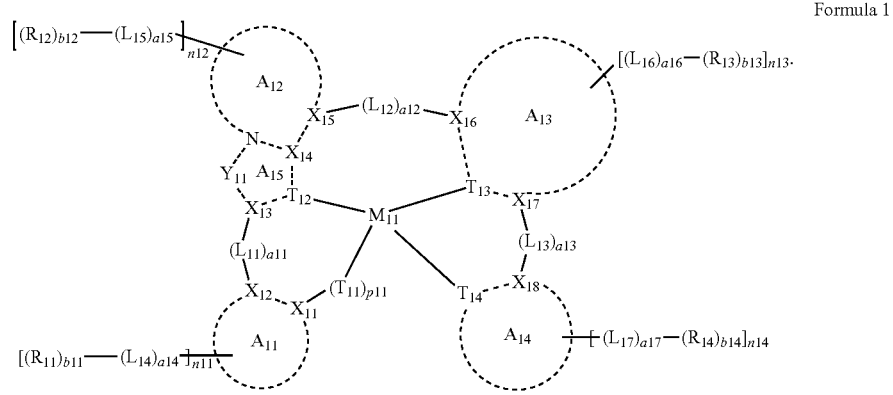

Formula 1

In Formula 1, $M_{11}$ may be selected from beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver, (Ag), rhenium (Re), platinum (Pt), and gold (Au).

In some embodiments, in Formula 1, $M_{11}$ may be platinum, but embodiments are not limited thereto.

In Formula 1, $T_{11}$ may be selected from O and S.

In Formula 1, p11 may be selected from 0 and 1; provided that when p11 is 0, *-$(T_{11})_{p1}$-*' may be a single bond.

In Formula 1, $T_{12}$ to $T_{14}$ may each independently be selected from nitrogen (N) and carbon (C).

In Formula 1, when p11 is 0, a bond between $X_{11}$ and $M_{11}$ may be a covalent bond or a coordinate bond; provided that when p11 is 1, a bond between $T_{11}$ and $M_{11}$ may be a covalent bond.

In Formula 1, i) when p11 is 0, two bonds selected from of a bond between $X_{11}$ and $M_{11}$, a bond between $T_{12}$ and $M_{11}$, a bond between $T_{13}$ and $M_{11}$, and a bond between $T_{14}$ and $M_{11}$ may each be a covalent bond, and the other two bonds may each be a coordinate bond; or ii) when p11 is 1, two bonds selected from a bond between $T_{11}$ and $M_{11}$, a bond between $T_{12}$ and $M_{11}$, a bond between $T_{13}$ and $M_{11}$, and a bond between $T_{14}$ and $M_{11}$ may each be a covalent bond, and the other two bonds may each be a coordinate bond.

In some embodiments, in Formula 1, p11 may be 1, and a bond between $T_{11}$ and $M_{11}$ may be a covalent bond, but embodiments are not limited thereto.

In some embodiments, in Formula 1, when p11 is 0, $X_{11}$ and $T_{12}$ may each be C, $T_{13}$ and $T_{14}$ may each be N, a bond between $X_{11}$ and $M_{11}$ and a bond between $T_{12}$ and $M_{11}$ may each be a covalent bond, and a bond between $T_{13}$ and $M_{11}$ and a bond between $T_{14}$ and $M_{11}$ may each be a coordinate bond;

when p11 is 0, $X_{11}$ and $T_{14}$ may each be C, $T_{12}$ and $T_{13}$ may each be N, a bond between $X_{11}$ and $M_{11}$ and a bond between $T_{14}$ and $M_{11}$ may each be a covalent bond, and a bond between $T_{12}$ and $M_{11}$ and a bond between $T_{13}$ and $M_{11}$ may each be a coordinate bond;

when p11 is 0, $X_{11}$ and $T_{13}$ may each be C, $T_{12}$ and $T_{14}$ may each be N, a bond between $X_{11}$ and $M_{11}$ and a bond between $T_{13}$ and $M_{11}$ may each be a covalent bond, and a bond between $T_{12}$ and $M_{11}$ and a bond between $T_{14}$ and $M_{11}$ may each be a coordinate bond;

when p11 is 0, $X_{11}$ and $T_{12}$ may each be N, $T_{13}$ and $T_{14}$ may each be C, a bond between $X_{11}$ and $M_{11}$ and a bond between $T_{12}$ and $M_{11}$ may each be a coordinate bond, and a bond between $T_{13}$ and $M_{11}$ and a bond between $T_{14}$ and $M_{11}$ may each be a covalent bond;

when p11 is 0, $X_{11}$ and $T_{14}$ may each be N, $T_{12}$ and $T_{13}$ may each be C, a bond between $X_{11}$ and $M_{11}$ and a bond between $T_{14}$ and $M_{11}$ may each be a coordinate bond, and a bond between $T_{12}$ and $M_{11}$ and a bond between $T_{13}$ and $M_{11}$ may each be a covalent bond;

when p11 is 0, $X_{11}$ and $T_{13}$ may each be N, $T_{12}$ and $T_{14}$ may each be C, a bond between $X_{11}$ and $M_{11}$ and a bond between $T_{13}$ and $M_{11}$ may each be a coordinate bond, and a bond between $T_{12}$ and $M_{11}$ and a bond between $T_{14}$ and $M_{11}$ may each be a covalent bond;

when p11 is 1, $T_{12}$ may be C, $T_{13}$ and $T_{14}$ may each be N, a bond between $T_{11}$ and $M_{11}$ and a bond between $T_{12}$ and $M_{11}$ may each be a covalent bond, and a bond between $T_{13}$ and $M_{11}$ and a bond between $T_{14}$ and $M_{11}$ may each be a coordinate bond;

when p11 is 1, $T_{14}$ may be C, $T_{12}$ and $T_{13}$ may each be N, a bond between $T_{11}$ and $M_{11}$ and a bond between $T_{14}$ and $M_{11}$ may each be a covalent bond, and a bond between $T_{12}$ and $M_{11}$ and a bond between $T_{13}$ and $M_{11}$ may each be a coordinate bond; or when p11 is 1, $T_{13}$ may be C, $T_{12}$ and $T_{14}$ may each be N, a bond between $T_{11}$ and $M_{11}$ and a bond between $T_{13}$ and $M_{11}$ may each be a covalent bond, and a bond between $T_{12}$ and $M_{11}$ and a bond between $T_{14}$ and $M_{11}$ may each be a coordinate bond, but embodiments are not limited thereto.

In some embodiments, in Formula 1, when p11 is 1, $T_{12}$ may be C, $T_{13}$ and $T_{14}$ may each be N, a bond between $T_{11}$ and $M_{11}$ and a bond between $T_{12}$ and $M_{11}$ may each be a covalent bond, and a bond between $T_{13}$ and $M_{11}$ and a bond between $T_{14}$ and $M_{11}$ may each be a coordinate bond;

when p11 is 1, $T_{14}$ may be C, $T_{12}$ and $T_{13}$ may each be N, a bond between $T_{11}$ and $M_{11}$ and a bond between $T_{14}$ and $M_{11}$ may each be a covalent bond, and a bond between $T_{12}$ and $M_{11}$ and a bond between $T_{13}$ and $M_{11}$ may each be a coordinate bond; or when p11 is 1, $T_{13}$ may be C, $T_{12}$ and $T_{14}$ may each be N, a bond between $T_{11}$ and $M_{11}$ and a bond between $T_{13}$ and $M_{11}$ may each be a covalent bond, and a bond between $T_{12}$ and $M_{11}$ and a bond between $T_{14}$ and $M_{11}$ may each be a coordinate bond, but embodiments are not limited thereto.

In Formula 1, $X_{11}$ to $X_{18}$ may each independently be selected from N and C.

In some embodiments, in Formula 1, $X_{12}$ to $X_{18}$ may each be C, but embodiments are not limited thereto.

In Formula 1, a bond between $X_{11}$ and $X_{12}$, a bond between $X_{13}$ and $T_{12}$, a bond between $X_{13}$ and $Y_{11}$, a bond between $T_{12}$ and $X_{14}$, a bond between $X_{14}$ and N, a bond between $X_{14}$ and $X_{15}$, a bond between $Y_{11}$ and N, a bond between $X_{16}$ and $T_{13}$, a bond between $T_{13}$ and $X_{17}$, and a bond between $X_{18}$ and $T_{14}$ may each independently be a single bond or a double bond.

In Formula 1, $A_{11}$, $A_{13}$, and $A_{14}$ may each independently be selected from a $C_5$-$C_{30}$ carbocyclic group and a $C_1$-$C_{30}$ heterocyclic group, and $A_{12}$ and $A_{15}$ may each independently be selected from a $C_1$-$C_{30}$ heterocyclic group.

In Formula 1, $A_{15}$ may be a 5-membered ring formed of N, $Y_{11}$, $X_{13}$, $T_{12}$, and $X_{14}$.

In some embodiments, in Formula 1, $A_{11}$, $A_{13}$, and $A_{14}$ may each independently be selected from a benzene group, a naphthalene group, an anthracene group, a phenanthrene group, a triphenylene group, a pyrene group, a chrysene group, a cyclopentadiene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an indenopyridine group, an indolopyridine group, a benzofuropyridine group, a benzothienopyridine group, a benzosilolopyridine group, an indenopyrimidine group, an indolopyrimidine group, a benzofuropyrimidine group, a benzothienopyrimidine group, a benzosilolopyrimidine group, a dihydropyridine group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, and a 5,6,7,8-tetrahydroquinoline group, and $A_{12}$ and $A_{15}$ may each independently be selected from an indole group, a carbazole group, an indenopyridine group, an indolopyridine group, a benzofuropyridine group, a benzothienopyridine group, a benzosilolopyridine group, a dihydropyridine group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8- tetrahydroisoquinoline group, and a 5,6,7,8-tetrahydroquinoline group, but embodiments are not limited thereto.

In some embodiments, in Formula 1, $A_{11}$, $A_{13}$, and $A_{14}$ ma each independently be selected from a benzene group, a naphthalene group, a cyclopentadiene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an indenopyridine group, an indolopyridine group, a benzofuropyridine group, a benzothienopyridine group, a benzosilolopyridine group, an indenopyrimidine group, an indolopyrimidine group, a benzofuropyrimidine group, a benzothienopyrimidine group, a benzosilolopyrimidine group, a dihydropyridine group, a pyridine group, a pyrimidine group, a pyrazine group, a pyridazine group, a triazine group, a quinoline group, an isoquinoline group, a quinoxaline group, a quinazoline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, and a 5,6,7,8-tetrahydroquinoline group, and $A_{12}$ and $A_{15}$ may each independently be selected from an indole group, a carbazole group, an indenopyridine group, an indolopyridine group, a benzofuropyridine group, a benzothienopyridine group, a benzosilolopyridine group, a dihydropyridine group, a pyridine group, a pyrimidine group, a pyrazine group, a pyridazine group, a triazine group, a quinoline group, an isoquinoline group, a quinoxaline group, a quinazoline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, and a 5,6,7,8-tetrahydroquinoline group, but embodiments are not limited thereto.

In some embodiments, in Formula 1, $A_{11}$, $A_{13}$, and $A_{14}$ may each independently be selected from a benzene group, a naphthalene group, a 1,2,3,4-tetrahydronaphthalene group, a fluorene group, a dibenzofuran group, a dibenzothiophene group, a benzofuropyridine group, a benzothienopyridine group, a benzofuropyrimidine group, a benzothienopyrimidine group, a dihydropyridine group, a pyridine group, a pyrimidine group, a quinoline group, an isoquinoline group, a quinoxaline group, a quinazoline group, a pyrrole group, a pyrazole group, an imidazole group, a triazole group, a benzimidazole group, a 5,6,7,8-tetrahydroisoquinoline group, and a 5,6,7,8-tetrahydroquinoline group, and $A_{12}$ and $A_{15}$ may each independently be selected from a dihydropyridine group, a pyridine group, a pyrimidine group, a quinoline group, an isoquinoline group, a quinoxaline group, a quinazoline group, a pyrrole group, a pyrazole group, an imidazole group, a triazole group, a 5,6,7,8-tetrahydroisoquinoline group, and a 5,6,7,8-tetrahydroquinoline group, but embodiments are not limited thereto.

In some embodiments, in Formula 1, $A_{11}$, $A_{13}$, and $A_{14}$ may each independently be selected from a benzene group, a naphthalene group, a 1,2,3,4-tetrahydronaphthalene group, a dibenzofuran group, a dibenzothiophene group, a benzofuropyridine group, a benzothienopyridine group, a benzofuropyrimidine group, a benzothienopyrimidine group, a dihydropyridine group, a pyridine group, a quinoline group, an isoquinoline group, a pyrrole group, an imidazole group, a benzimidazole group, a 5,6,7,8-tetrahydroisoquinoline group, and a 5,6,7,8-tetrahydroquinoline group, and $A_{12}$ and $A_{15}$ may each independently be selected from a dihydropyridine group, a pyridine group, a quinoline group, an isoquinoline group, a pyrrole group, an imidazole group, a 5,6,7,8-tetrahydroisoquinoline group, and a 5,6,7,8-tetrahydroquinoline group, but embodiments are not limited thereto.

In an embodiment, in Formula 1, a cyclometalated ring formed of $A_{15}$, $A_{12}$, $A_{13}$, and $M_{11}$ may be a 6-membered ring, a 7-membered ring, or an 8-membered ring.

In an embodiment, in Formula 1, a cyclometalated ring formed of $A_{15}$, $A_{12}$, $A_{13}$, and $M_{11}$ may be a 6-membered ring.

In Formula 1, $L_{11}$ to $L_{13}$ may each independently be selected from *—O—*', *—S—*', *—[C($R_{15}$)($R_{16}$)]$_{k11}$—*', *—C($R_{15}$)=*', *=C($R_{15}$)—*', *—C($R_{15}$)=C($R_{16}$)—*', *—C(=O)—*', *—C(=S)—*', *—C≡C—*', *—N($R_{15}$)—*', *—P($R_{15}$)—*', *—[Si($R_{15}$)($R_{16}$)]$_{k11}$—*', and *—P($R_{15}$)($R_{16}$)—*', * and *' may each independently indicate a binding site to an adjacent atom, $R_{15}$ and $R_{16}$ may optionally be bound via a first linking group to form a substituted or unsubstituted $C_5$-$C_{30}$ carbocyclic group or a substituted or unsubstituted $C_1$-$C_{30}$ heterocyclic group, and k11 may be selected from 1 and 2. $R_{15}$ and $R_{16}$ may be the same as those described herein.

In some embodiments, in Formula 1, $L_{11}$ to $L_{13}$ may each independently be selected from *—O—*', *—S—*', *—[C($R_{15}$)($R_{16}$)$_{k11}$—*', *—N($R_{15}$)—*', *—[Si($R_{15}$)($R_{16}$)]$_{k11}$—*', and *—P($R_{15}$)($R_{16}$)—*', and

* and *' may each independently indicate a binding site to an adjacent atom, but embodiments are not limited thereto.

In some embodiments, in Formula 1, $L_{11}$ to $L_{13}$ may each independently be selected from *—C($R_{15}$)($R_{16}$)—*', *—Si($R_{15}$)($R_{16}$)—*', and *—P($R_{15}$)($R_{16}$)—*', $R_{15}$ and $R_{16}$ may optionally be bound via the first linking group, the first linking group may be selected from a single bond, *—O—*', *—S—*', *—[C($R_{19}$)($R_{20}$)]$_{k12}$—*', *—C($R_{19}$)=*', *=C($R_{19}$)—*', *—C($R_{19}$)=C($R_{20}$)—*', *—C(=O)—*', *—C(=S)—*', *—C≡C—*', *—N($R_{19}$)—*', *—P($R_{19}$)—*', *—[Si($R_{19}$)($R_{20}$)]$_{k12}$—*', and *—P($R_{19}$)($R_{20}$)—*', $R_{19}$ and $R_{20}$ may each independently be substantially the same as $R_{15}$, k12 may be substantially the same as k11, and

* and *' may each independently indicate a binding site to an adjacent atom, but embodiments are not limited thereto.

In Formula 1, a11 to a13 may each independently be selected from 0, 1, 2, and 3; when a11 is 0, *-($L_{11}$)$_{a11}$-*' may be a single bond; when a12 is 0, *-($L_{12}$)$_{a12}$-*' may be a single bond; when a13 is 0, *-($L_{13}$)$_{a13}$-*' may be a single bond.

In some embodiments, in Formula 1, a11 to a13 may each independently be selected from 0 and 1, but embodiments are not limited thereto.

In some embodiments, in Formula 1, a sum of a11 to a13 may be 1, but embodiments are not limited thereto.

In some embodiments, in Formula 1, a11 to a13 may each be 0, but embodiments are not limited thereto.

In Formula 1, $Y_{11}$ may be selected from N($R_{17}$), N, C($R_{17}$)($R_{18}$), C($R_{17}$), Si($R_{17}$)($R_{18}$), Si($R_{17}$), and C(=O), $R_{17}$ and $R_{18}$ may optionally be bound via a second linking group to form a substituted or unsubstituted $C_5$-$C_{30}$ carbocyclic group or a substituted or unsubstituted $C_1$-$C_{30}$ heterocyclic group, and $R_{17}$ and $R_{18}$ may be the same as those described herein.

In some embodiments, in Formula 1, $Y_{11}$ may be selected from N and $C(R_{17})$, but embodiments are not limited thereto.

In some embodiments, in Formula 1, $Y_{11}$ may be $C(R_{17})$, but embodiments are not limited thereto.

In some embodiments, in Formula 1, the second linking group may be a single bond, *—O—*', *—S—*', *—[C($R_{19}$)($R_{20}$)]$_{k12}$—*', *—C($R_{19}$)=*', *=C($R_{19}$)—*', *—C($R_{19}$)=C($R_{20}$)—*', *—C(=O)—*', *—C(=S)—*', *—C≡C—*', *—N($R_{19}$)—*', *—P($R_{19}$)—*', *—[Si($R_{19}$)($R_{20}$)]$_{k12}$—*', and *—P($R_{19}$)($R_{20}$)—*', $R_{19}$ and $R_{20}$ may each independently be substantially the same as $R_{15}$, k12 may be substantially the same as k11, and

* and *' may each independently indicate a binding site to an adjacent atom, but embodiments are not limited thereto.

In Formula 1, $L_{14}$ to $L_{17}$ may each independently be selected from a substituted or unsubstituted $C_5$-$C_{30}$ carbocyclic group and a substituted or unsubstituted $C_1$-$C_{30}$ heterocyclic group.

In some embodiments, in Formula 1, $L_{14}$ to $L_{17}$ may each independently be selected from a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an indenopyridine group, an indolopyridine group, a benzofuropyridine group, a benzothienopyridine group, a benzosilolopyridine group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, and a benzothiadiazole group; and a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an indenopyridine group, an indolopyridine group, a benzofuropyridine group, a benzothienopyridine group, a benzosilolopyridine group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, and a benzothiadiazole group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a pyridinyl group, a pyrimidinyl group, a triazinyl group, a fluorenyl group, a dimethylfluorenyl group, a diphenylfluorenyl group, a carbazolyl group, a phenylcarbazolyl group, a dibenzofuranyl group, a dibenzothiophenyl group, a dibenzosilolyl group, a dimethyldibenzosilolyl group, a diphenyldibenzosilolyl group, —N($Q_{31}$)($Q_{32}$), —Si($Q_{33}$)($Q_{34}$)($Q_{35}$), —B($Q_{36}$)($Q_{37}$), and —P(=O)($Q_{38}$)($Q_{39}$), wherein $Q_{31}$ to $Q_{39}$ may each independently be selected from —CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, and —CD$_2$CDH$_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group, but embodiments are not limited thereto.

In some embodiments, in Formula 1, $L_{14}$ to $L_{17}$ may each independently be selected from a benzene group, a pyridine group, a pyrimidine group, and a triazine group; and a benzene group, a pyridine group, a pyrimidine group, and a triazine group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, $C_1$-$C_{20}$ alkyl group, a $C_1$-$C_{20}$ alkoxy group, a phenyl group, a pyridinyl group and a pyrimidinyl group, —N($Q_{31}$)($Q_{32}$), —Si($Q_{33}$)($Q_{34}$)($Q_{35}$), —B($Q_{36}$)($Q_{37}$), and —P(=O)($Q_{38}$)($Q_{39}$), wherein $Q_{31}$ to $Q_{39}$ may each independently be selected from —CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, and —CD$_2$CDH$_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group, but embodiments are not limited thereto.

In Formula 1, a14 to a17 may respectively indicate numbers of $L_{14}$ to $L_{17}$, which may each independently be selected from 0, 1, 2, 3, 4, and 5. In Formula 1, when a14 is 0, *-($L_{14}$)$_{a14}$-*' may be a single bond; and when a14 is 2 or greater, at least two groups $L_{14}$ may be identical to or different from each other. a15 to a17 may each be substantially the same as a14.

In some embodiments, in Formula 1, a14 to a17 may each independently be selected from 0 and 1, but embodiments are not limited thereto.

In Formula 1, $R_{11}$ to $R_{18}$ may each independently be selected from hydrogen, deuterium, —F, —Cl, —Br, —I, —SF$_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ hetero aryloxy group, a substituted or unsubstituted $C_1$-$C_{60}$ hetero arylthio group, a substituted or unsubstituted monovalent non-aromatic condensed polycyclic group, a substituted or unsubstituted monovalent non-aromatic condensed heteropolycyclic group, —N(Q$_1$)(Q$_2$), —Si(Q$_3$)(Q$_4$)(Q$_5$), —B(Q$_6$)(Q$_7$), and —P(=O)(Q$_8$)(Q$_9$), wherein $Q_1$ to $Q_9$ may each independently be selected from hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group; a $C_1$-$C_{60}$ alkyl group substituted with at least one of deuterium, a $C_1$-$C_{60}$ alkyl group, and a $C_6$-$C_{60}$ aryl group; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group; a $C_6$-$C_{60}$ aryl group substituted with at least one of deuterium, a $C_1$-$C_{60}$ alkyl group, and a $C_6$-$C_{60}$ aryl group; a $C_6$-$C_{60}$ aryloxy group; a $C_6$-$C_{60}$ arylthio group; a $C_1$-$C_{60}$ heteroaryl group; a monovalent non-aromatic condensed polycyclic group; and a monovalent non-aromatic condensed heteropolycyclic group.

In some embodiments, in Formula 1, $R_{11}$ to $R_{18}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —SF$_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclopentyl group substituted with deuterium, a cyclohexyl group, a cyclohexyl group substituted with deuterium, a cycloheptyl group, a cycloheptyl group substituted with deuterium, a cyclooctyl group, a cyclooctyl group substituted with deuterium, a bicyclo[2.2.1]heptanyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, a bicyclo[2.2.1]heptanyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, a bicyclo[2.2.1]heptanyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclopentyl group substituted with deuterium, a cyclohexyl group, a cyclohexyl group substituted with deuterium, a cycloheptyl group, a cycloheptyl group substituted with deuterium, a cyclooctyl group, a cyclooctyl group substituted with deuterium, a bicyclo[2.2.1]heptanyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, and —Si($Q_{33}$)($Q_{34}$)($Q_{35}$); and —N($Q_1$)($Q_2$), —Si($Q_3$)($Q_4$)($Q_5$), —B($Q_6$)($Q_7$), and —P(═O)($Q_8$)($Q_9$), wherein $Q_1$ to $Q_9$ and $Q_{33}$ to $Q_{35}$ may each independently be selected from —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group, but embodiments are not limited thereto.

In some embodiments, in Formula 1, $R_{11}$ to $R_{18}$ may each independently be selected from hydrogen, deuterium, —F, a cyano group, a nitro group, —$SF_5$, a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, a bicyclo[2.2.1]heptanyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a fluorenyl group, a carbazolyl group, a dibenzofuranyl group, a dibenzothiophenyl group, and a dibenzosilolyl group;

a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, a bicyclo[2.2.1]heptanyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a fluorenyl group, a carbazolyl group, a dibenzofuranyl group, a dibenzothiophenyl group, and a dibenzosilolyl group, each substituted with at least one selected from deuterium, —F, —$CD_3$, —$CD_2H$, —$CDH_2$, —$CF_3$, —$CF_2H$, —$CFH_2$, a cyano group, a nitro group, a $C_1$-$C_{10}$ alkyl group, a $C_1$-$C_{10}$ alkoxy group, a cyclopentyl group, a cyclopentyl group substituted with deuterium, a cyclohexyl group, a cyclohexyl group substituted with deuterium, a cycloheptyl group, a cycloheptyl group substituted with deuterium, a cyclooctyl group, a cyclooctyl group substituted with deuterium, a bicyclo[2.2.1]heptanyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a fluorenyl group, a carbazolyl group, a dibenzofuranyl group, a dibenzothiophenyl group, a dibenzosilolyl group, and —Si($Q_{33}$)($Q_{34}$)($Q_{35}$), and —N($Q_1$)($Q_2$), —Si($Q_3$)($Q_4$)($Q_5$), —B($Q_6$)($Q_7$), and —P(═O)($Q_8$)($Q_9$), wherein $Q_1$ to $Q_9$ and $Q_{33}$ to $Q_{35}$ may each independently be selected from —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group, but embodiments are not limited thereto.

In some embodiments, in Formula 1, $R_{11}$ to $R_{18}$ may each independently be selected from hydrogen, deuterium, —F, a cyano group, a nitro group, —$SF_5$, —$CH_3$, —$CD_3$, —$CD_2H$, —$CDH_2$, —$CF_3$, —$CF_2H$, —$CFH_2$, groups represented by Formulae 9-1 to 9-21, groups represented by Formulae 10-1 to 10-246, —N($Q_1$)($Q_2$), —Si($Q_3$)($Q_4$)($Q_5$), —B($Q_6$)($Q_7$), and —P(═O)($Q_8$)($Q_9$), but embodiments are not limited thereto:

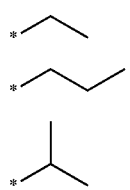

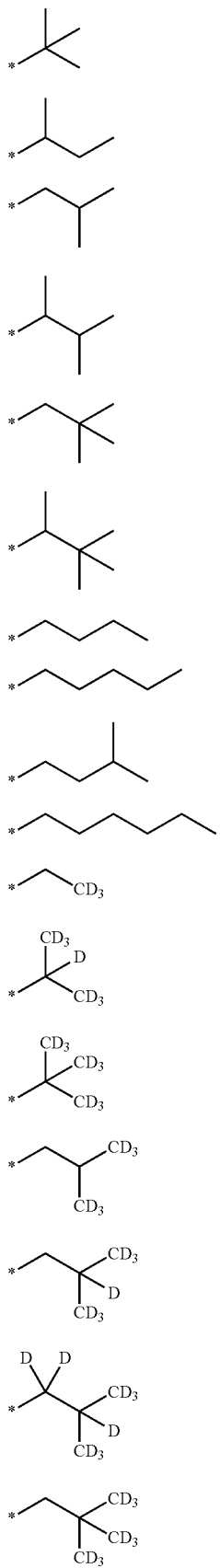
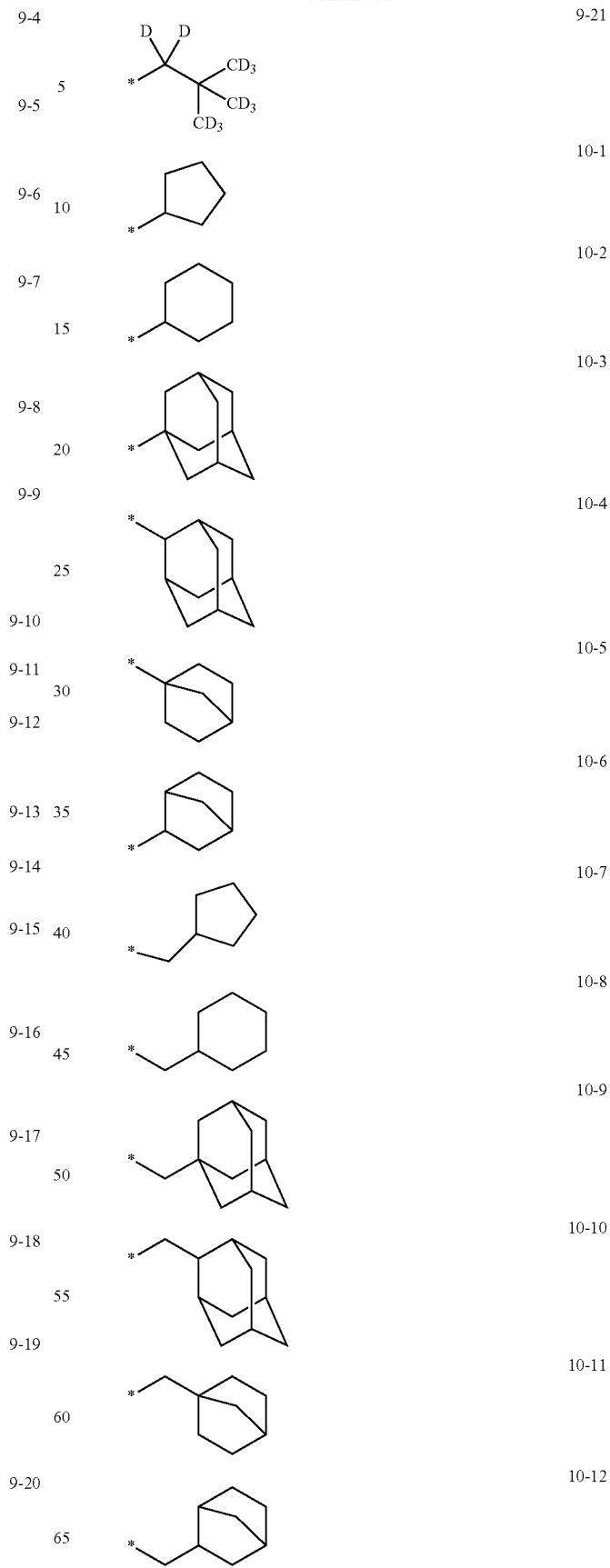

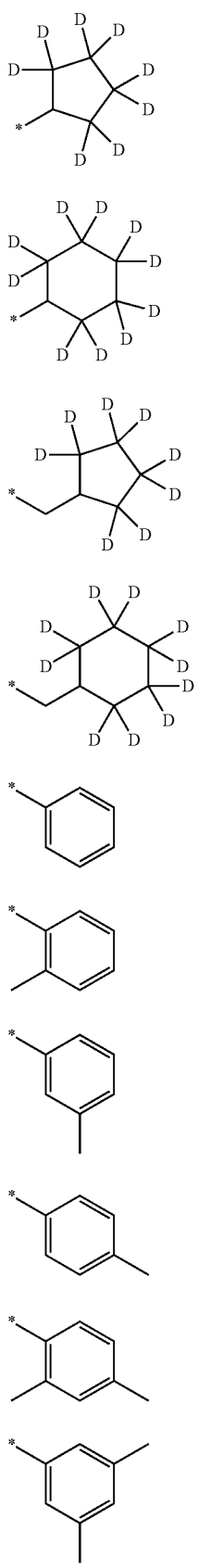
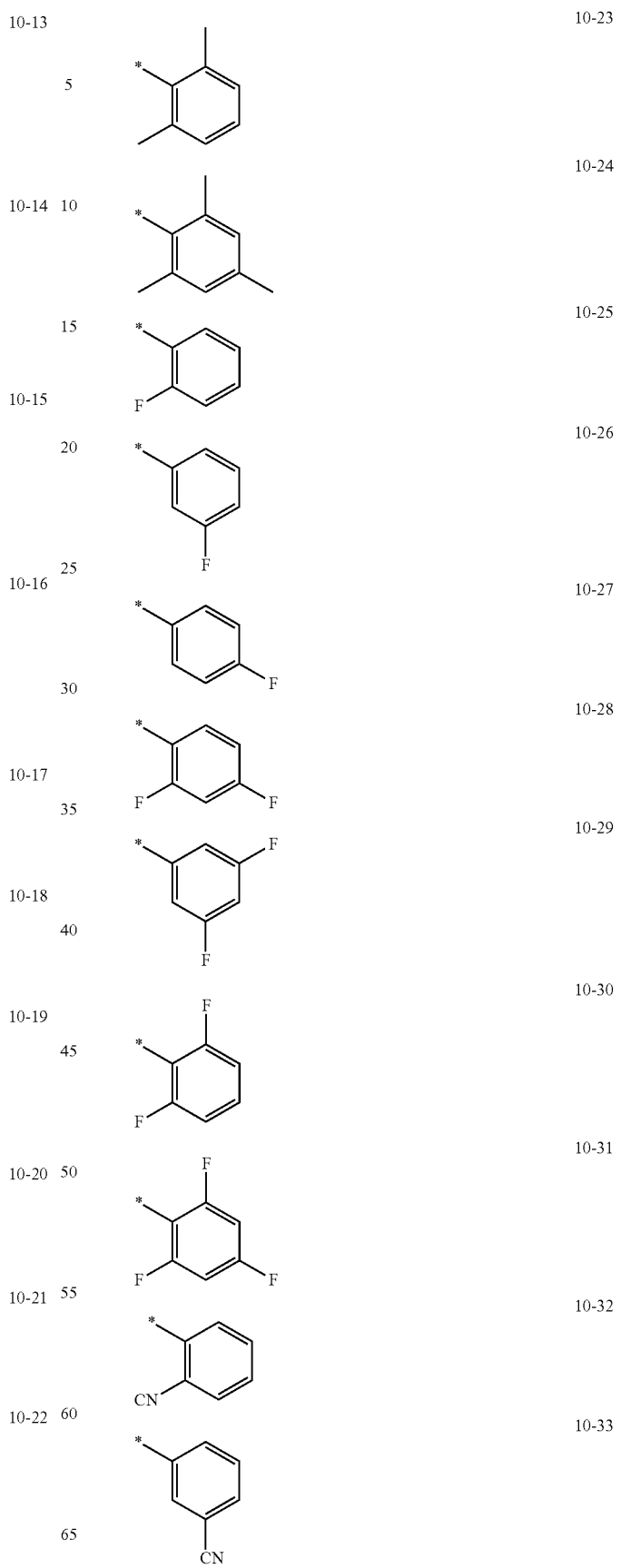

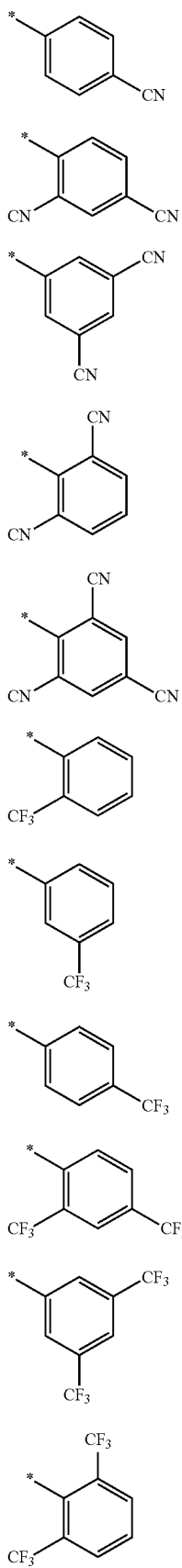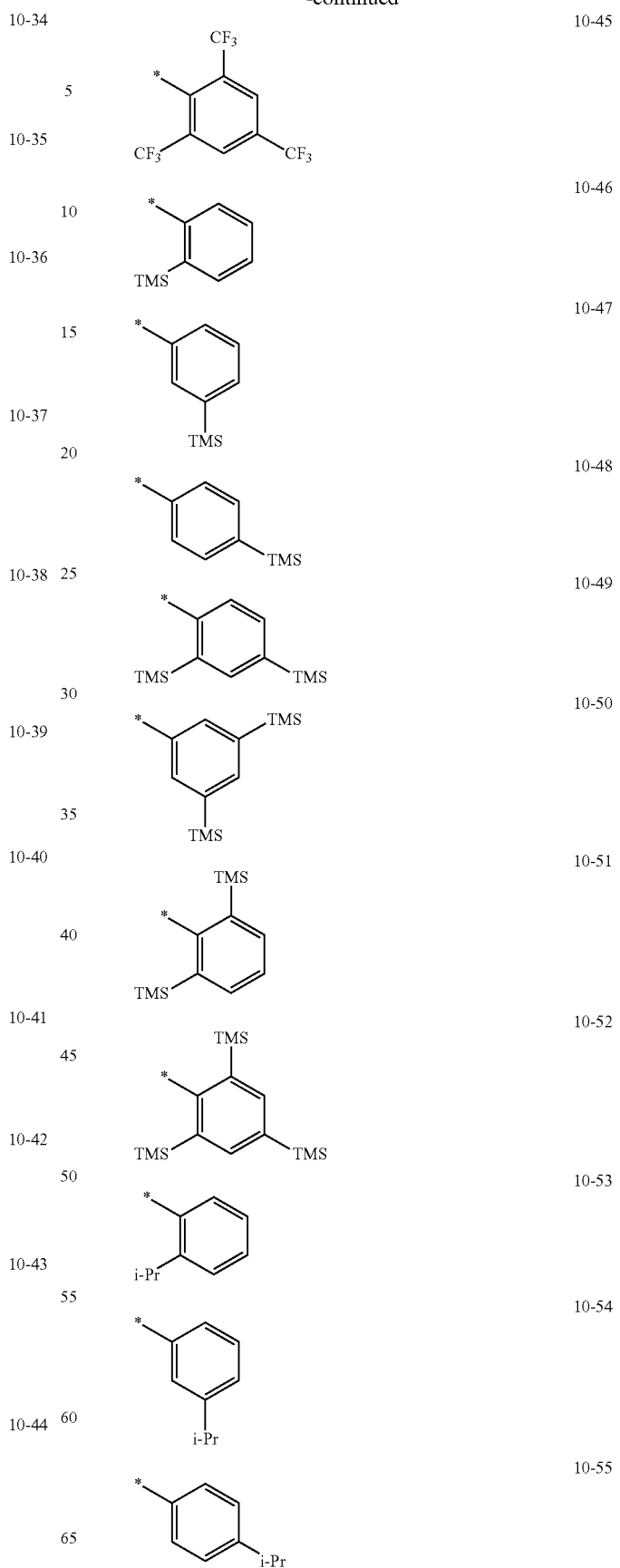

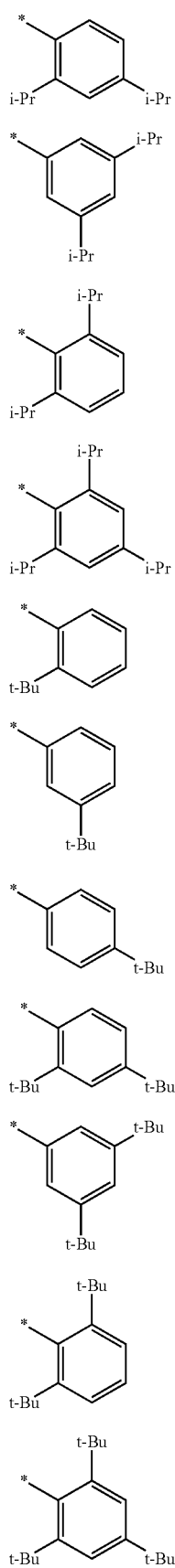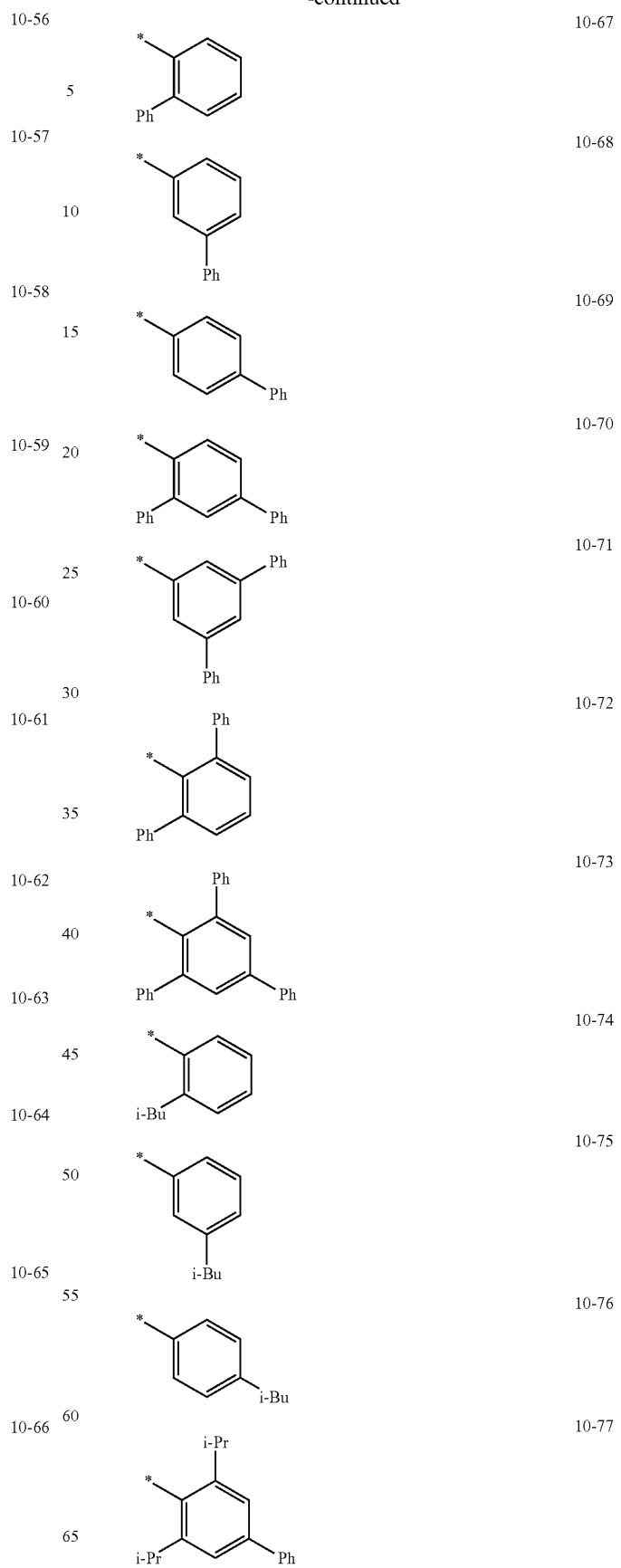

-continued
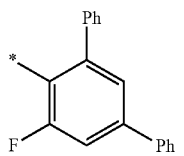
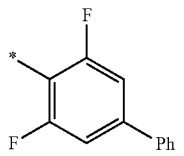
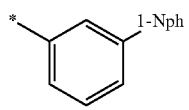
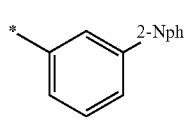
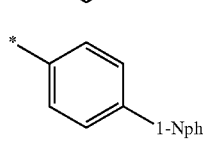
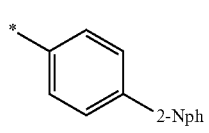
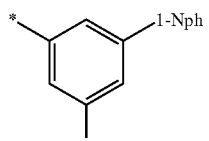
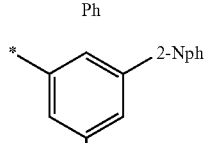
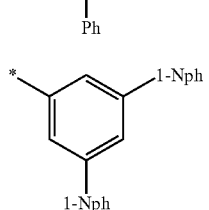
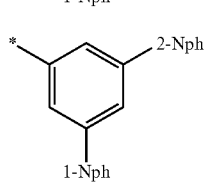
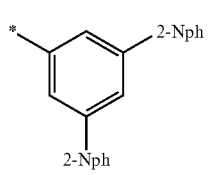
-continued
10-78
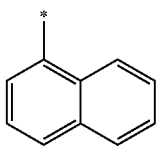
10-79
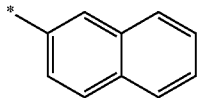
10-80
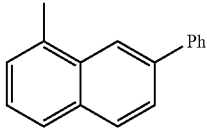
10-81
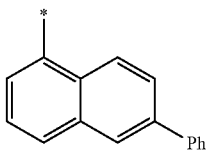
10-82
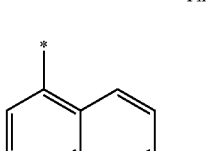
10-83
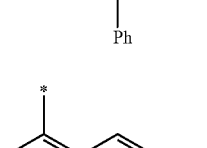
10-84
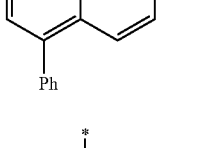
10-85
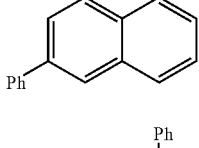
10-86
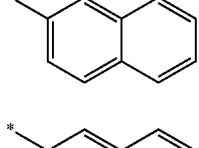
10-87
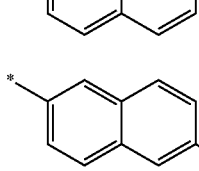
10-88
10-89
10-90
10-91
10-92
10-93
10-94
10-95
10-96
10-97
10-98

-continued
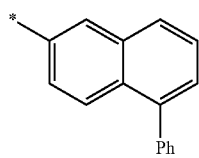
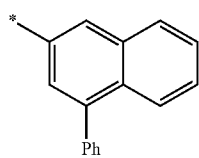
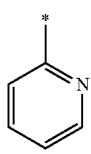
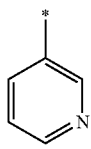
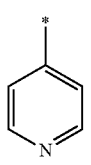
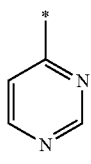
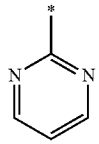
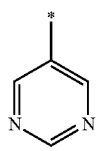
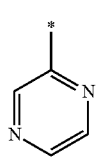
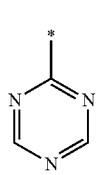
-continued
10-99 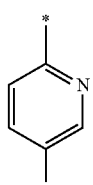
10-100
10-101 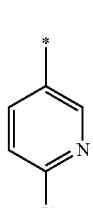
10-102 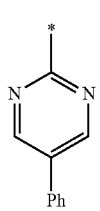
10-103 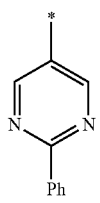
10-104
10-105 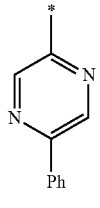
10-106 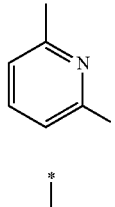
10-107 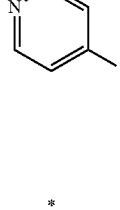
10-108 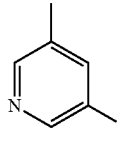
10-109
10-110
10-111
10-112
10-113
10-114
10-115
10-116

10-117 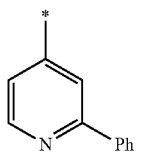
10-118 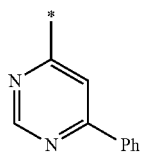
10-119 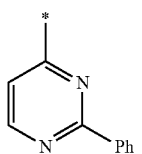
10-120 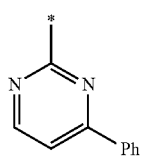
10-121 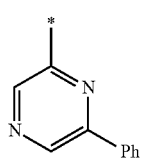
10-122 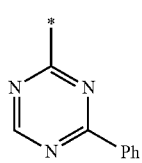
10-123 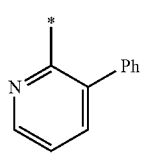
10-124 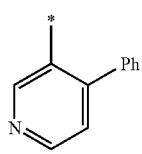
10-125 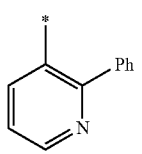
10-126 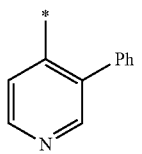
10-127 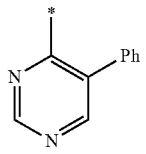
10-128 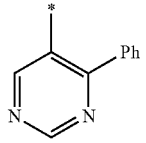
10-129 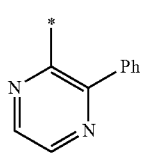
10-130 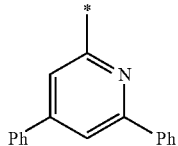
10-131 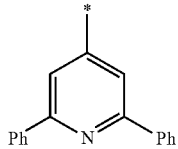
10-132 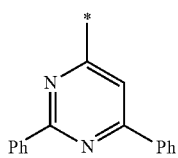
10-133 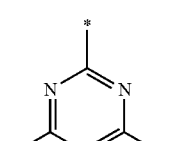
10-134 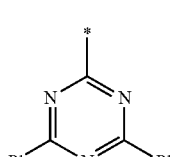
10-135 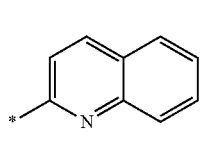
10-136 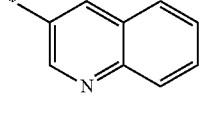

-continued
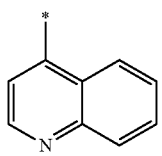
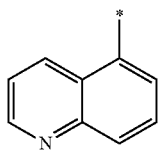
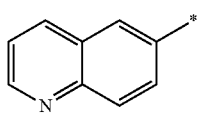
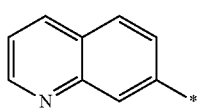
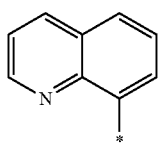
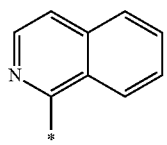
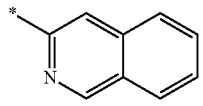
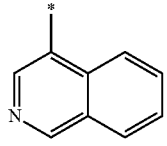
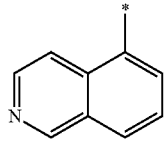
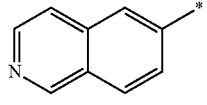
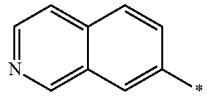
-continued
10-137
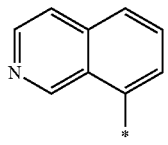
10-138
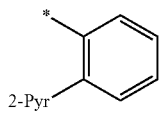
10-139
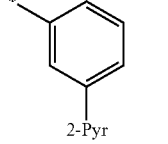
10-140
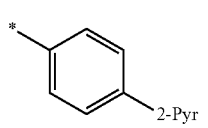
10-141
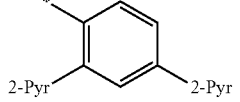
10-142
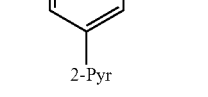
10-143
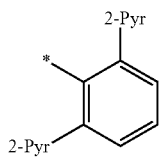
10-144
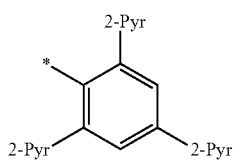
10-145
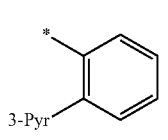
10-146
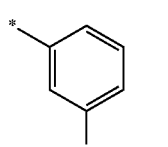
10-147
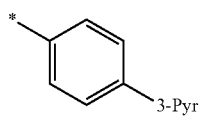
10-148
10-149
10-150
10-151
10-152
10-153
10-154
10-155
10-156
10-157
10-158

-continued
10-159 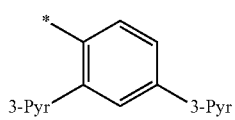
10-160 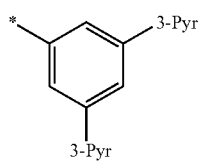
10-161 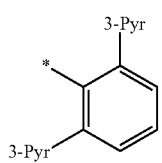
10-162 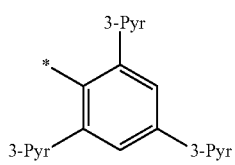
10-163 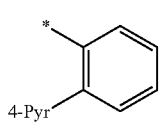
10-164 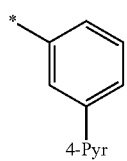
10-165 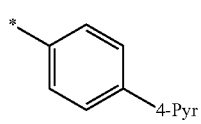
10-166 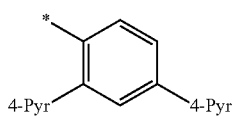
10-167 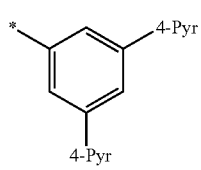
10-168 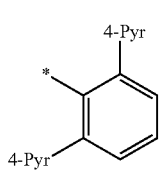
-continued
10-169 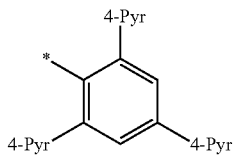
10-170 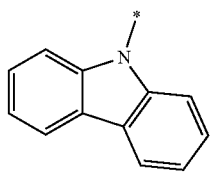
10-171 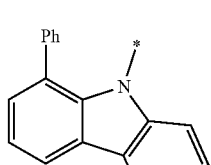
10-172 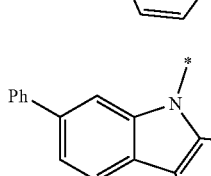
10-173 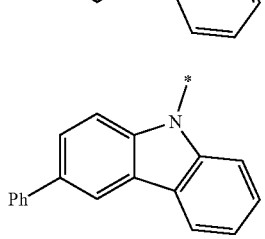
10-174 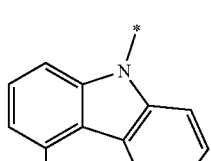
10-175 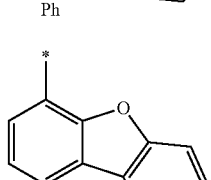
10-176 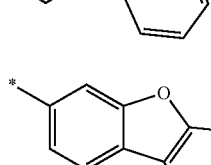
10-177 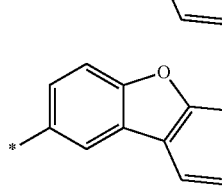

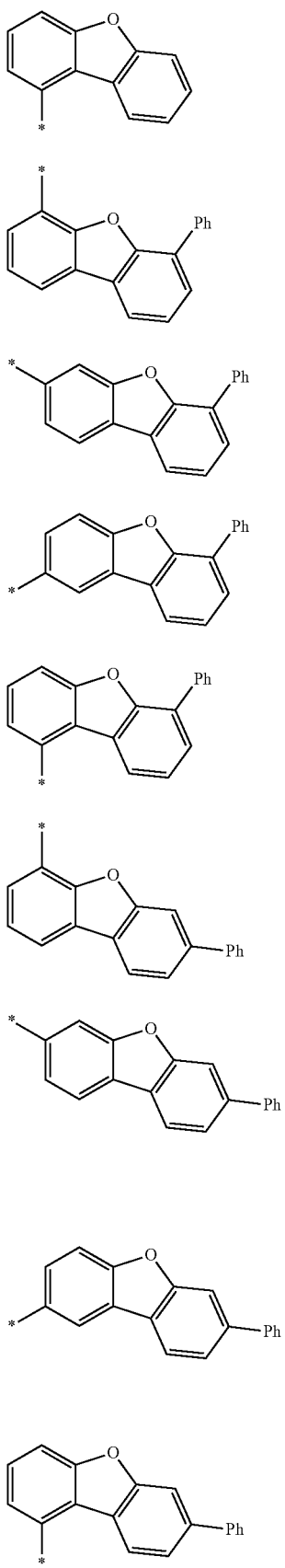
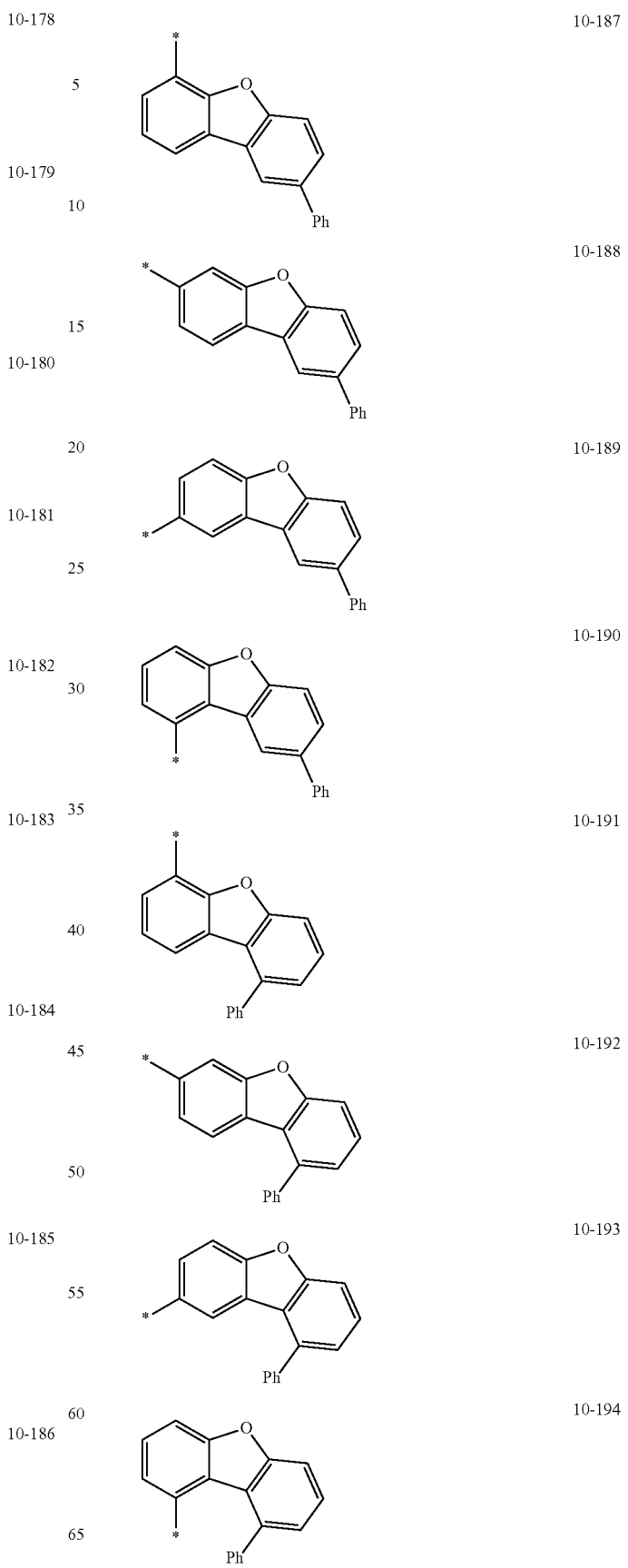

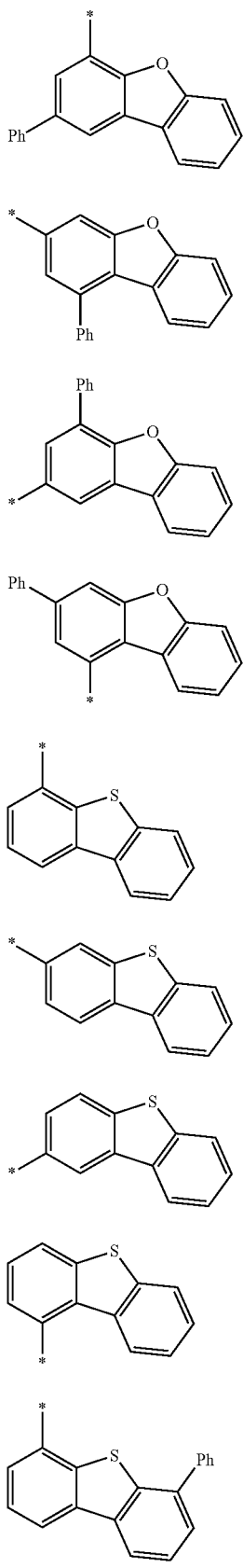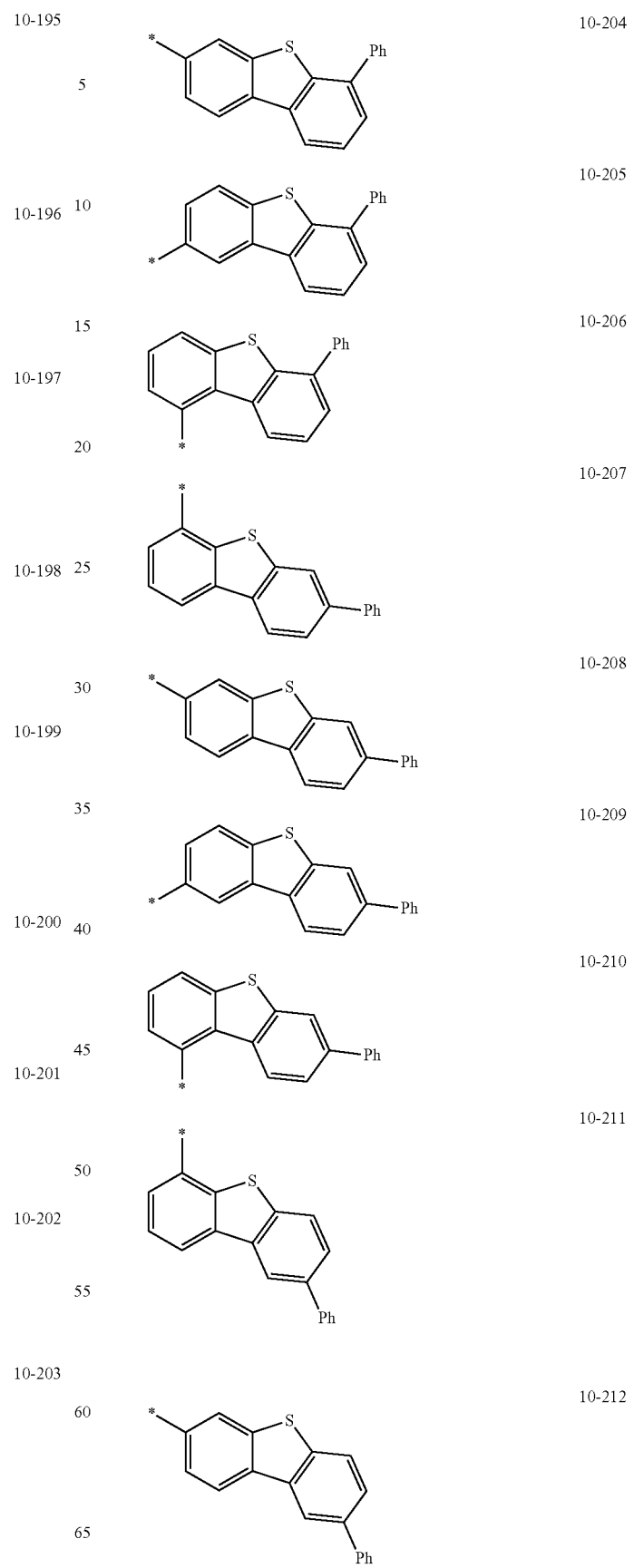

-continued
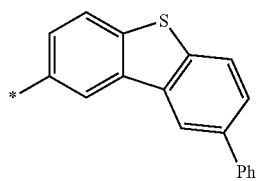
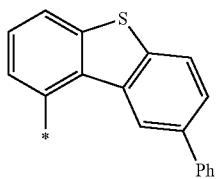
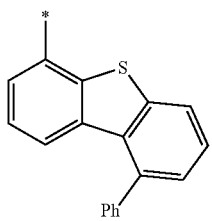
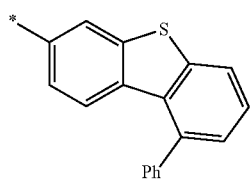
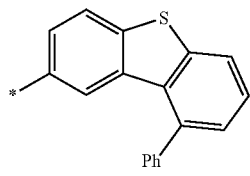
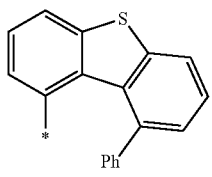
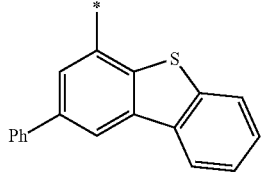
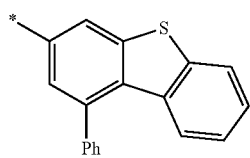
-continued
10-213
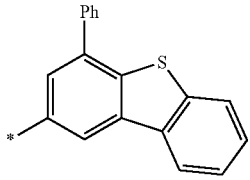 10-221
10-214
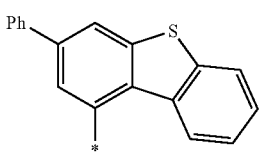 10-222
10-215
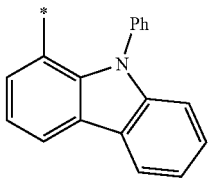 10-223
10-216
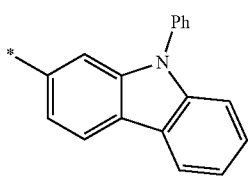 10-224
10-217
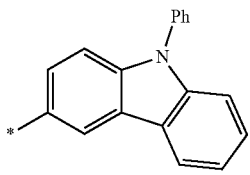 10-225
10-218
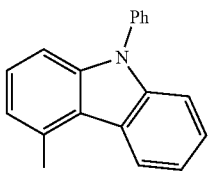 10-226
10-219
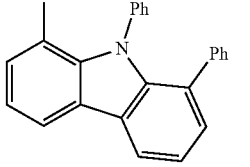 10-227
10-228
10-220
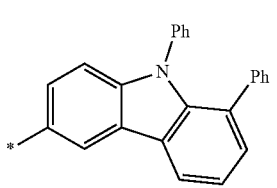 10-229

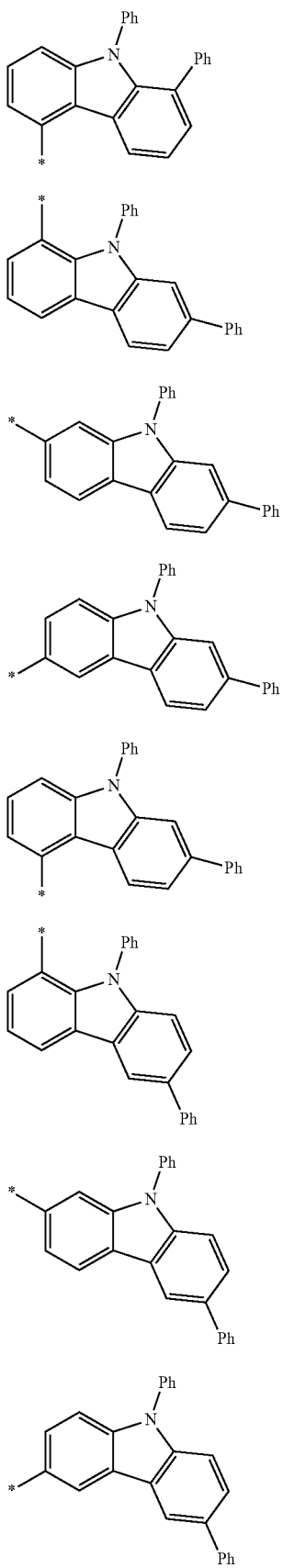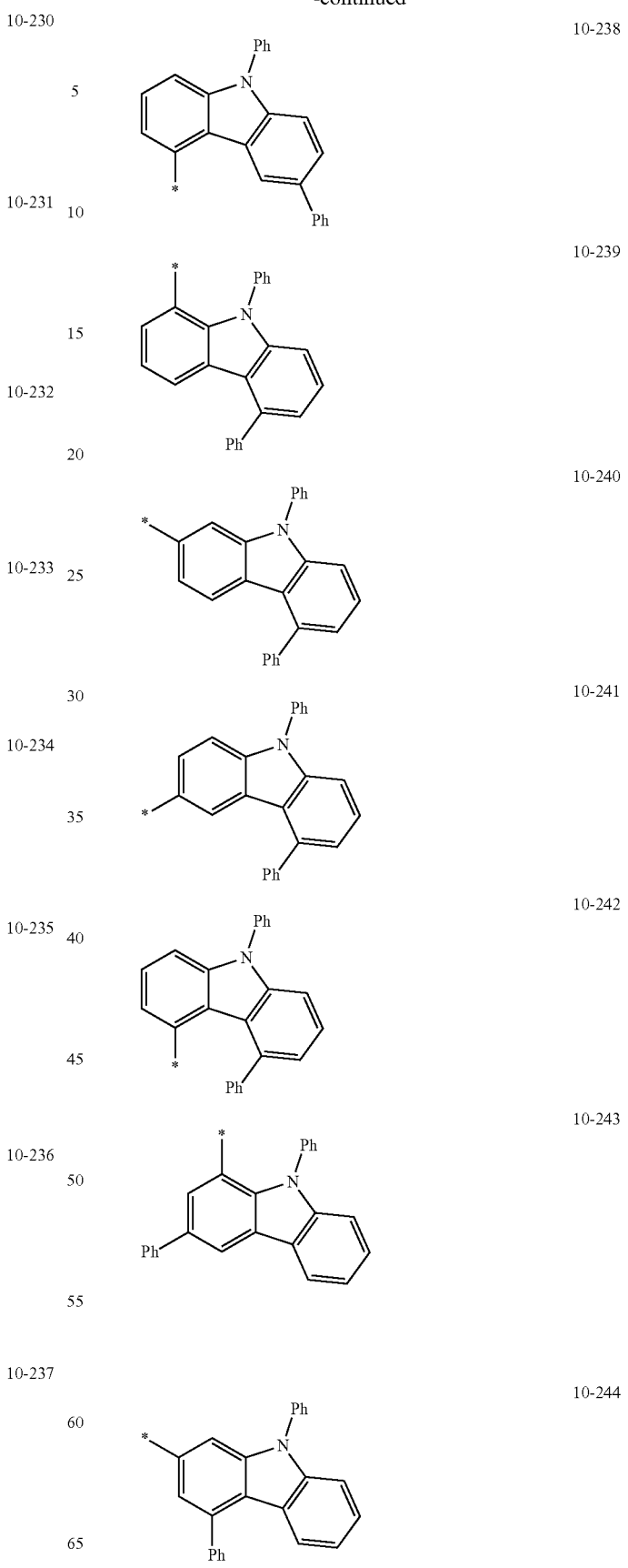

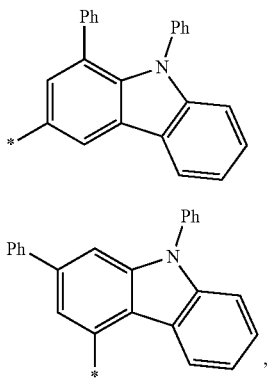

10-245

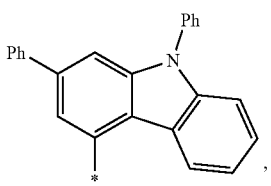

10-246 wherein, $Q_1$ to $Q_9$ may each independently be selected from
—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group, in Formulae 9-1 to 9-21 and 10-1 to 10-246,

* indicates a binding site to an adjacent atom, the term "i-Pr" represents an iso-propyl group, the term "i-Bu" represents an iso-butyl group, the term "t-Bu" represents a t-butyl group, the term "Ph" represents a phenyl group, the term "1-Nph" represents a 1-naphthyl group, the term "2-Nph" represents a 2-naphthyl group, the term "2-Pyr" represents a 2-pyridyl group, the term "3-Pyr" represents a 3-pyridyl group, the term "4-Pyr" represents a 4-pyridyl group, and the term "TMS" represents a trimethylsilyl group.

In Formula 1, b11 to b14 may respectively indicate numbers of $R_{11}$ to $R_{14}$, which may each independently be selected from 1, 2, 3, 4, and 5. When b11 is 2 or greater, at least two groups $R_{11}$ may be identical to or different from each other, and b12 to b14 may be substantially the same as b11.

In some embodiments, in Formula 1, b11 to b14 may each independently be selected from 1 and 2, but embodiments are not limited thereto.

In Formula 1, n11 to n14 may respectively indicate numbers of *-[($L_{14}$)$_{a14}$-($R_{11}$)$_{b11}$], *-[($L_{15}$)$_{a15}$-($R_{12}$)$_{b12}$], *-[($L_{16}$)$_{a16}$-($R_{13}$)$_{b13}$], and *-[($L_{17}$)$_{a17}$-($R_{14}$)$_{b14}$], which may each independently be selected from 0, 1, 2, 3, 4, and 5. When n11 is 2 or greater, at least two groups *-[($L_{14}$)$_{a14}$-($R_{11}$)$_{b11}$] may be identical to or different from each other.
When n12 is 2 or greater, at least two groups *-[($L_{15}$)$_{a15}$-($R_{12}$)$_{b12}$] may be identical to or different from each other.
When n13 is 2 or greater, at least two groups *-[($L_{16}$)$_{a16}$-($R_{13}$)$_{b13}$] may be identical to or different from each other.
When n14 is 2 or greater, at least two groups *-[($L_{17}$)$_{a17}$-($R_{14}$)$_{b14}$] may be identical to or different from each other.

In Formula 1, two adjacent groups $R_{11}$ of a plurality of groups $R_{11}$ may optionally be bound to form a substituted or unsubstituted $C_5$-$C_{30}$ carbocyclic group or a substituted or unsubstituted $C_1$-$C_{30}$ heterocyclic group, two adjacent groups $R_{12}$ of a plurality of groups $R_{12}$ may optionally be bound to form a substituted or unsubstituted $C_5$-$C_{30}$ carbocyclic group or a substituted or unsubstituted $C_1$-$C_{30}$ heterocyclic group, two adjacent groups $R_{13}$ of a plurality of groups $R_{13}$ may optionally be bound to form a substituted or unsubstituted $C_5$-$C_{30}$ carbocyclic group or a substituted or unsubstituted $C_1$-$C_{30}$ heterocyclic group, two adjacent groups $R_{14}$ of a plurality of groups $R_{14}$ may optionally be bound to form a substituted or unsubstituted $C_5$-$C_{30}$ carbocyclic group or a substituted or unsubstituted $C_1$-$C_{30}$ heterocyclic group, and at least two of $R_{11}$ to $R_{14}$, wherein the at least two of $R_{11}$ to $R_{14}$ are adjacent to each other, may optionally be bound to form a substituted or unsubstituted $C_5$-$C_{30}$ carbocyclic group or a substituted or unsubstituted $C_1$-$C_{30}$ heterocyclic group.

In some embodiments, in Formula 1, a substituted or unsubstituted $C_5$-$C_{30}$ carbocyclic group or a substituted or unsubstituted $C_1$-$C_{30}$ heterocyclic group formed by an optional bond between the two adjacent groups $R_{11}$ of a plurality of groups $R_{11}$, the two adjacent groups $R_{12}$ of a plurality of groups $R_{12}$, the two adjacent groups $R_{13}$ of a plurality of groups $R_{13}$, the two adjacent groups $R_{14}$ of a plurality of groups $R_{14}$, and the at least two of $R_{11}$ to $R_{14}$ may be selected from:

a pentadiene group, a cyclohexane group, a cycloheptane group, an adamantane group, a bicycle-heptane group, a bicyclo-octane group, a benzene group, a pyridine group, a pyrimidine group, a pyrazine group, a pyridazine group, a naphthalene group, an anthracene group, a tetracene group, a phenanthrene group, a dihydronaphthalene group, a phenalene group, a benzothiophene group, a benzofuran group, an indene group, an indole group, a benzosilole group, a thienopyridine group, a furopyridine group, a cyclopentapyridine group, a pyrrolopyridine group, and a silolopyridine group;

a pentadiene group, a cyclohexane group, a cycloheptane group, an adamantane group, a bicycle-heptane group, a bicyclo-octane group, a benzene group, a pyridine group, a pyrimidine group, a pyrazine group, a pyridazine group, a naphthalene group, an anthracene group, a tetracene group, a phenanthrene group, a dihydronaphthalene group, a phenalene group, a benzothiophene group, a benzofuran group, an indene group, an indole group, a benzosilole group, a thienopyridine group, a furopyridine group, a cyclopentapyridine group, a pyrrolopyridine group, and a silolopyridine group, each substituted with at least one $R_{1a}$, but embodiments are not limited thereto.

$R_{1a}$ may be substantially the same as $R_1$ described herein.

As used herein, * and *' each indicate a binding site to an adjacent atom.

In an embodiment, in Formula 1, a moiety represented by

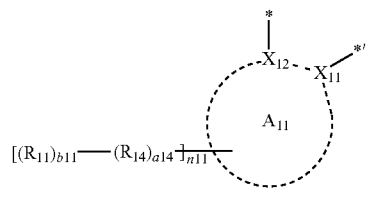

may be selected from groups represented by Formulae 2-1 to 2-16:
2-1
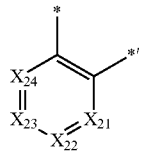
2-2
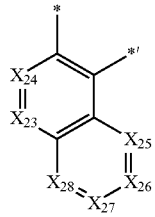
2-3
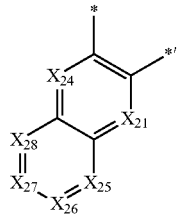
2-4
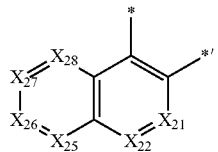
2-5
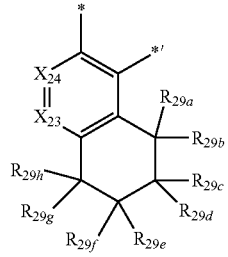
2-6
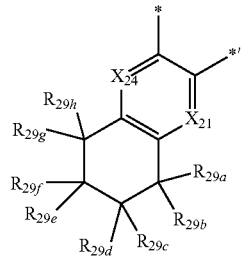
2-7
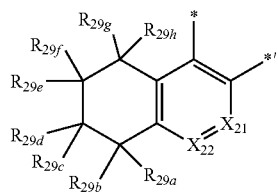
-continued
2-8
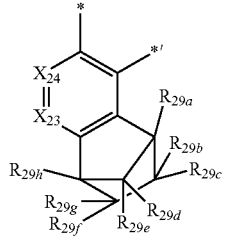
2-9
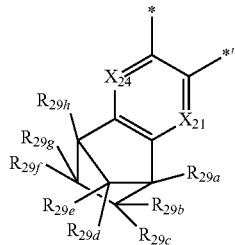
2-10
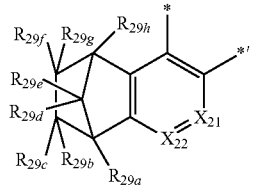
2-11
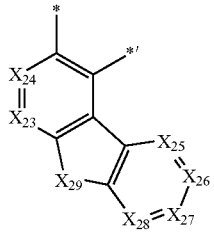
2-12
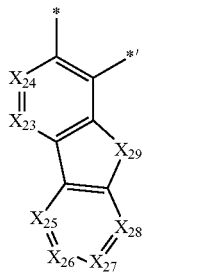
2-13
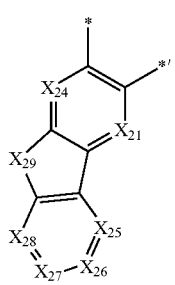

-continued 2-14

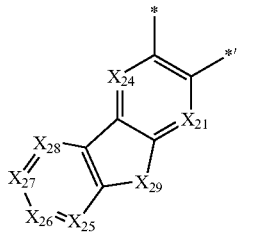

2-15

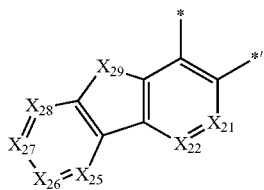

2-16

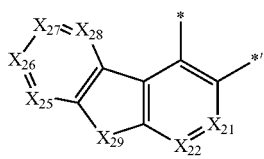

wherein, in Formulae 2-1 to 2-16, $X_{21}$ may be N or C-$[(L_{21})_{a21}$-$(R_{21})_{b21}]$, $X_{22}$ may be N or C-$[(L_{22})_{a22}$-$(R_{22})_{b22}]$, $X_{23}$ may be N or C-$[(L_{23})_{a23}$-$(R_{23})_{b23}]$, $X_{24}$ may be N or C-$[(L_{24})_{a24}$-$(R_{24})_{b24}]$, $X_{25}$ may be N or C-$[(L_{25})_{a25}$-$(R_{25})_{b25}]$, $X_{26}$ may be N or C-$[(L_{26})_{a26}$-$(R_{26})_{b26}]$, $X_{27}$ may be N or C-$[(L_{27})_{a27}$-$(R_{27})_{b27}]$, $X_{28}$ may be N or C-$[(L_{28})_{a28}$-$(R_{28})_{b28}]$, $X_{29}$ may be selected from C$(R_{29a})(R_{29a})(R_{29b})$, N-$[(L_{29})_{a29}$-$(R_{29a})_{b29a}]$, O, S, and Si$(R_{29a})(R_{29b})$, $L_{21}$ to $L_{29}$ may each independently be substantially the same as described herein with reference to $L_{14}$, a21 to a29 may each independently be substantially the same as described herein with reference to a14, $R_{21}$ to $R_{28}$ and $R_{29a}$ to $R_{2gh}$ may each independently be substantially the same as described herein with reference to $R_{11}$, b21 to b29 and b29a may each independently be substantially the same as described herein with reference to b11, and

* and *' may each indicate a binding site to an adjacent atom.

In some embodiments, in Formulae 2-1 to 2-16, $X_{21}$ may be C-$[(L_{21})_{a21}$-$(R_{21})_{b21}]$, $X_{22}$ may be C-$[(L_{22})_{a22}$-$(R_{22})_{b22}]$, $X_{23}$ may be C-$[(L_{23})_{a23}$-$(R_{23})_{b23}]$, $X_{24}$ may be C-$[(L_{24})_{a24}$-$(R_{24})_{b24}]$, $X_{25}$ may be C-$[(L_{25})_{a25}$-$(R_{25})_{b25}]$, $X_{26}$ may be C-$[(L_{26})_{a26}$-$(R_{26})_{b26}]$, $X_{27}$ may be C-$[(L_{27})_{a27}$-$(R_{27})_{b27}]$, and $X_{28}$ may be C-$[(L_{28})_{a28}$-$(R_{28})_{b28}]$, but embodiments are not limited thereto.

In one or more embodiments, in Formula 1, a moiety represented by

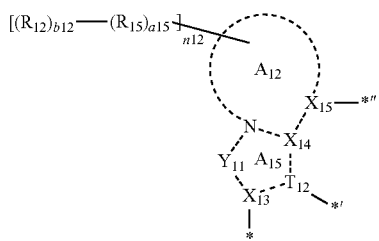

may be a group represented by Formula 3-1:

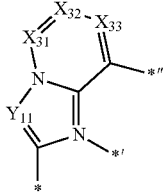

3-1 wherein, in Formula 3-1, $Y_{11}$ may be the same as described herein, $X_{31}$ may be N or C-$[(L_{31})_{a31}$-$(R_{31})_{31b}]$, $X_{32}$ may be N or C-$[(L_{32})_{a32}$-$(R_{32})_{b32}]$, $X_{33}$ may be N or C-$[(L_{33})_{a33}$-$(R_{33})_{b33}]$, $L_{31}$ to $L_{33}$ may each independently be substantially the same as described herein with reference to $L_{15}$, a31 to a33 may each independently be substantially the same as described herein with reference to a15, $R_{31}$ to $R_{33}$ may each independently be substantially the same as described herein with reference to $R_{12}$, b31 to b33 may each independently be substantially the same as described herein with reference to b12, and

*, *', and *" may each indicate a binding site to an adjacent atom.

In some embodiments, in Formula 3-1, $X_{31}$ may be C-$[(L_{31})_{a31}$-$(R_{31})_{b31}]$, $X_{32}$ may be C-$[(L_{32})_{a32}$-$(R_{32})_{b32}]$, and $X_{33}$ may be C-$[(L_{33})_{a33}$-$(R_{33})_{b33}]$, but embodiments are not limited thereto.

In an embodiment, in Formula 1, a moiety represented by

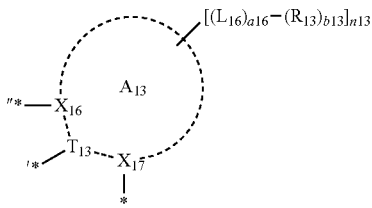

may be selected from groups represented by Formulae 4-1 to 4-22:

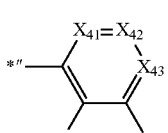

4-1

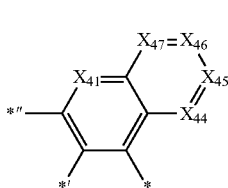

4-2

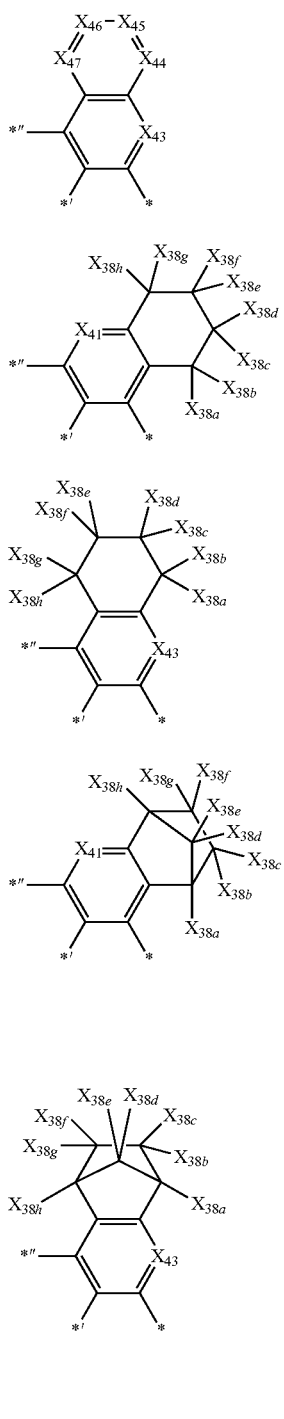
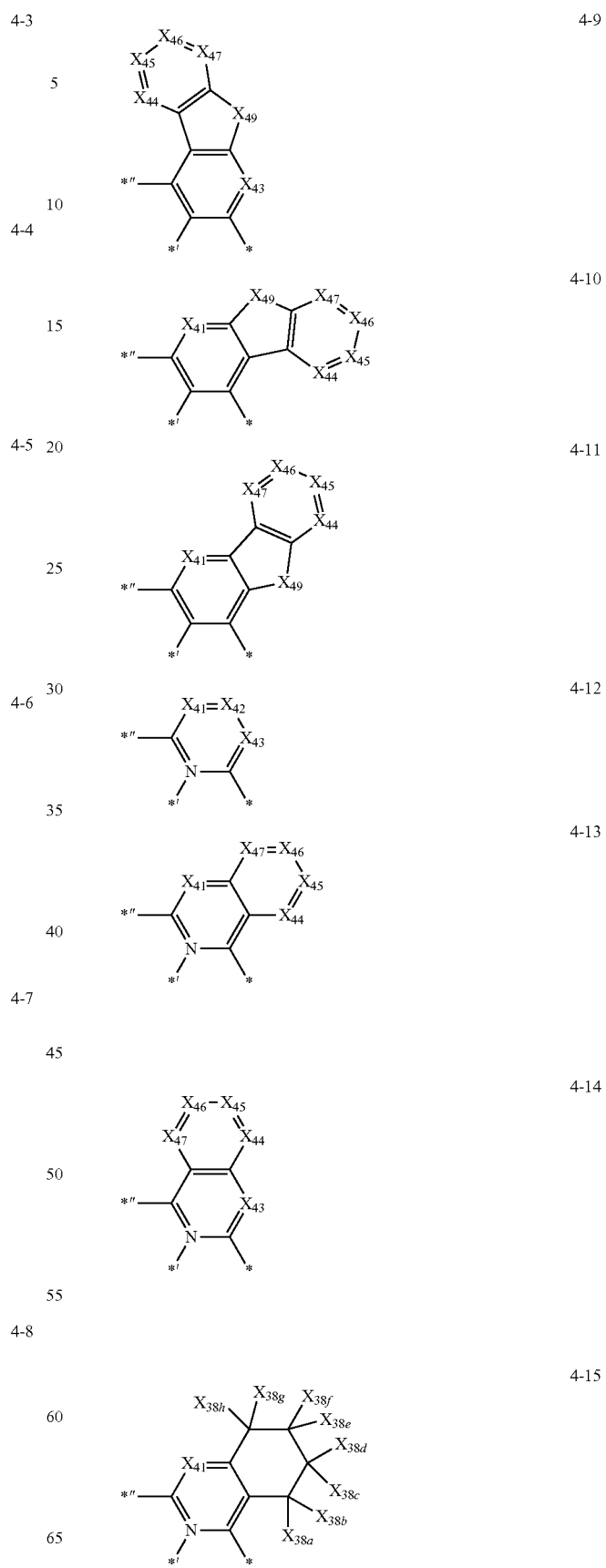

-continued 4-16

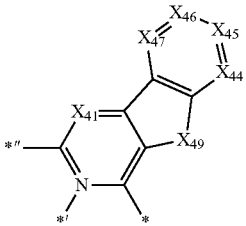

4-17

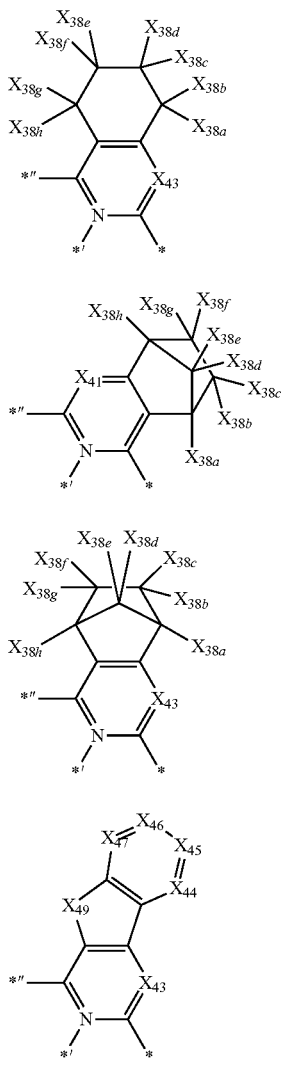

4-18

4-19

4-20

4-21

4-22 wherein, in Formulae 4-1 to 4-22, $X_{41}$ may be N or C-$[(L_{41})_{a41}$-$(R_{41})_{b41}]$, $X_{42}$ may be N or C-$[(L_{42})_{a42}$-$(R_{42})_{b42}]$, $X_{43}$ may be N or C-$[(L_{43})_{a43}$-$(R_{43})_{b43}]$, $X_{44}$ may be N or C-$[(L_{44})_{a44}$-$(R_{44})_{b44}]$, $X_{45}$ may be N or C-$[(L_{45})_{a45}$-$(R_{45})_{b45}]$, $X_{46}$ may be N or C-$[(L_{46})_{a46}$-$(R_{46})_{b46}]$, $X_{47}$ may be N or C-$[(L_{47})_{a47}$-$(R_{47})_{b47}]$, $X_{49}$ may be $C(R_{49a})(R_{49b})$, N-$[(L_{49})_{a49}$-$(R_{49a})_{b49a}]$, O, S, or $Si(R_{49a})(R_{49b})$, $L_{41}$ to $L_{47}$ and $L_{49}$ may each independently be substantially the same as described herein with reference to $L_{15}$, a41 to a47 and a49 may each independently be substantially the same as described herein with reference to a15, $R_{41}$ to $R_{47}$ and $R_{49a}$ to $R_{49h}$ may each independently be substantially the same as described herein with reference to $R_{13}$, b41 to b47 and b49a may each independently be substantially the same as described herein with reference to b13, and

*, *', and *" may each indicate a binding site to an adjacent atom.

In some embodiments, in Formulae 4-1 to 4-22, $X_{41}$ may be C-$[(L_{41})_{a41}$-$(R_{41})_{b41}]$, $X_{42}$ may be C-$[(L_{42})_{a42}$-$(R_{42})_{b42}]$, $X_{43}$ may be C-$[(L_{43})_{a43}$-$(R_{43})_{b43}]$, $X_{44}$ may be C-$[(L_{44})_{a44}$-$(R_{44})_{b44}]$, $X_{45}$ may be C-$[(L_{45})_{a45}$-$(R_{45})_{b45}]$, $X_{46}$ may be C-$[(L_{46})_{a46}$-$(R_{46})_{b46}]$, and $X_{47}$ may be C-$[(L_{47})_{a47}$-$(R_{47})_{b47}]$, but embodiments are not limited thereto.

In one or more embodiments, in Formula 1, a moiety represented by

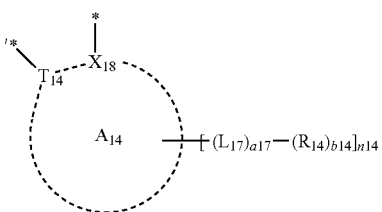

may be selected from groups represented by Formulae 5-1 to 5-32:

5-1

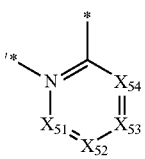

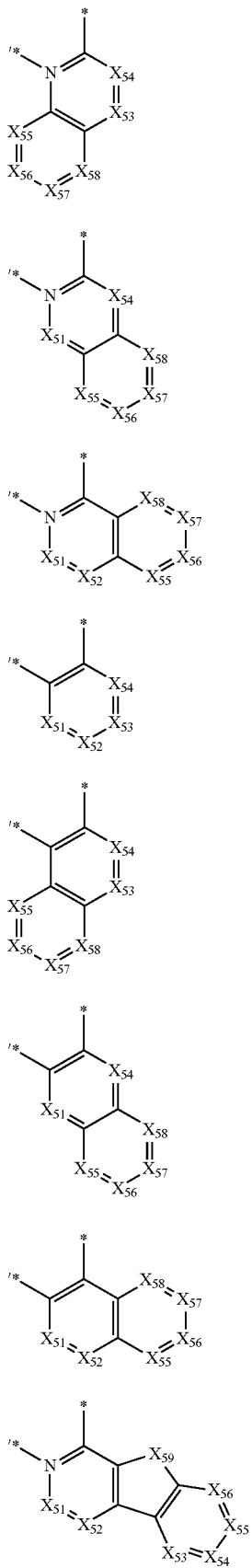
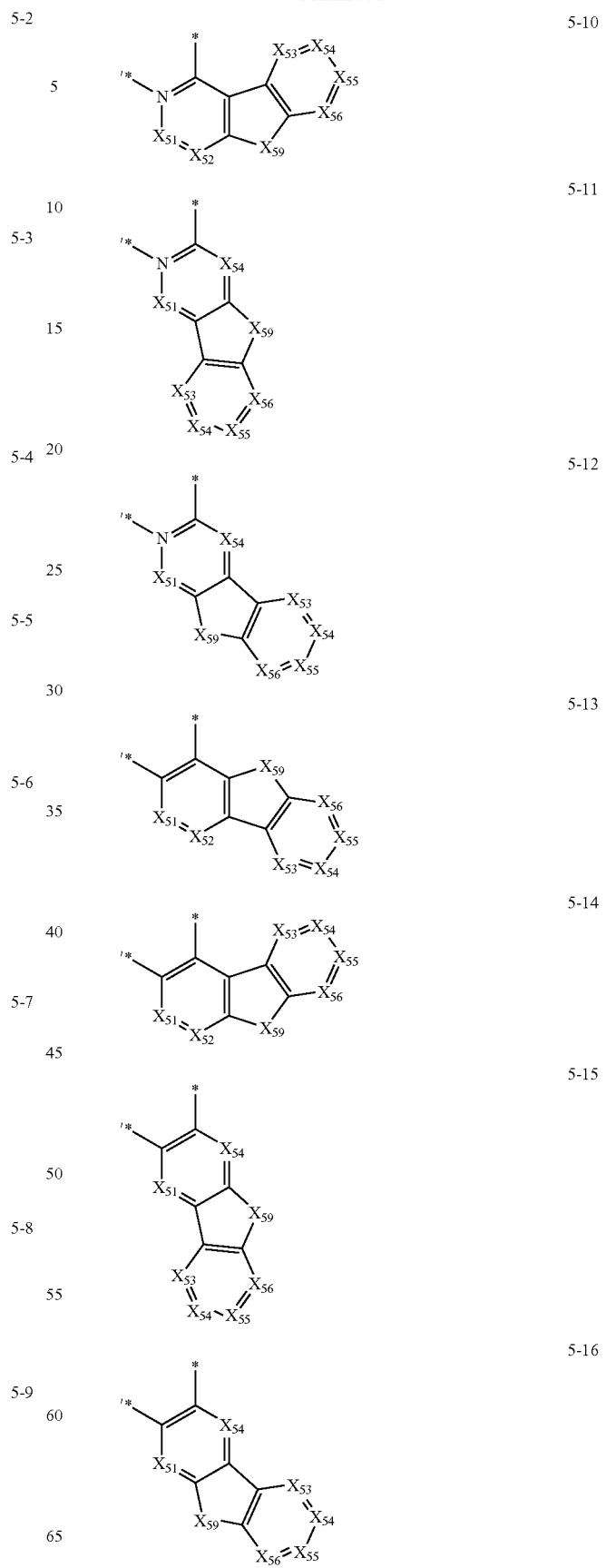

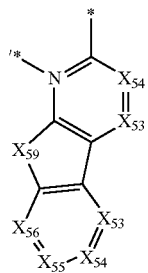
5-17
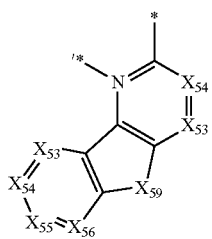
5-18
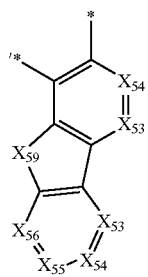
5-19
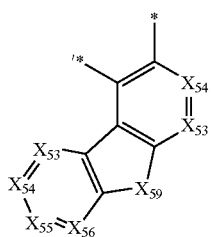
5-20
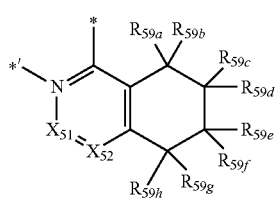
5-21
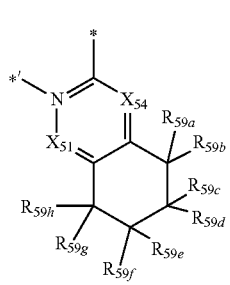
5-22
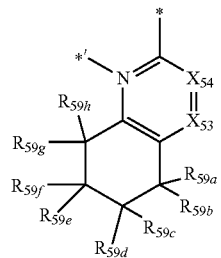
5-23
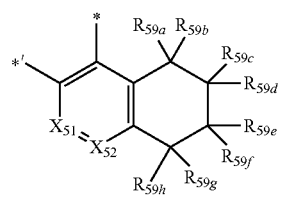
5-24
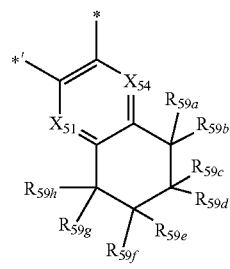
5-25
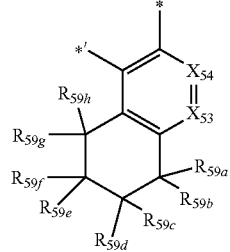
5-26
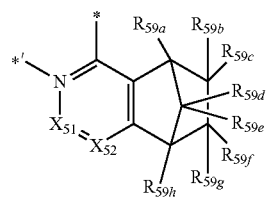
5-27
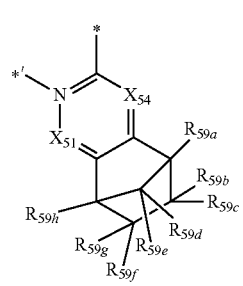
5-28

-continued 5-29
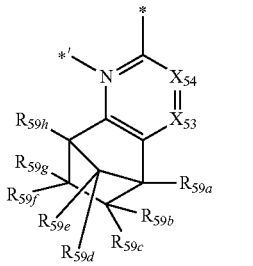

5-30
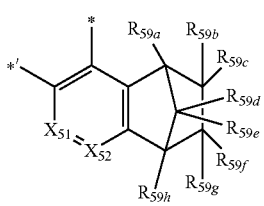

5-31
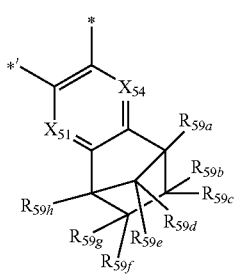

5-32
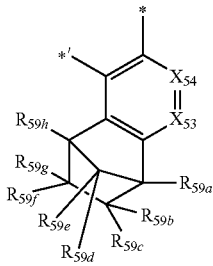

wherein, in Formulae 5-1 to 5-32, $X_{51}$ may be N or C-$[(L_{51})_{a51}$-$(R_{51})_{b51}]$, $X_{52}$ may be N or C-$[(L_{52})_{a52}$-$(R_{52})_{b52}]$, $X_{53}$ may be N or C-$[(L_{53})_{a53}$-$(R_{53})_{b53}]$, $X_{54}$ may be N or C-$[(L_{54})_{a54}$-$(R_{54})_{b54}]$, $X_{55}$ may be N or C-$[(L_{55})_{a55}$-$(R_{55})_{b55}]$, $X_{56}$ may be N or C-$[(L_{56})_{a56}$-$(R_{56})_{b56}]$, $X_{57}$ may be N or C-$[(L_{57})_{a57}$-$(R_{57})_{b57}]$, $X_{58}$ may be N or C-$[(L_{58})_{a58}$-$(R_{58})_{b58}]$, $X_{59}$ may be C($R_{59a}$) ($R_{59b}$), N-$[(L_{59})_{a59}$-$(R_{59a})_{b59a}]$, O, S, or Si($R_{59a}$)($R_{59b}$), $L_{51}$ to $L_{59}$ may each independently be substantially the same as described herein with reference to $L_{17}$, a51 to a59 may each independently be substantially the same as described herein with reference to a17, $R_{51}$ to $R_{58}$ and $R_{59a}$ to $R_{59h}$ may each independently be substantially the same as described herein with reference to $R_{14}$, b51 to b58 and b59a may each independently be substantially the same as described herein with reference to b14, and

* and *' may each indicate a binding site to an adjacent atom.

In some embodiments, in Formulae 5-1 to 5-8, $X_{51}$ may be C-$[(L_{51})_{a51}$-$(R_{51})_{b51}]$, $X_{52}$ may be C-$[(L_{52})_{a52}$-$(R_{52})_{b52}$, $X_{53}$ may be C-$[(L_{53})_{a53}$-$(R_{53})_{b53}]$, $X_{54}$ may be C-$[(L_{54})_{a54}$-$(R_{54})_{b54}]$, $X_{55}$ may be C-$[(L_{55})_{a55}$-$(R_{55})_{b55}]$, $X_{56}$ may be C-$[(L_{56})_{a56}$-$(R_{56})_{b56}]$, $X_{57}$ may be C-$[(L_{57})_{a57}$-$(R_{57})_{b57}]$, and $X_{58}$ may be C-$[(L_{58})_{a58}(R_{58})_{b58}]$, but embodiments are not limited thereto.

In some embodiments, in Formula 1, a moiety represented by may be selected

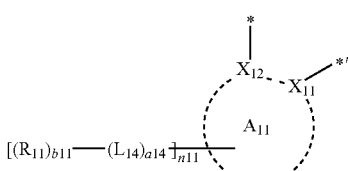

may be selected from groups represented by Formulae 2-1 and 2-5 to 2-10, a moiety represented by

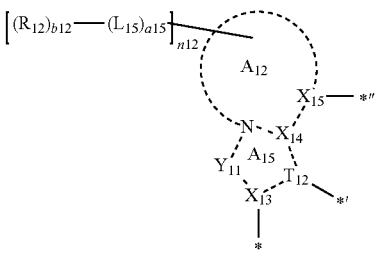

may by selected from groups represented by Formula 3-1, a moiety represented by

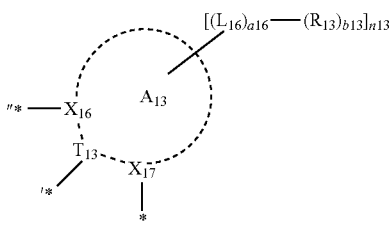

may be selected from groups represented by Formulae 4-1 and 4-4 to 4-11, and a moiety represented by

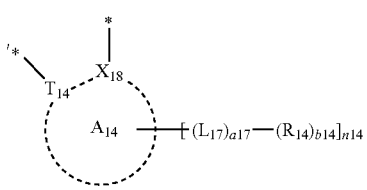

may by selected from groups represented by Formula 5-1, but embodiments are not limited thereto.

In an embodiment, the organometallic compound may be represented by any one of Formulae 1-1 to 1-4:

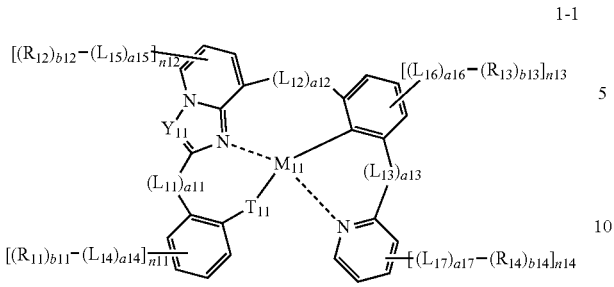
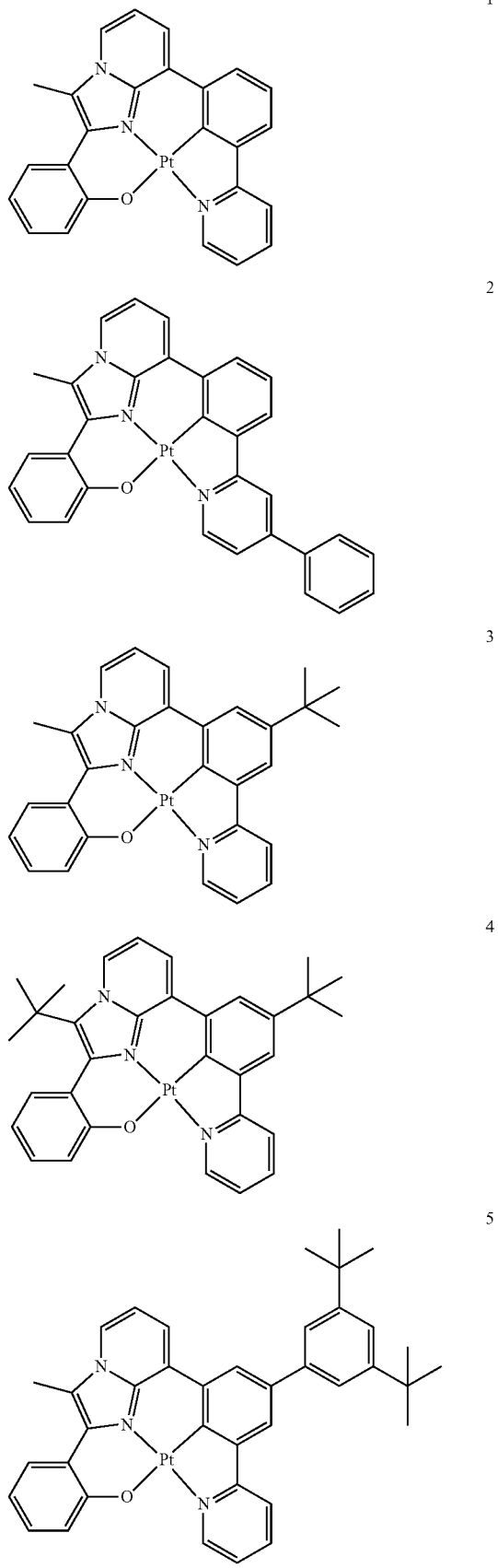
wherein, in Formulae 1-1 to 1-4,
$M_{11}$, $T_{11}$, $Y_{11}$, $L_{11}$ to $L_{17}$, a11 to a17, $R_{11}$ to $R_{14}$, b11 to b14, and n11 to n14 may be the same as those described herein with reference to Formula 1.
In some embodiments, the organometallic compound may be selected from Compounds 1 to 89, but embodiments are not limited thereto:

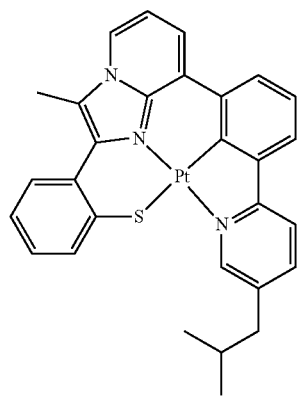
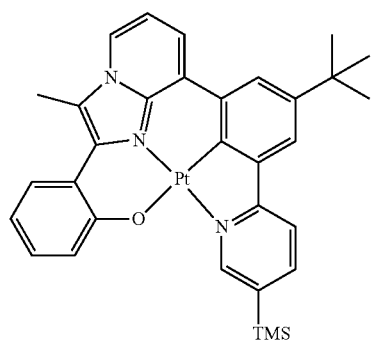
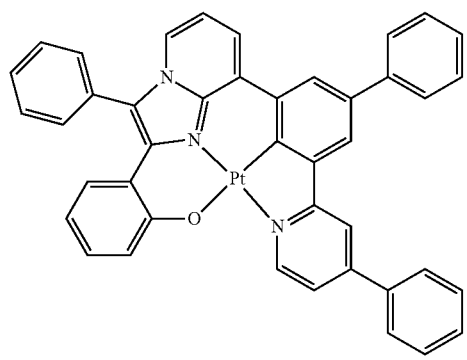
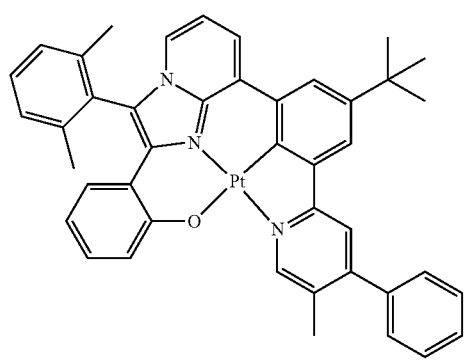
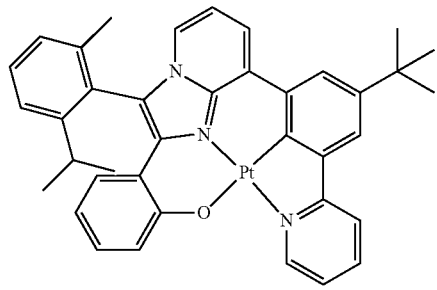
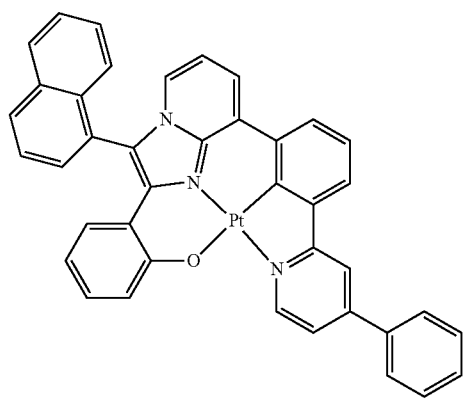
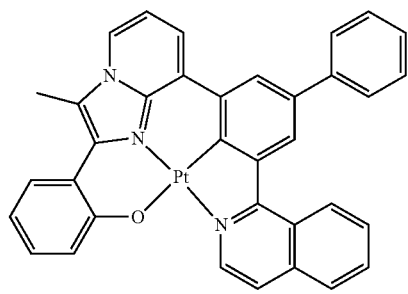
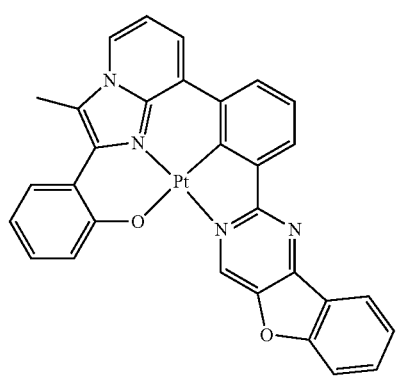

-continued
14
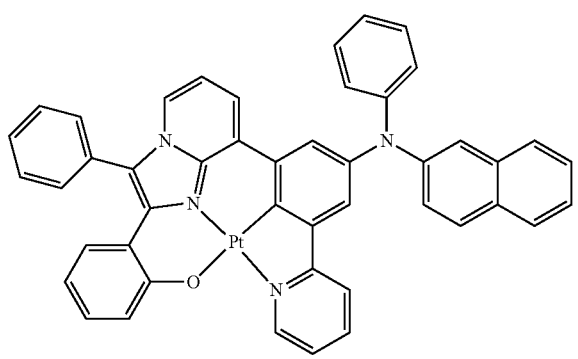
15
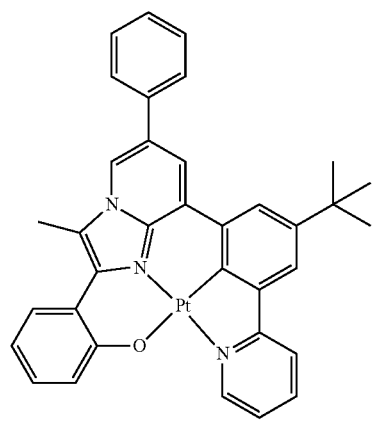
16
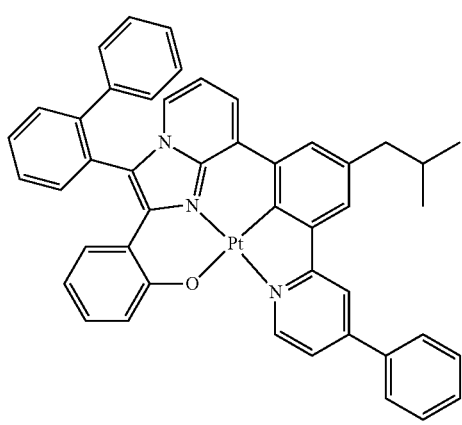
17
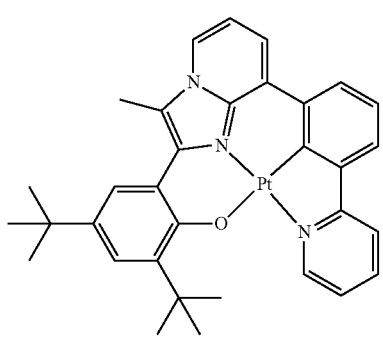
-continued
18
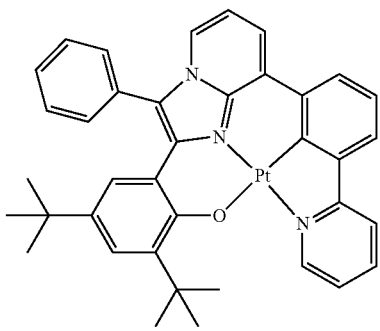
19
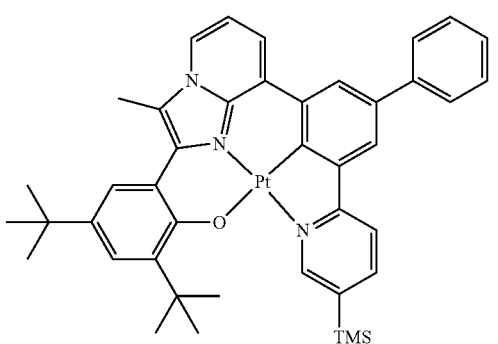
20
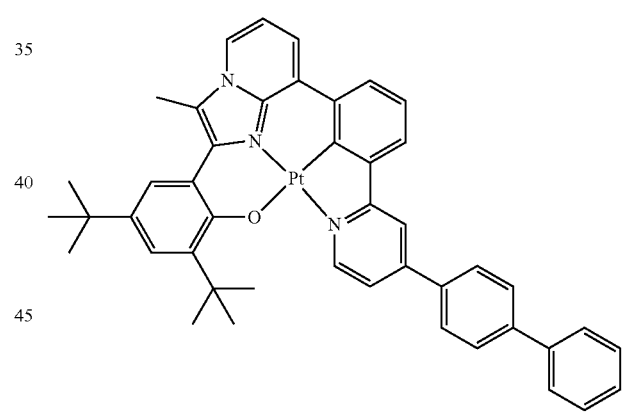
21
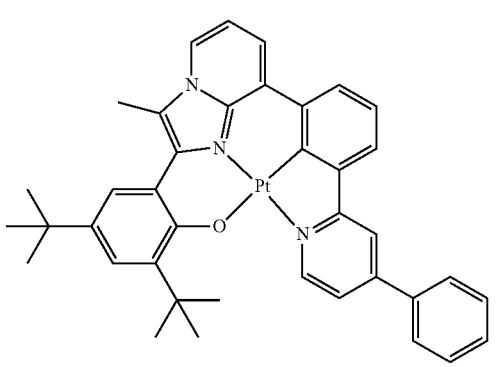

22
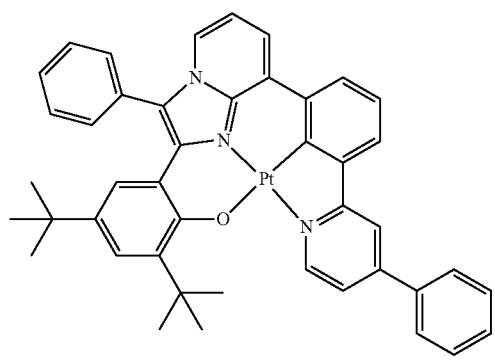
23
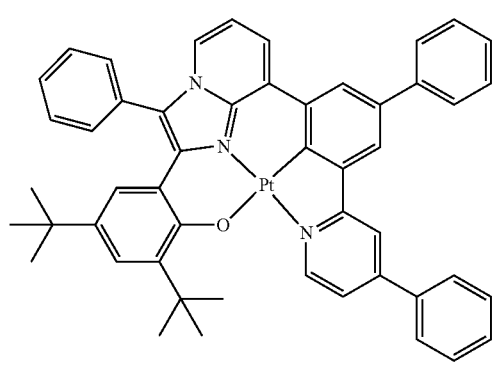
24
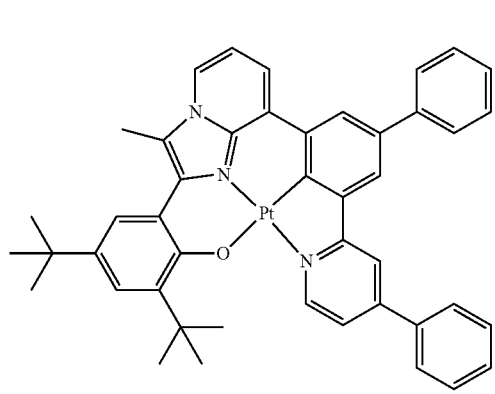
25
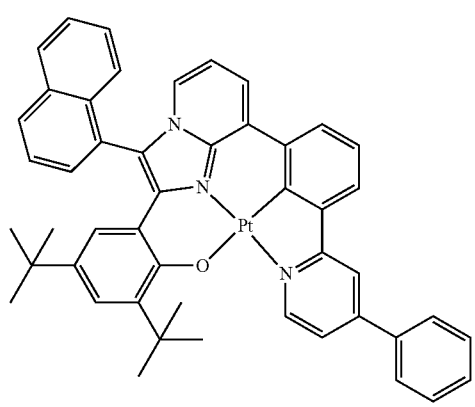
26
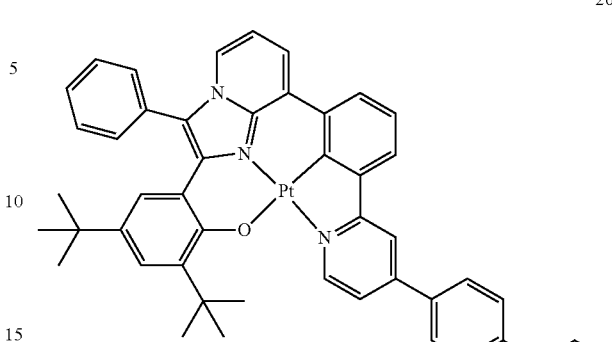
27
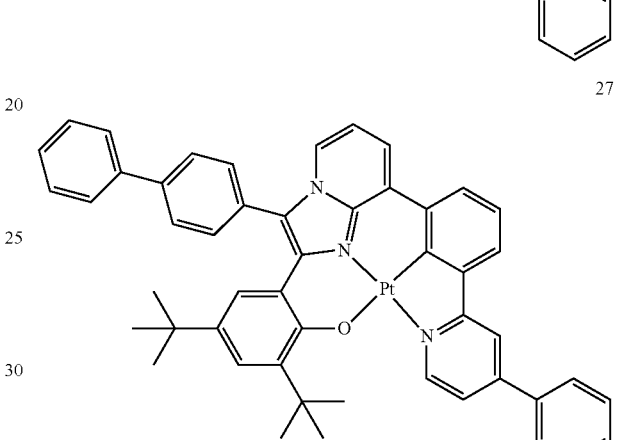
28
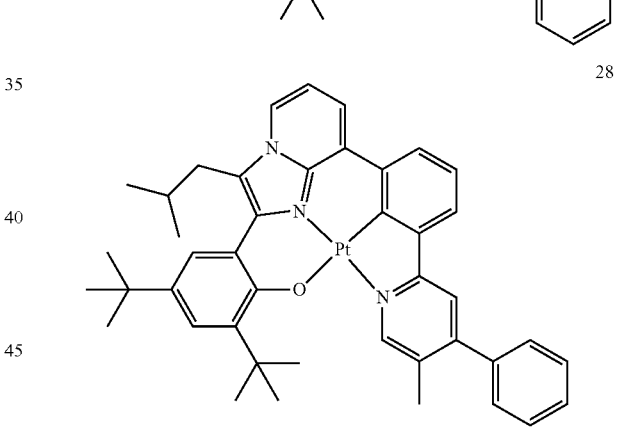
29
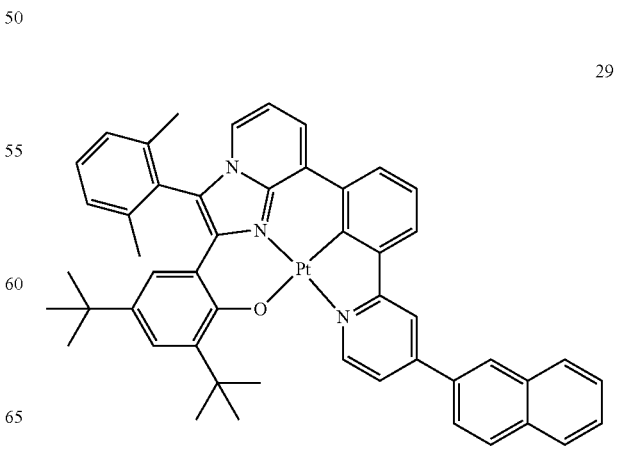

67
-continued
68
-continued
30
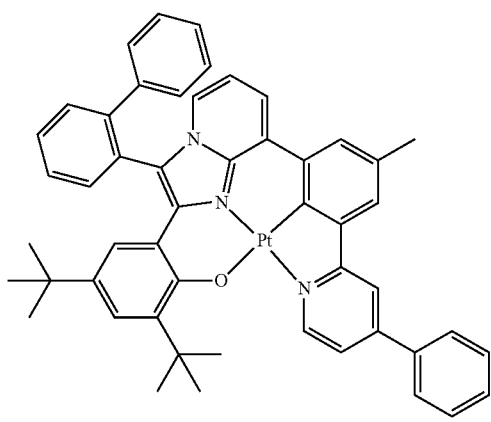
33
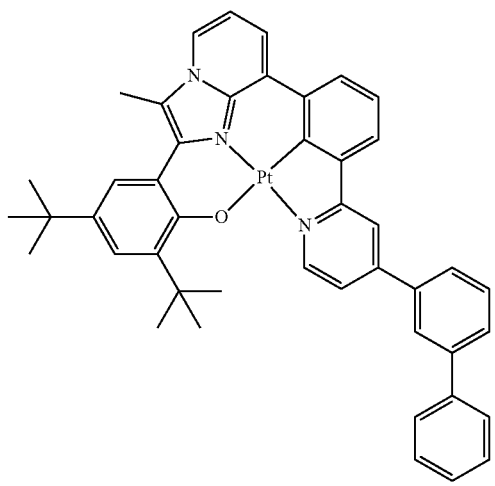
31
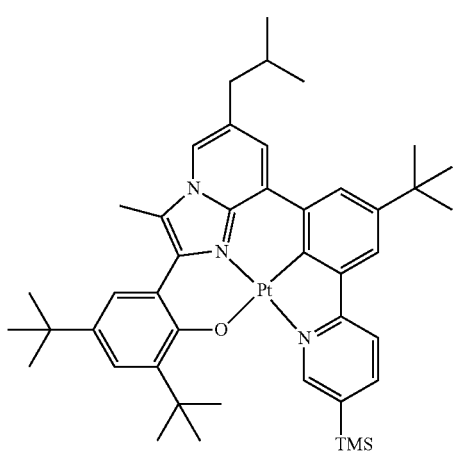
34
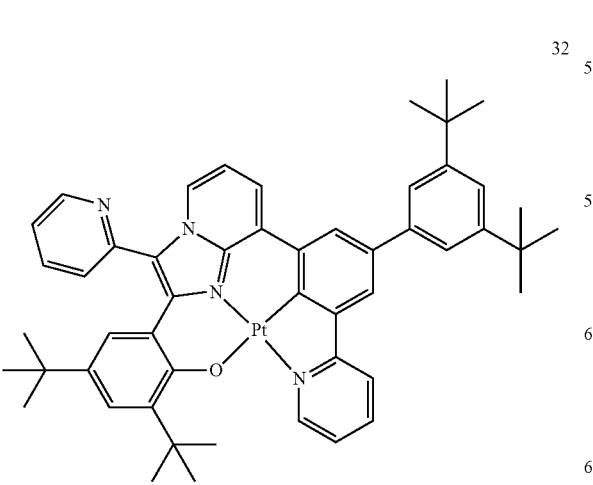
32
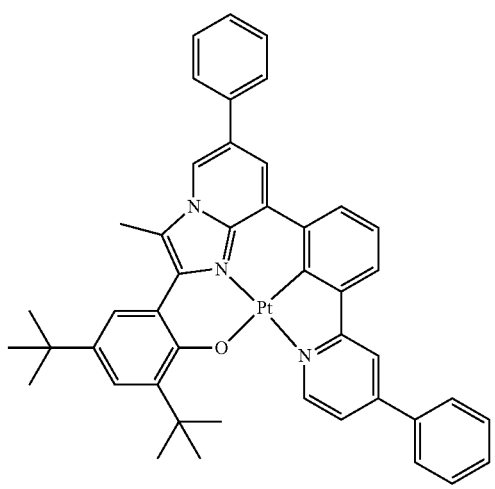
35

36
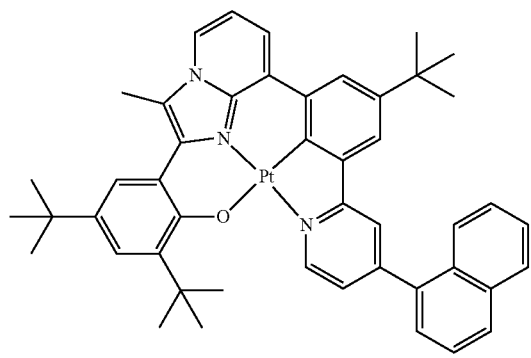
37
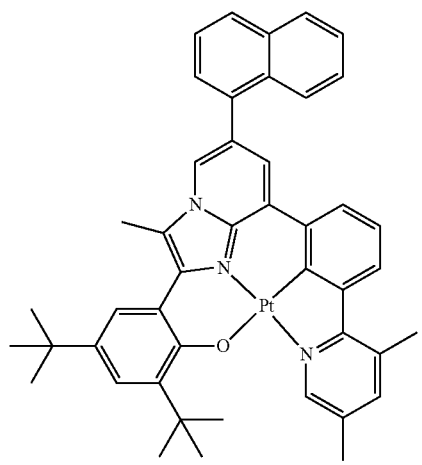
38
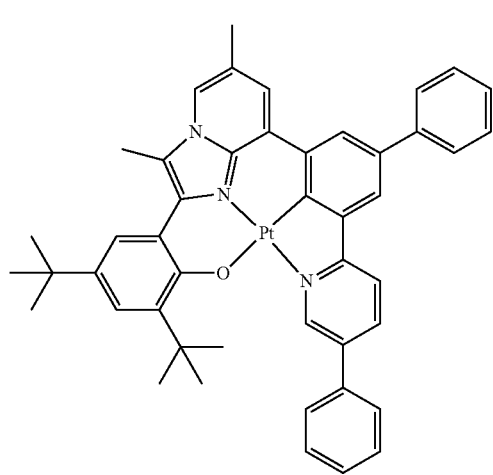
39
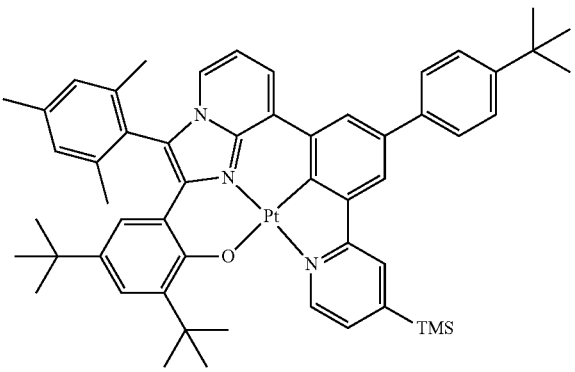
40
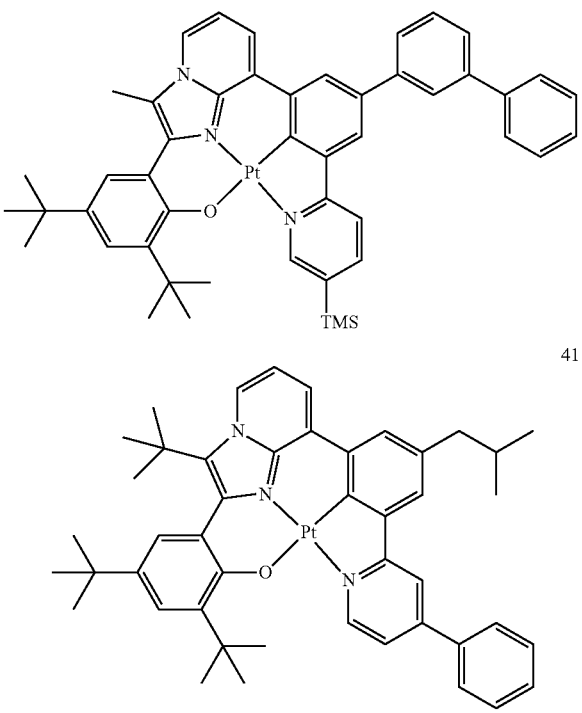
41
42
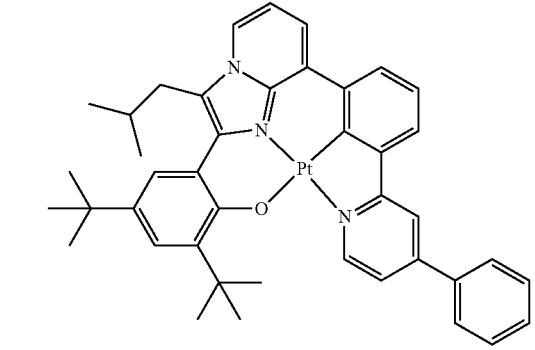

-continued
43
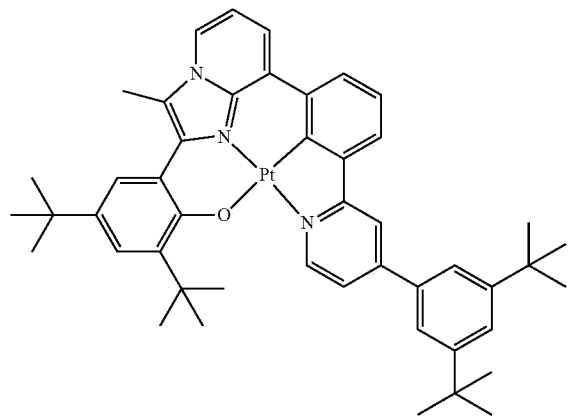
44
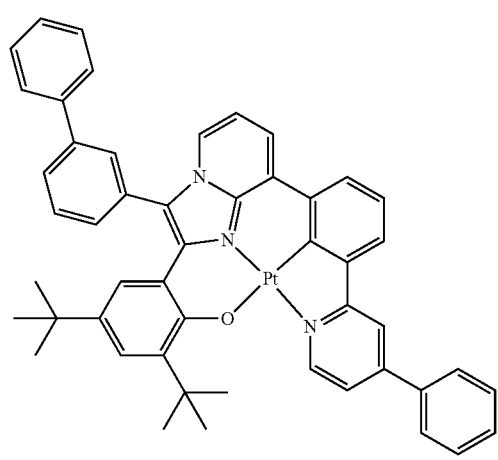
45
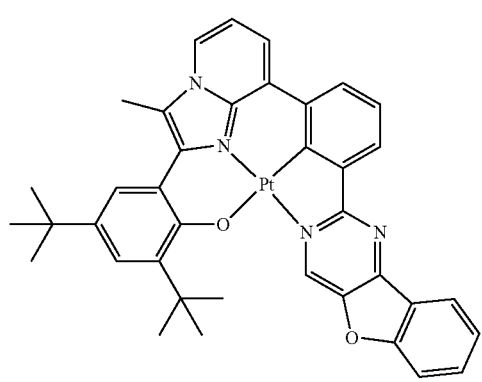
46
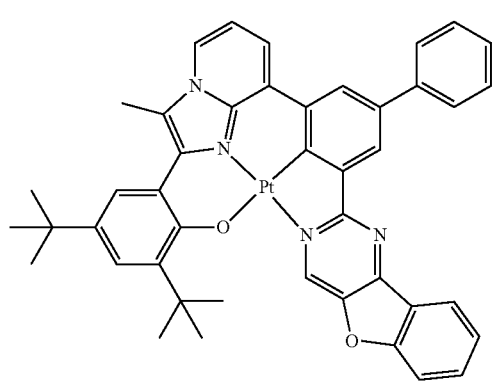
-continued
47
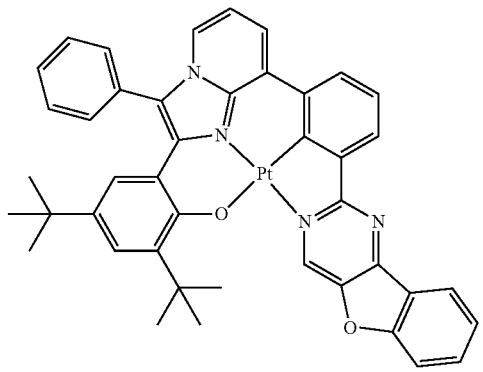
48
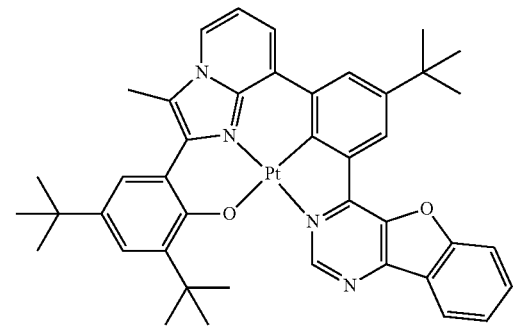
49
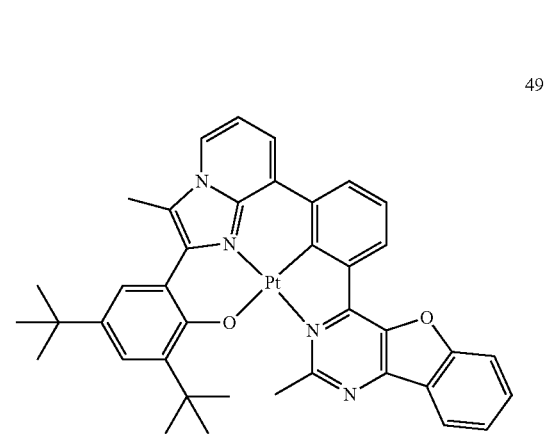
50
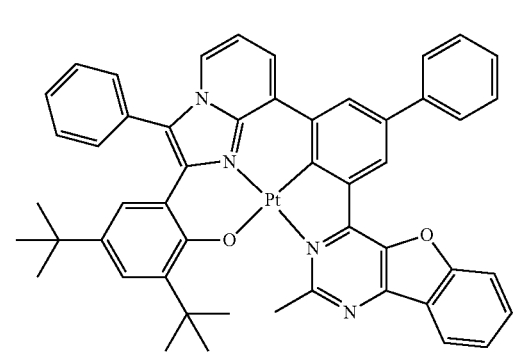

-continued
51
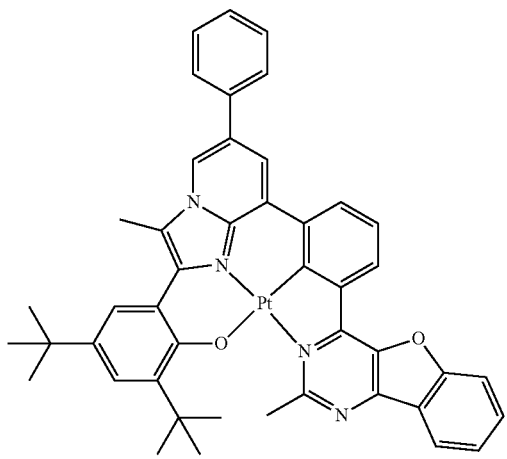
52
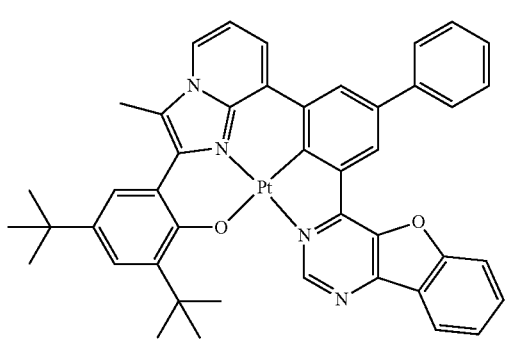
53
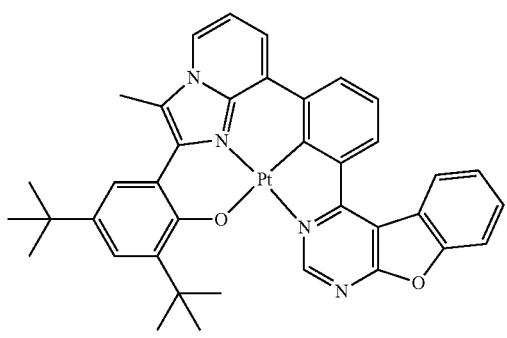
54
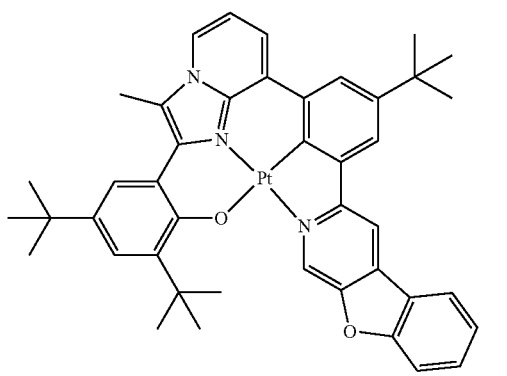
-continued
55
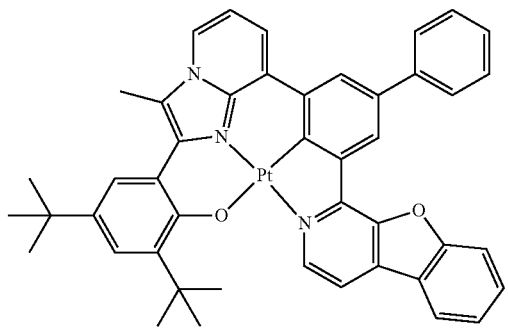
56
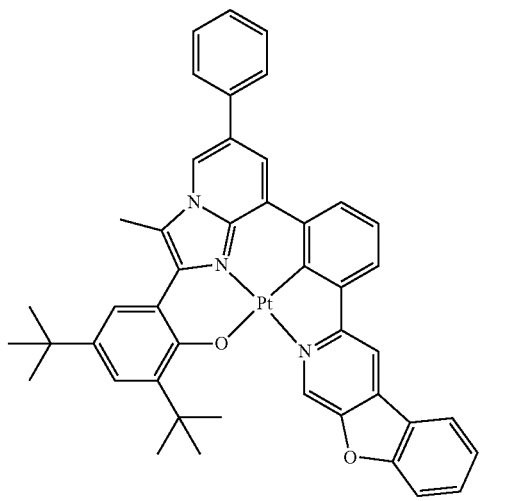
57
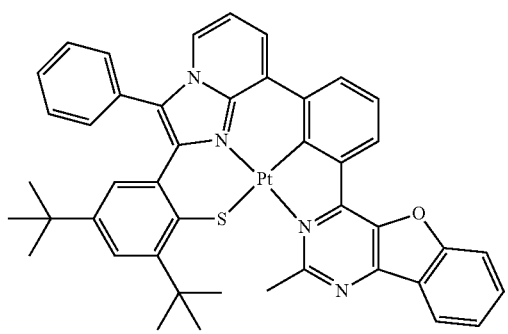
58
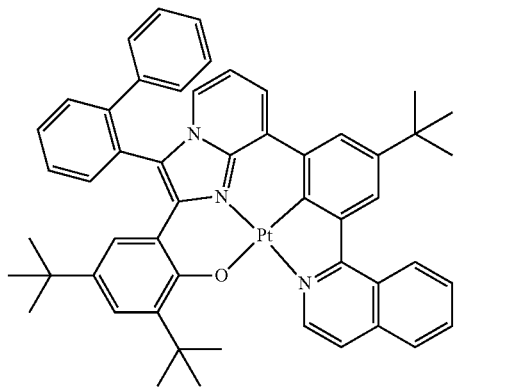

75
-continued
59
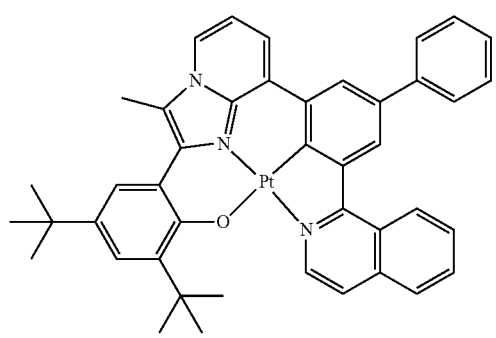
60
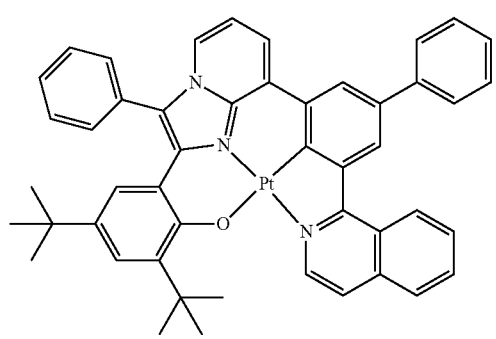
61
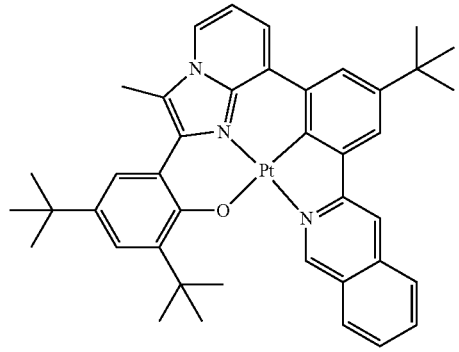
62
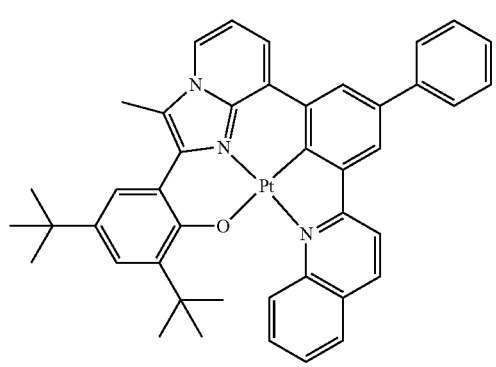
76
-continued
63
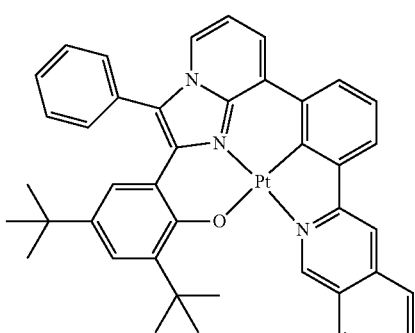
64
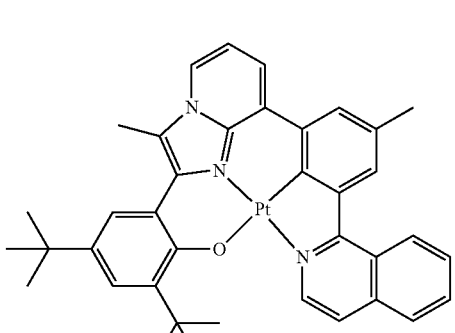
65
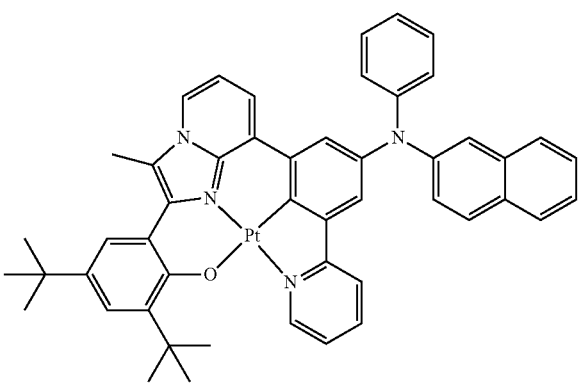
66
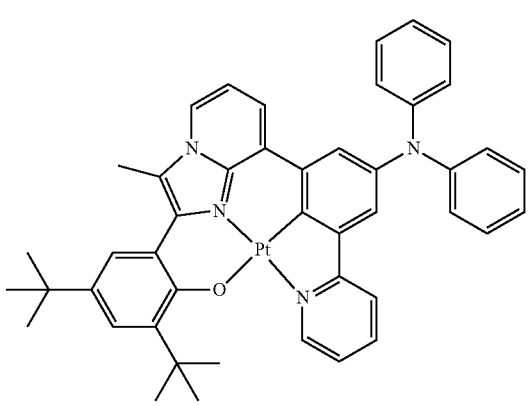

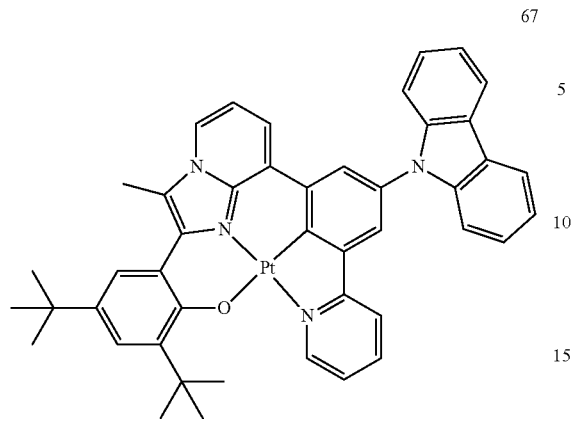
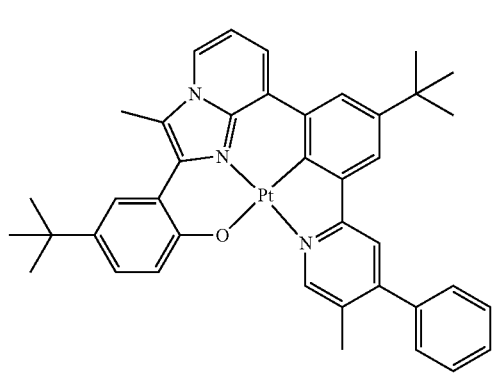

75
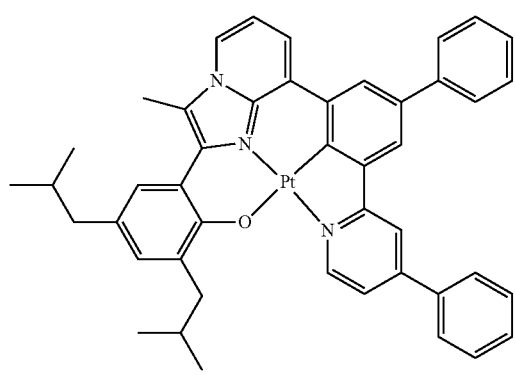
76
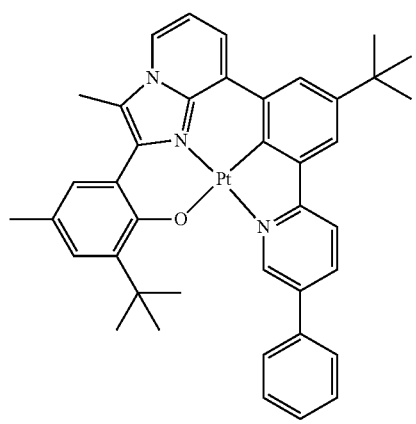
77
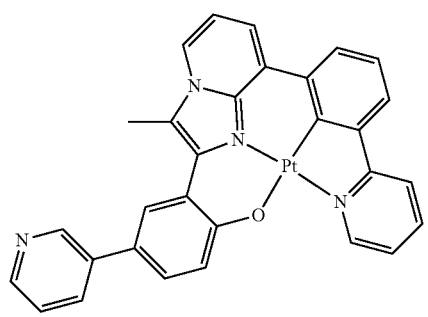
78
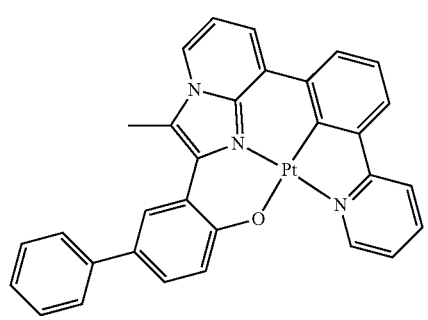
79
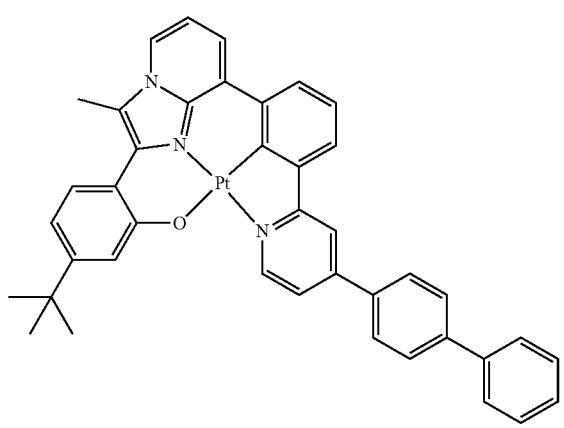
80
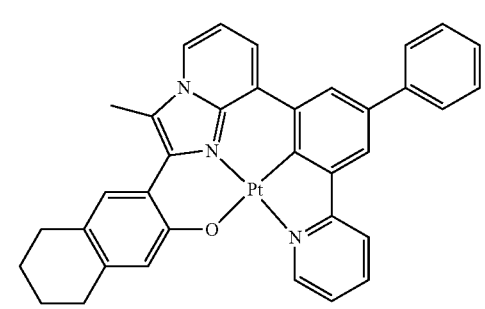
81
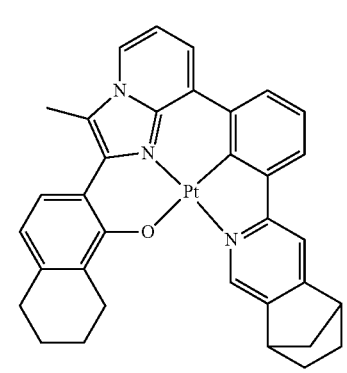
82
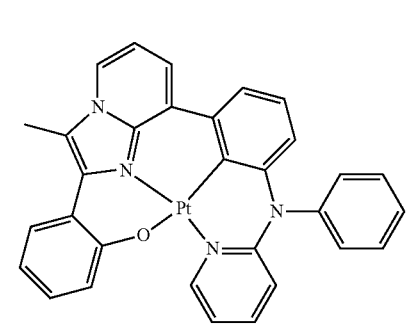

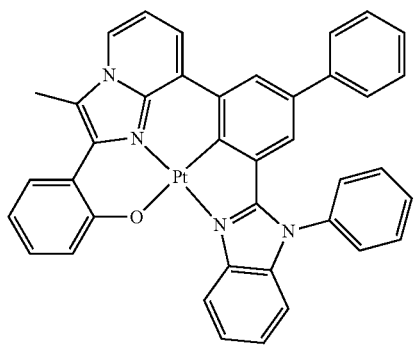

83

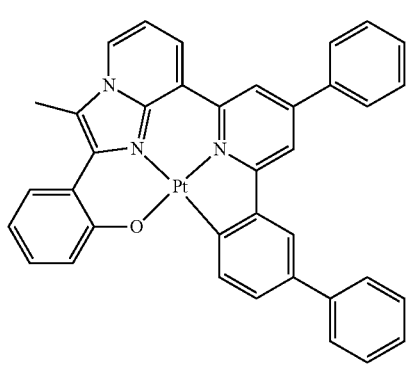

84

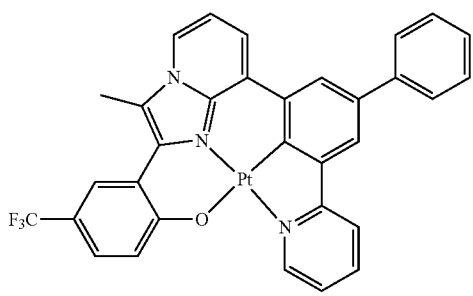

85

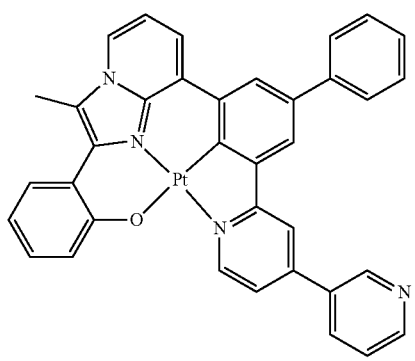

86

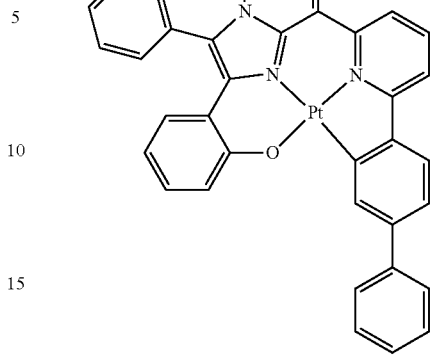

87

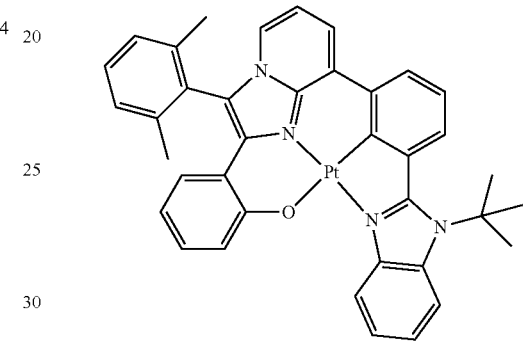

88

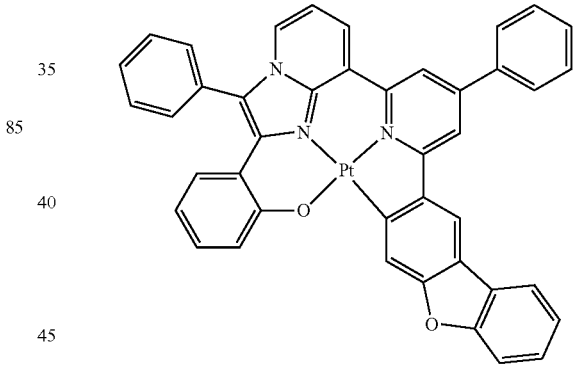

89 wherein in Compounds 1 to 89,
the term "TMS" represents a trimethylsilyl group.

The organometallic compound represented by Formula 1 may include a 5-membered ring represented by $A_{15}$, and $A_{15}$ and $A_{12}$ may share a nitrogen atom. Accordingly, in the organometallic compound represented by Formula 1, the highest occupied molecular orbital (HOMO) may be easily separated from the lowest unoccupied molecular orbital (LUMO), which may facilitate charge transfer. Thus, the organometallic compound represented by Formula 1 is advantageous in terms of its emission properties, and therefore, an organic light-emitting device employing the organometallic compound may have high efficiency.

Furthermore, the organometallic compound represented by Formula 1 includes N shared by the 5-membered ring and a 6-membered ring, and thus, an emission wavelength of the organometallic compound may be longer to enable the compound to emit red light.

In addition, in Formula 1, a cyclometalated ring formed of $A_{15}$, $A_{12}$, $A_{13}$, and $M_{11}$ may be a 6-membered ring, a 7-membered ring, or an 8-membered ring. Accordingly, a full width at half maximum (FWHM) of the organometallic compound represented by Formula 1 may decrease, and thus, efficiency of an organic light-emitting device including the organometallic compound may improve.

For example, the HOMO, LUMO, singlet ($S_1$), and triplet ($T_1$) energy levels of the organometallic Compounds 4, 5, 7, 18, 24, 52, 63 to 68, 77, and 78 were evaluated by using a Gaussian according to a density functional theory (DFT) method (structure optimization was performed at a degree of B3LYP, and 6-31G(d,p)). The results thereof are shown in Table 1.

TABLE 1

| Compound No. | HOMO (eV) | LUMO (eV) | $S_1$ energy level (eV) | $T_1$ energy level (eV) |
|---|---|---|---|---|
| 4 | −4.560 | −1.675 | 2.384 | 2.147 |
| 5 | −4.545 | −1.710 | 2.338 | 2.080 |
| 7 | −4.496 | −1.665 | 2.339 | 2.085 |
| 18 | −4.385 | −1.717 | 2.192 | 2.022 |
| 24 | −4.396 | −1.820 | 2.101 | 2.008 |
| 52 | −4.527 | −2.295 | 1.779 | 1.711 |
| 63 | −4.453 | −1.866 | 2.123 | 1.984 |
| 64 | −4.435 | −2.085 | 1.879 | 1.809 |
| 65 | −4.450 | −1.768 | 2.202 | 1.980 |
| 68 | −4.393 | −1.989 | 1.956 | 1.829 |
| 77 | −4.654 | −1.816 | 2.366 | 2.107 |
| 78 | −4.529 | −1.764 | 2.301 | 2.067 |

Referring to the results of Table 1, the organometallic compound of Formula 1 was found to have suitable electrical characteristics for use as a dopant in an electronic device, e.g., an organic light-emitting device.

A method of synthesizing the organometallic compound represented by Formula 1 may be apparent to one of ordinary skill in the art by referring to Synthesis Examples provided herein.

The organometallic compound represented by Formula 1 may be suitable for use in an organic layer of an organic light-emitting device, e.g., as a dopant in an emission layer of the organic layer. Thus, according to another aspect, there is provided an organic light-emitting device that may include:

a first electrode;

a second electrode; and an organic layer disposed between the first electrode and the second electrode, wherein the organic layer includes an emission layer, and wherein the organic layer includes at least one organometallic compound represented by Formula 1.

Since the organic light-emitting device has an organic layer including the organometallic compound represented by Formula 1, the organic light-emitting device may have a low driving voltage, high efficiency, high power, high quantum efficiency, a long lifespan, low roll-off, and excellent color purity.

The organometallic compound represented by Formula 1 may be used in a pair of electrodes of an organic light-emitting device. For example, the organometallic compound represented by Formula 1 may be included in the emission layer. In this case, the organometallic compound may serve as a dopant and the emission layer may further include a host (that is, an amount of the organometallic compound represented by Formula 1 may be smaller than that of the host).

As used herein, "(for example, the organic layer) including at least one organometallic compound" means that "(the organic layer) including an organometallic compound of Formula 1, or at least two different organometallic compounds of Formula 1".

For example, the organic layer may include Compound 1 only as the organometallic compound. In this embodiment, Compound 1 may be included in the emission layer of the organic light-emitting device. In some embodiments, the organic layer may include Compounds 1 and 2 as the organometallic compounds. In this embodiment, Compounds 1 and 2 may be included in the same layer (for example, Compounds 1 and 2 may be both included in the emission layer).

The first electrode may be an anode, which is a hole injection electrode, and the second electrode may be a cathode, which is an electron injection electrode. In some embodiments, the first electrode may be a cathode, which is an electron injection electrode, and the second electrode may be an anode, which is a hole injection electrode.

For example, in the organic light-emitting device, the first electrode may be an anode, the second electrode may be a cathode, and the organic layer may further include a hole transport region disposed between the first electrode and the emission layer and an electron transport region disposed between the emission layer and the second electrode, wherein the hole transport region may include a hole injection layer, a hole transport layer, an electron blocking layer, or a combination thereof, and wherein the electron transport region may include a hole blocking layer, an electron transport layer, an electron injection layer, or a combination thereof.

As used herein, the term "organic layer" refers to a single and/or a plurality of layers disposed between the first electrode and the second electrode in an organic light-emitting device. The "organic layer" may include not only organic compounds but also organometallic complexes including metals.

The FIGURE illustrates a schematic view of an organic light-emitting device 10 according to an embodiment. Hereinafter a structure and a method of manufacturing an organic light-emitting device according to an embodiment will be described with reference to the FIGURE. The organic light-emitting device 10 may include a first electrode 11, an organic layer 15, and a second electrode 19, which may be sequentially layered in the stated order.

A substrate may be additionally disposed under the first electrode 11 or on the second electrode 19. The substrate may be a conventional substrate used in organic light-emitting devices, e.g., a glass substrate or a transparent plastic substrate, each having excellent mechanical strength, thermal stability, transparency, surface smoothness, ease of handling, and water repellency.

The first electrode 11 may be formed by vacuum-depositing or sputtering a material for forming the first electrode 11 on the substrate. The first electrode 11 may be an anode. The material for forming the first electrode 11 may be selected from materials having a high work function for easy hole injection. The first electrode 11 may be a reflective electrode, a semi-transmissive electrode, or a transmissive electrode. The material for forming the first electrode 11 may be selected from indium tin oxide (ITO), indium zinc oxide (IZO), tin oxide ($SnO_2$), and zinc oxide (ZnO). In some embodiments, the material for forming the first electrode 11 may be a metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including a plurality of layers. In some embodiments, the first electrode 11 may have a triple-layered structure of ITO/Ag/ITO, but embodiments are not limited thereto.

The organic layer 15 may be disposed on the first electrode 11.

The organic layer 15 may include a hole transport region, an emission layer, and an electron transport region.

The hole transport region may be disposed between the first electrode 11 and the emission layer.

The hole transport region may include a hole injection layer, a hole transport layer, an electron blocking layer, a buffer layer, or a combination thereof.

The hole transport region may include a hole injection layer only or a hole transport layer only. In some embodiments, the hole transport region may include a hole injection layer and a hole transport layer, which are sequentially stacked on the first electrode 11. In some embodiments, the hole transport region may include a hole injection layer, a hole transport layer, and an electron blocking layer, which are sequentially stacked on the first electrode 11.

When the hole transport region includes a hole injection layer, the hole injection layer may be formed on the first electrode 11 by using one or more suitable methods, such as vacuum deposition, spin coating, casting, and Langmuir-Blodgett (LB) deposition.

When a hole injection layer is formed by vacuum deposition, for example, the vacuum deposition may be performed at a temperature in a range of about 100° C. to about 500° C., at a vacuum degree in a range of about $10^{-8}$ torr to about $10^{-3}$ torr, and at a rate in a range of about 0.01 Angstroms per second (Å/sec) to about 100 Å/sec, though the conditions may vary depending on a compound used as a hole injection material and a structure and thermal properties of a desired hole injection layer, but embodiments are not limited thereto.

When a hole injection layer is formed by spin coating, the spin coating may be performed at a rate in a range of about 2,000 revolutions per minute (rpm) to about 5,000 rpm and at a temperature in a range of about 80° C. to 200° C. to facilitate removal of a solvent after the spin coating, though the conditions may vary depending on a compound used as a hole injection material and a structure and thermal properties of a desired hole injection layer, but embodiments are not limited thereto.

The conditions for forming a hole transport layer and an electron blocking layer may be inferred from the conditions for forming the hole injection layer.

The hole transport region may include at least one selected from m-MTDATA, TDATA, 2-TNATA, NPB, β-NPB, TPD, spiro-TPD, spiro-NPB, methylated-NPB, TAPC, HMTPD, 4,4',4"-tris(N-carbazolyl)triphenylamine (TCTA), polyaniline/dodecylbenzene sulfonic acid (PANI/DBSA), poly(3,4-ethylenedioxythiophene)/poly(4-styrene sulfonate) (PEDOT/PSS), polyaniline/camphor-sulfonic acid (PANT/CSA), (polyaniline)/poly(4-styrene sulfonate) (PANI/PSS), a compound represented by Formula 201, and a compound represented by Formula 202:

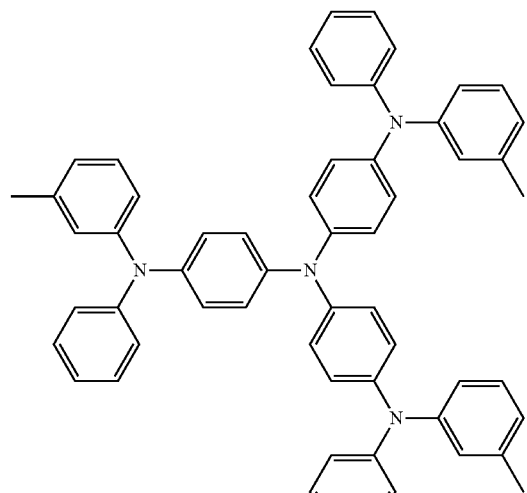

m-MTDATA

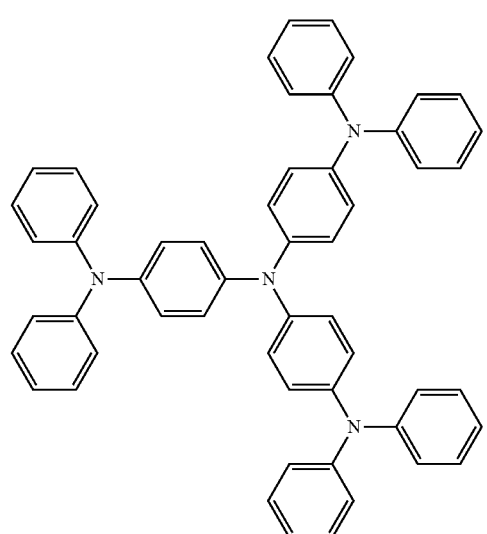

TDATA

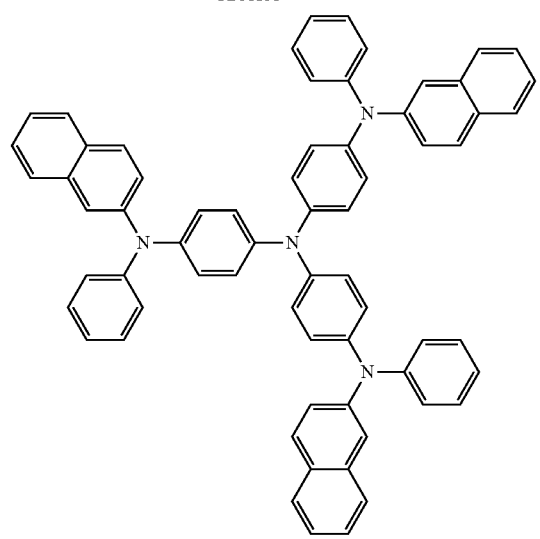

2-TNATA

-continued

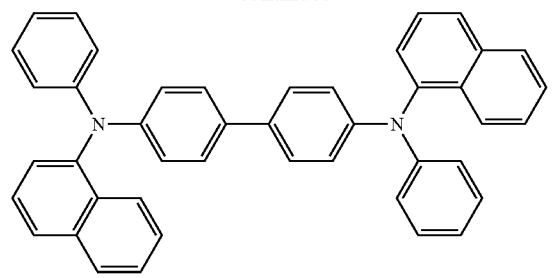

NPB

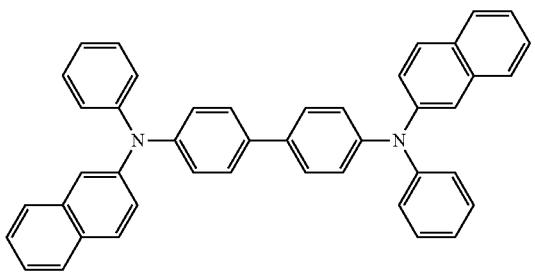

β-NPB

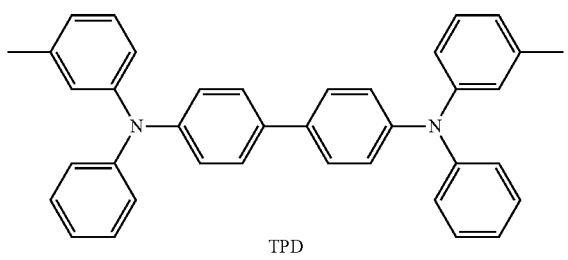

TPD

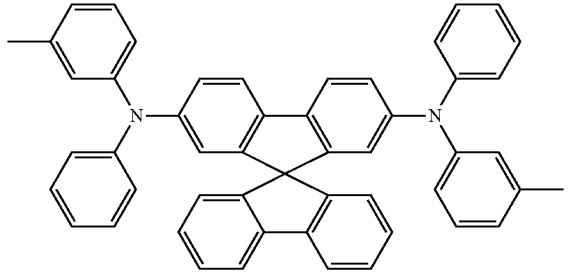

Spiro-TPD

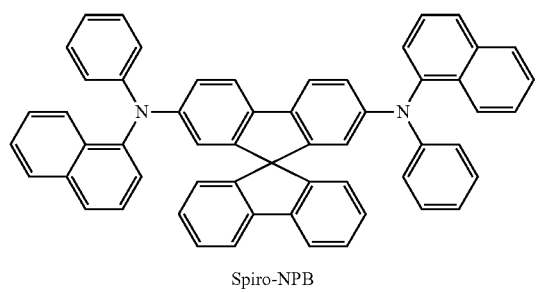

Spiro-NPB

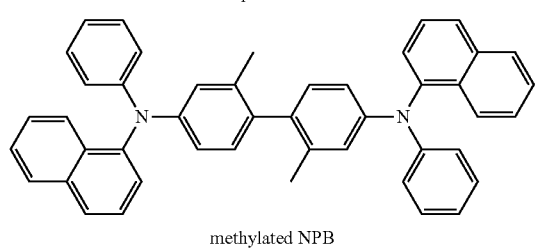

methylated NPB

-continued

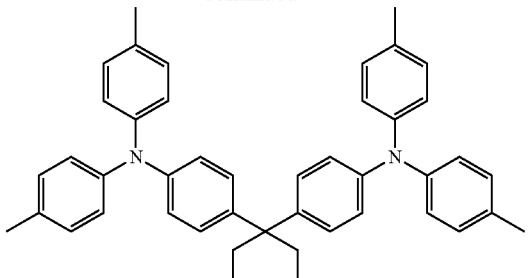

TAPC

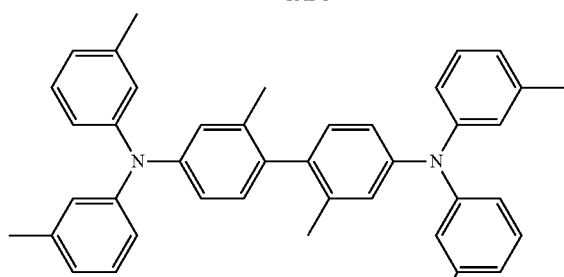

HMTPD

Formula 201

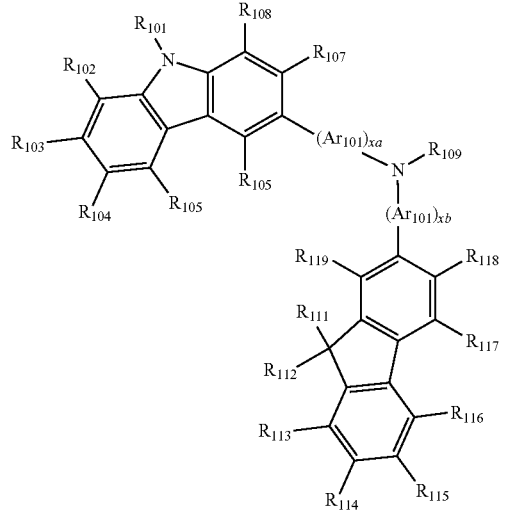

Formula 202

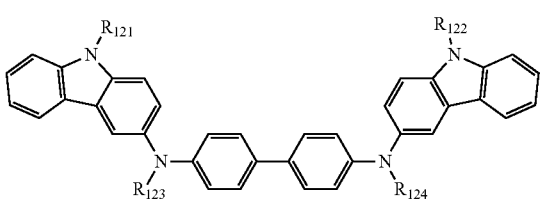

wherein, in Formula 201, $Ar_{101}$ and $Ar_{102}$ may each independently be selected from a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, and a pentacenylene group; and a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

In Formula 201, xa and xb may each independently be an integer from 0 to 5. In some embodiments, xa and xb may each independently be an integer of 0, 1, or 2. In some embodiments, xa may be 1, and xb may be 0, but embodiments are not limited thereto.

In Formulae 201 and 202, $R_{101}$ to $R_{108}$, $R_{111}$ to $R_{119}$, and $R_{121}$ to $R_{124}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (e.g., a methyl group, an ethyl group, a propyl group, a butyl group, a pentyl group, or a hexyl group), and a $C_1$-$C_{10}$ alkoxy group (e.g., a methoxy group, an ethoxy group, a propoxy group, a butoxy group, or a pentoxy group);

a $C_1$-$C_{10}$ alkyl group and a $C_1$-$C_{10}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a naphthyl group, an anthracenyl group, a fluorenyl group, and a pyrenyl group; and a phenyl group, a naphthyl group, an anthracenyl group, a fluorenyl group, and a pyrenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, and a $C_1$-$C_{10}$ alkoxy group, but embodiments are not limited thereto.

In Formula 201, $R_{109}$ may be selected from a phenyl group, a naphthyl group, an anthracenyl group, and a pyridinyl group; and a phenyl group, a naphthyl group, an anthracenyl group, and a pyridinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, and a pyridinyl group.

In some embodiments, the compound represented by Formula 201 may be represented by Formula 201A, but embodiments are not limited thereto:

Formula 201A

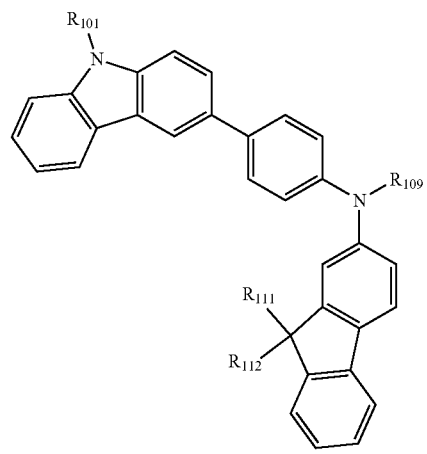

wherein, in Formula 201A, $R_{101}$, $R_{111}$, $R_{112}$, and $R_{109}$ may be the same as those described herein.

In some embodiments, the compounds represented by Formulae 201 and 202 may include Compounds HT1 to HT20, but embodiments are not limited thereto:

HT1

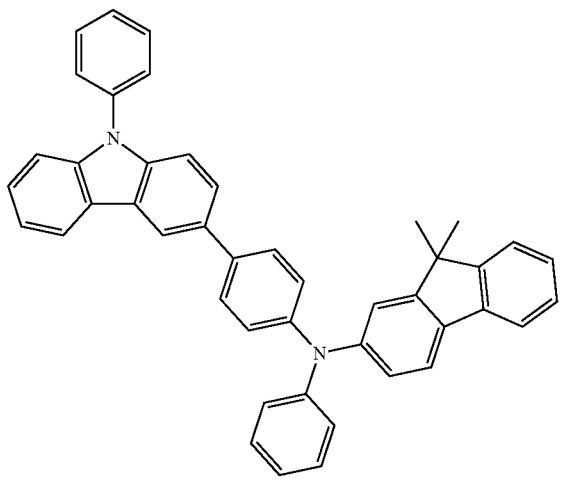

HT2
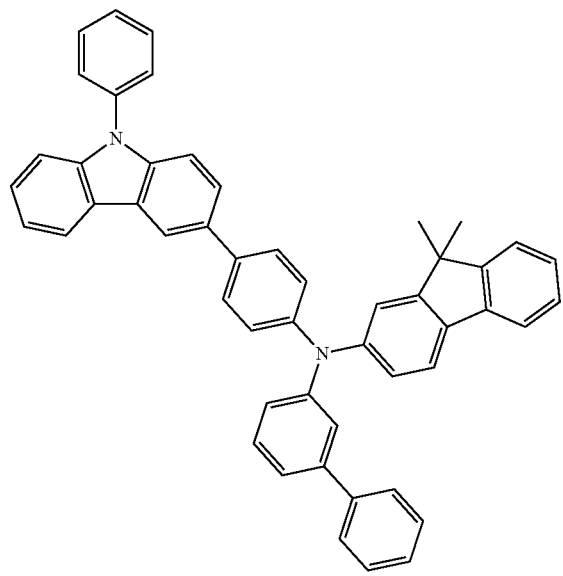
HT4
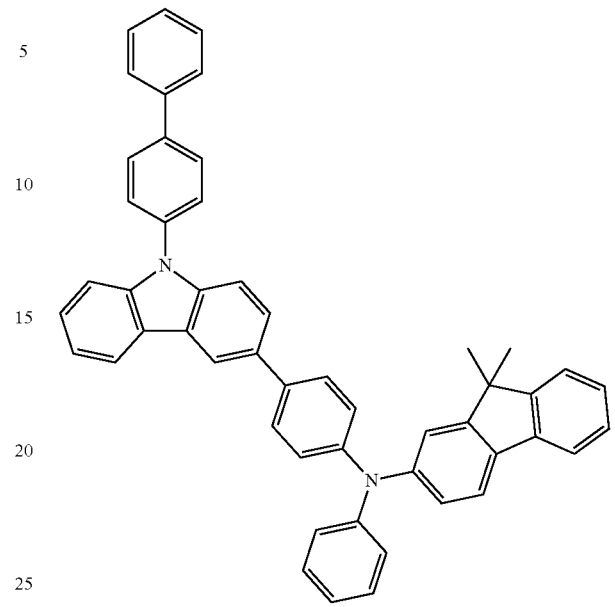
HT3
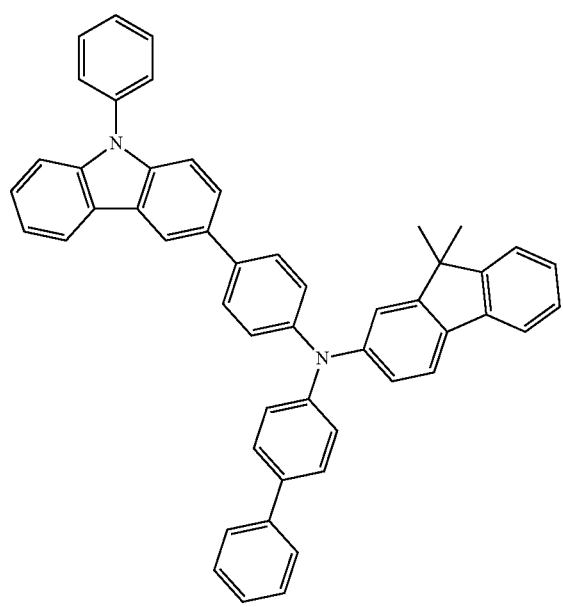
HT5
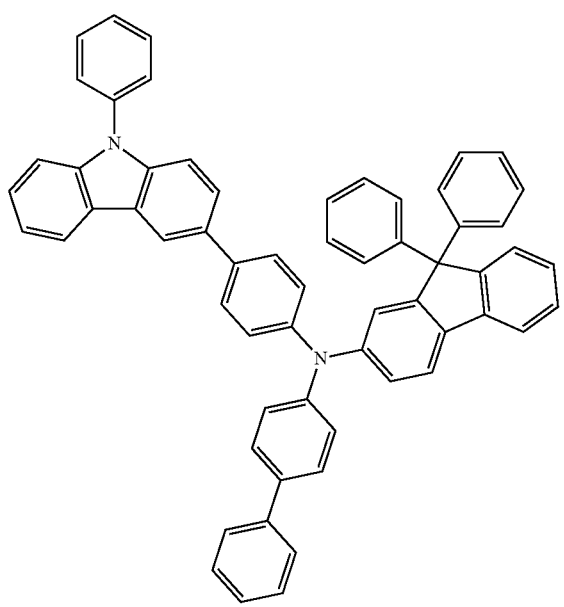

HT6
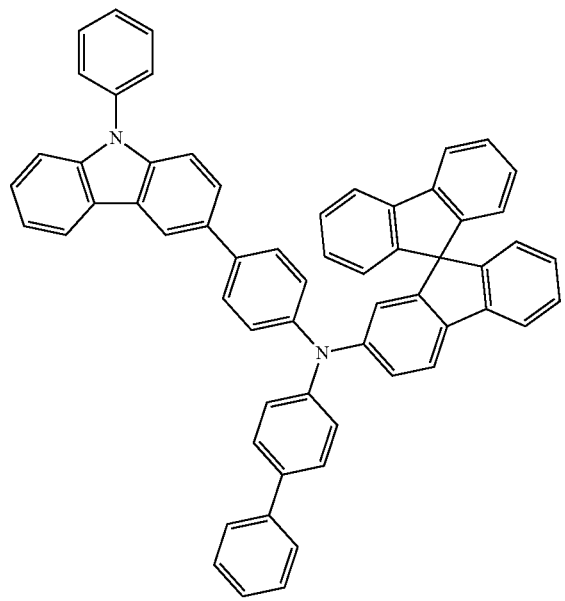
HT8
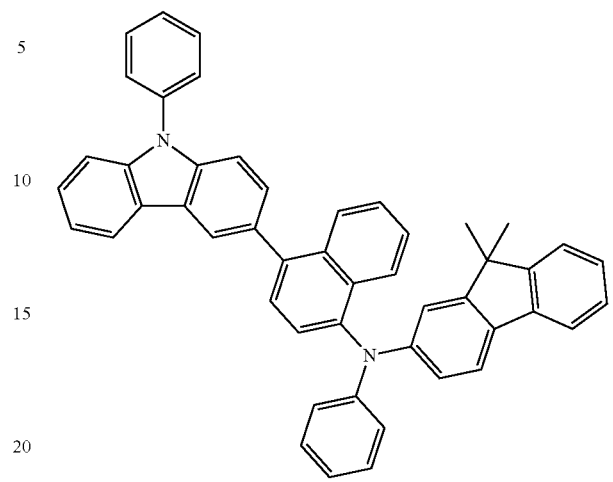
HT9
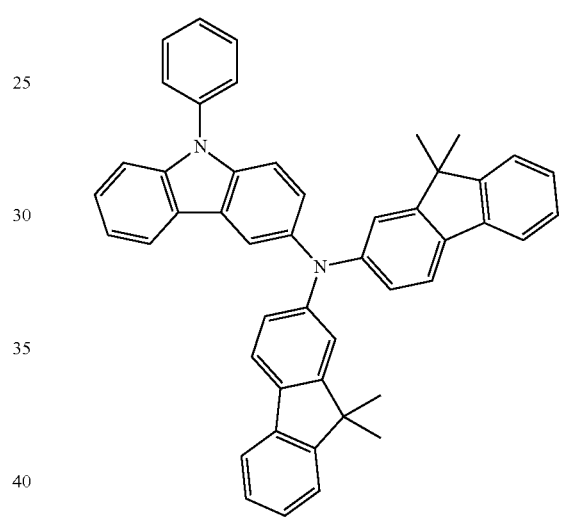
HT7
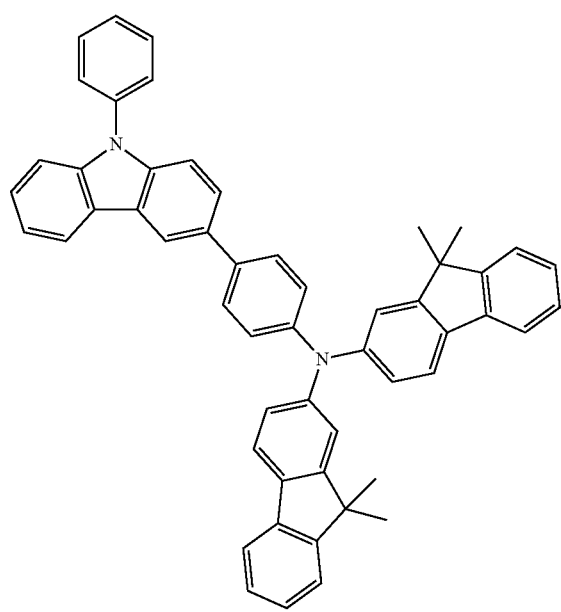
HT10
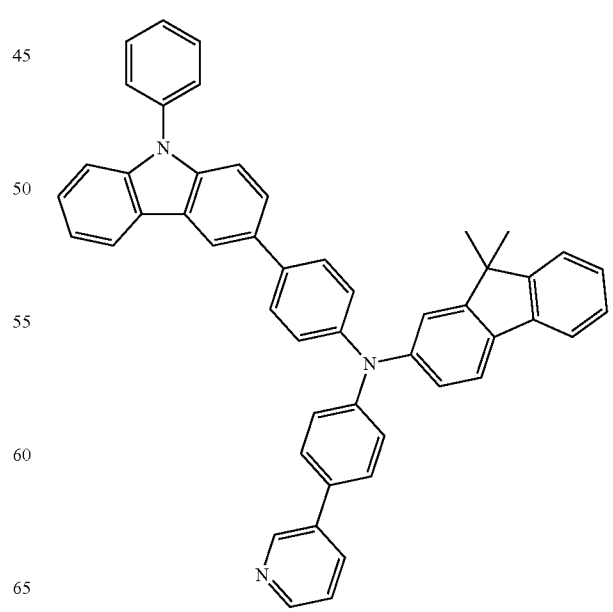

HT11
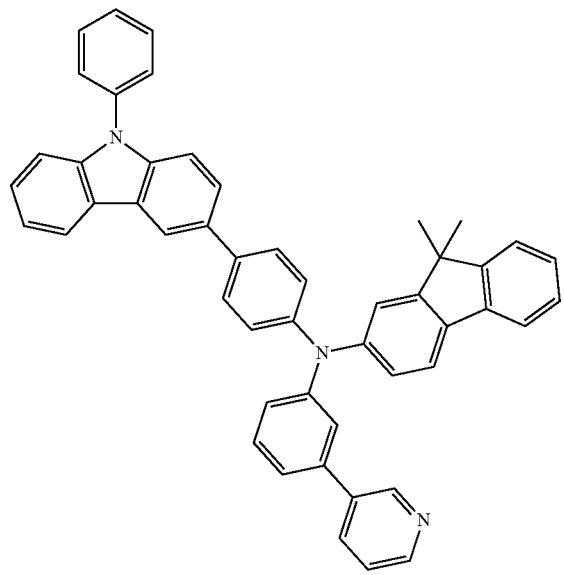
HT12
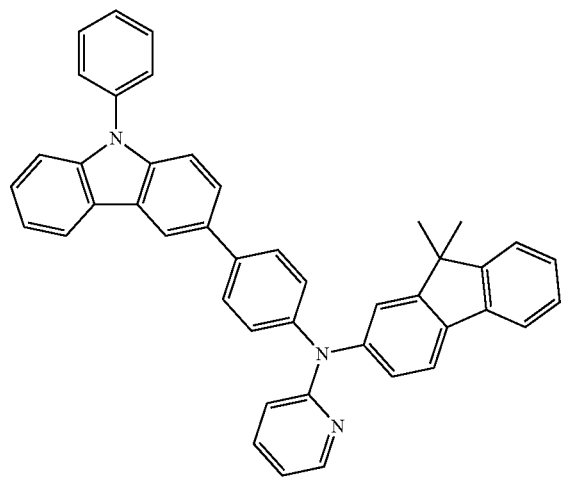
HT13
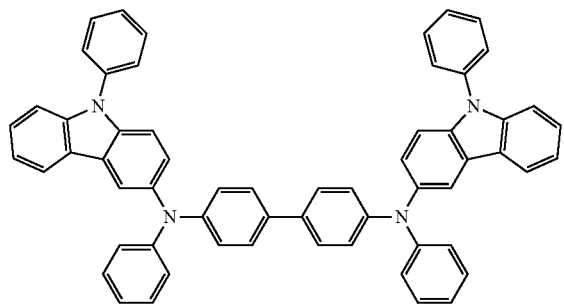
HT14
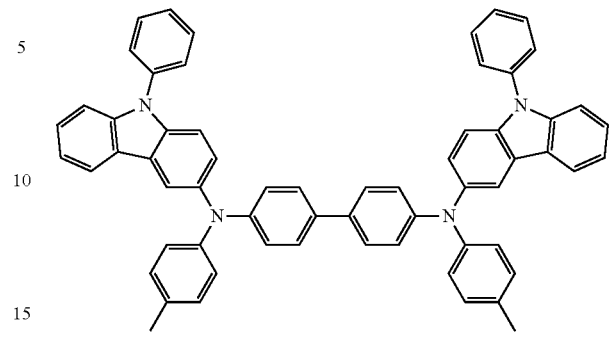
HT15
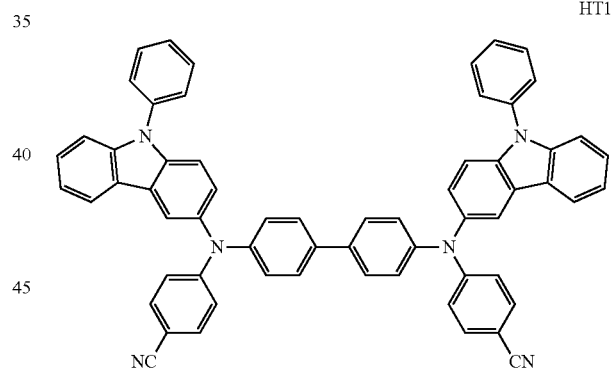
HT16
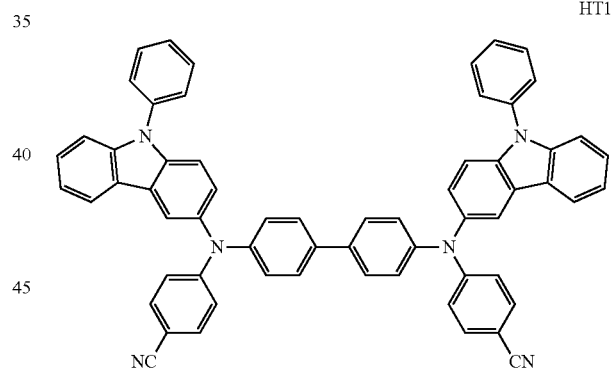
HT17
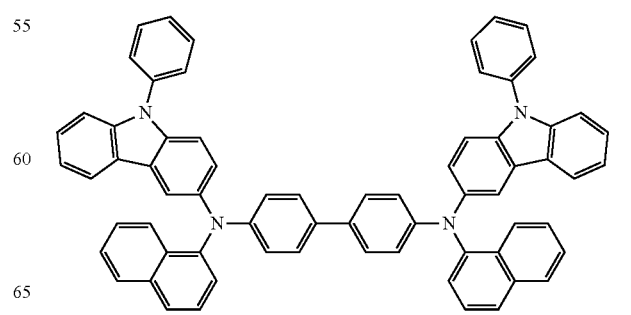

-continued

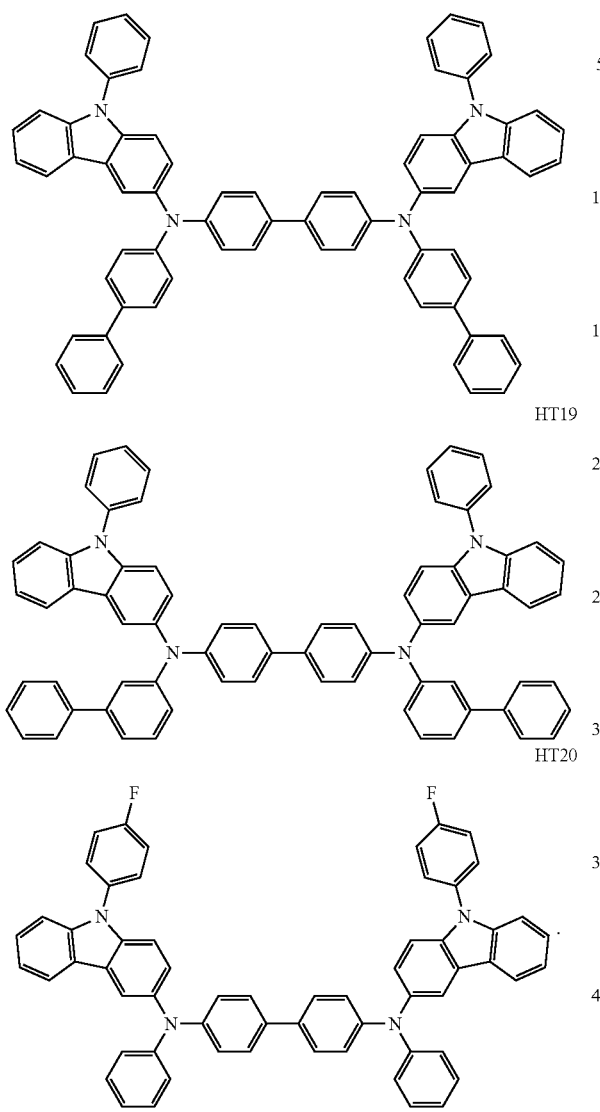

The thickness of the hole transport region may be in a range of about 100 Angstroms (Å) to about 10,000 Å, for example, about 100 Å to about 1,000 Å. When the hole transport region includes at least one selected from a hole injection layer and a hole transport layer, the thickness of the hole injection layer may be in a range of about 100 Å to about 10,000 Å, for example, about 100 Å to about 1,000 Å, and the thickness of the hole transport layer may be in a range of about 50 Å to about 2,000 Å, for example, about 100 Å to about 1,500 Å. While not wishing to be bound by theory, it is understood that when the thicknesses of the hole transport region, the hole injection layer, and the hole transport layer are within any of these ranges, excellent hole transporting characteristics may be obtained without a substantial increase in driving voltage.

The hole transport region may include a charge generating material as well as the aforementioned materials, to improve conductive properties of the hole transport region. The charge generating material may be substantially homogeneously or non-homogeneously dispersed in the hole transport region.

The charge generating material may include, for example, a p-dopant. The p-dopant may be selected from a quinone derivative, a metal oxide, and a cyano group-containing compound, but embodiments are not limited thereto. For example, non-limiting examples of the p-dopant include a quinone derivative, such as tetracyanoquinodimethane (TCNQ) or 2,3,5,6-tetrafluoro-tetracyano-1,4-benzoquinonedimethane (F4-TCNQ); a metal oxide, such as a tungsten oxide or a molybdenum oxide; and a compound containing a cyano group, such as Compound HT-D1, but embodiments are not limited thereto:

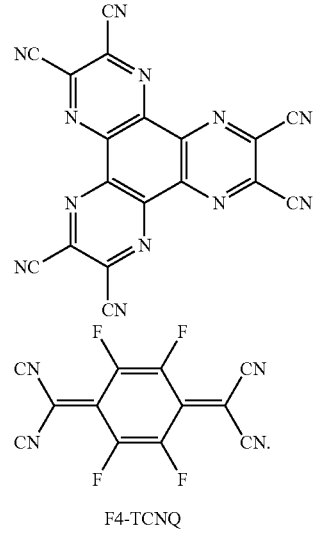

The hole transport region may further include a buffer layer.

The buffer layer may compensate for an optical resonance distance depending on a wavelength of light emitted from the emission layer to improve efficiency of an organic light-emitting device.

An emission layer may be formed on the hole transport region by using one or more suitable methods, such as vacuum deposition, spin coating, casting, or LB deposition. When the emission layer is formed by vacuum deposition or spin coating, vacuum deposition and coating conditions for the emission layer may be generally similar to the conditions for forming a hole injection layer, though the conditions may vary depending on the compound used.

When the hole transport region includes an electron blocking layer, a material for forming the electron blocking layer may be selected from the materials for forming a hole transport region and host materials described herein, but embodiments are not limited thereto. In some embodiments, when the hole transport region includes an electron blocking layer, mCP described herein may be used for forming the electron blocking layer.

The emission layer may include a host and a dopant, and the dopant may include the organometallic compound represented by Formula 1.

The host may include at least one selected from TPBi, TBADN, ADN (also known as "DNA"), CBP, CDBP, TCP, mCP, Compound H50, and Compound H51:

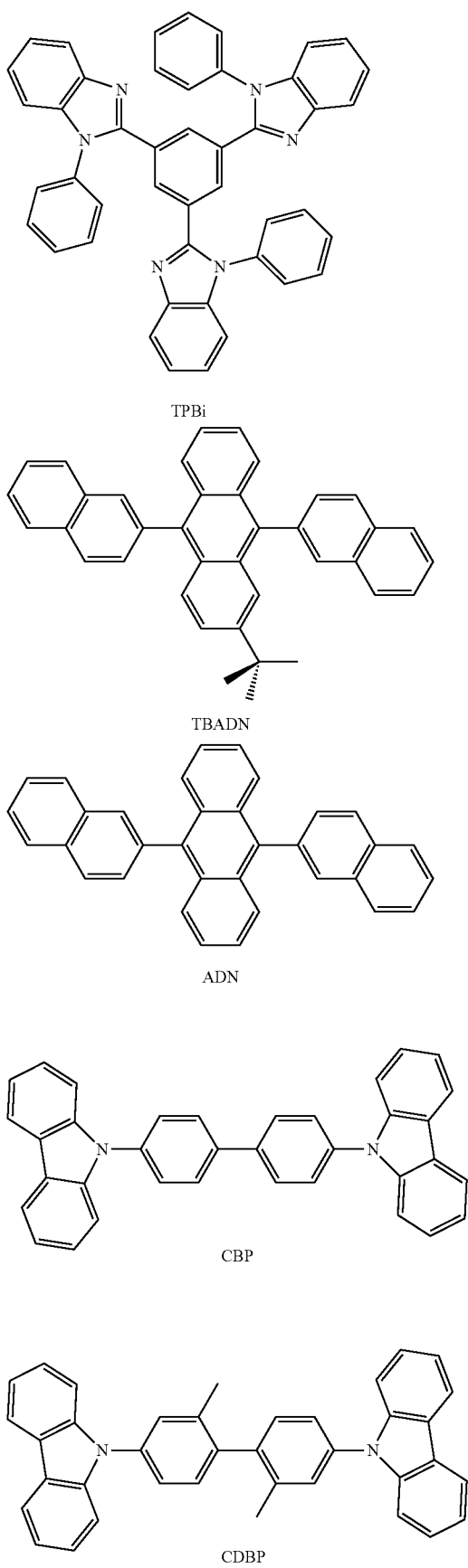
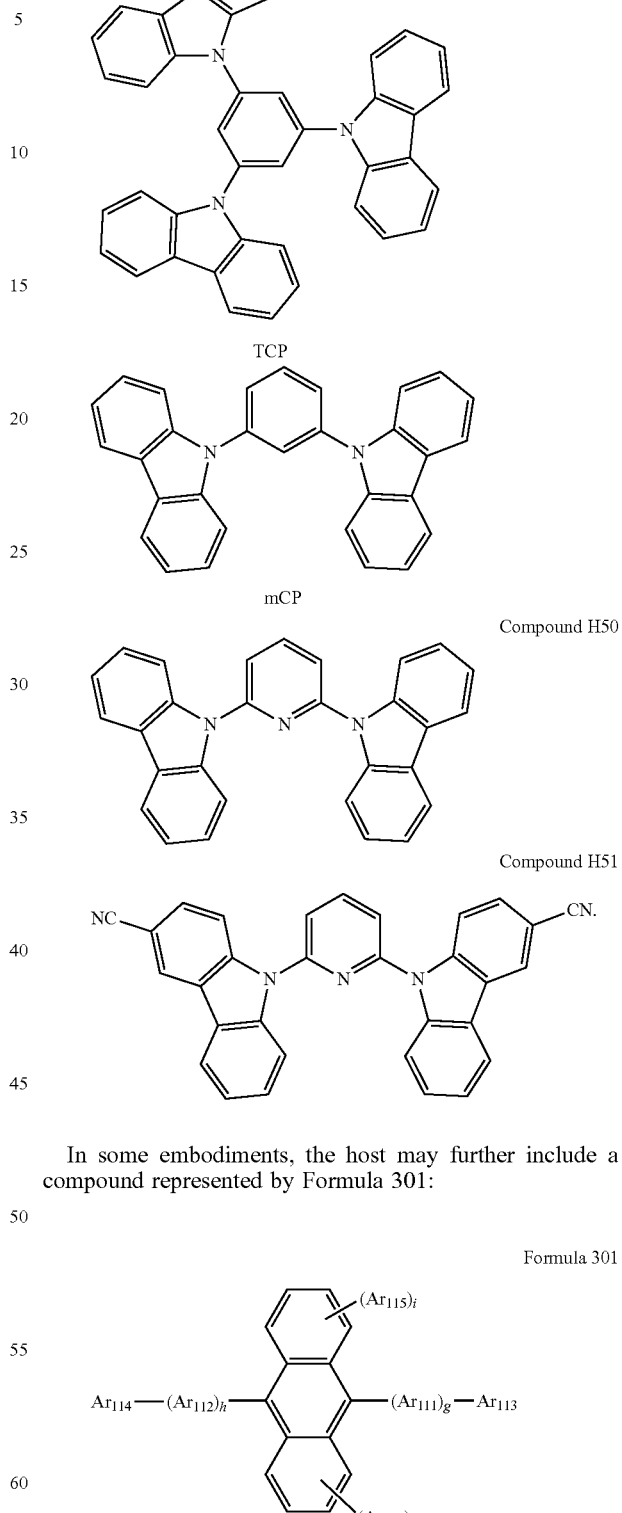
In some embodiments, the host may further include a compound represented by Formula 301:
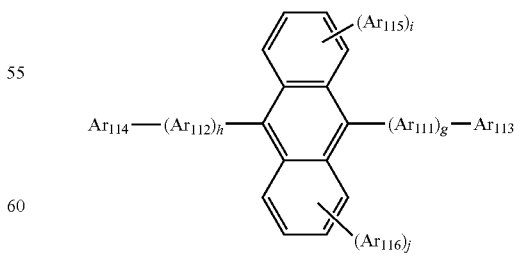
Formula 301
wherein, in Formula 301, $AR_{111}$ and $Ar_{112}$ may each independently be selected from
a phenylene group, a naphthylene group, a phenanthrenylene group, and a pyrenylene group; and a phenyl group, a phenylene group substituted with at least one selected from a naphthyl group and an anthracenyl group, a naphthylene group, a phenanthrenylene group, and a pyrenylene group.

In Formula 301, $Ar_{113}$ to $Ar_{116}$ may each independently be selected from a $C_1$-$C_{10}$ alkyl group, a phenyl group, a naphthyl group, a phenanthrenyl group, and a pyrenyl group; and a phenyl group, a phenyl group substituted with at least one selected from a naphthyl group and an anthracenyl group, a naphthyl group, a phenanthrenyl group, and a pyrenyl group.

In Formula 301, g, h, i, and j may each independently be an integer from 0 to 4. For example, g, h, i, and j may each independently be 0, 1, or 2.

In Formula 301, $Ar_{113}$ and $Ar_{116}$ may each independently be selected from a $C_1$-$C_{10}$ alkyl group substituted with at least one selected from a phenyl group, a naphthyl group, and an anthracenyl group;

a phenyl group, a naphthyl group, an anthracenyl group, a pyrenyl group, a phenanthrenyl group, and a fluorenyl group; and a phenyl group, a naphthyl group, an anthracenyl group, a pyrenyl group, a phenanthrenyl group, and a fluorenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a pyrenyl group, a phenanthrenyl group, a fluorenyl group, and

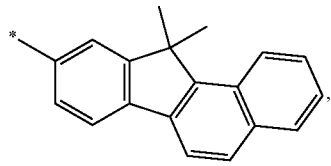 [SMILES: Cc1ccc2c(c1)C(C)(C)c1c-2ccc2ccccc12]

but embodiments are not limited thereto.

In some embodiments, the host may include a compound represented by Formula 302:

Formula 302

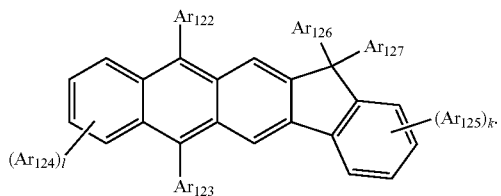

In Formula 302, $Ar_{122}$ to $Ar_{125}$ may each independently be substantially the same as $Ar_{113}$ described with reference to Formula 301.

In Formula 302, $Ar_{126}$ and $Ar_{127}$ may each independently be a $C_1$-$C_{10}$ alkyl group (e.g., a methyl group, an ethyl group, or a propyl group).

In Formula 302, k and l may each independently be an integer from 0 to 4. In some embodiments, k and l may each be 0, 1, or 2.

In some embodiments, the compounds represented by Formulae 301 and 302 may each include at least one of Compounds H1 to H42, but embodiments are not limited thereto:

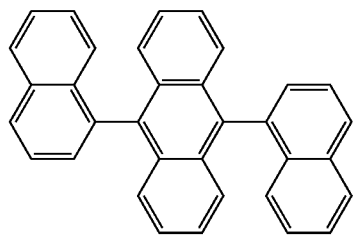

H1

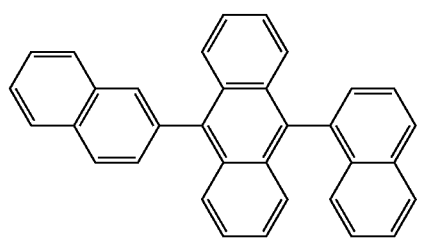

H2

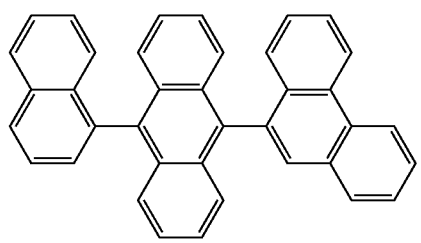

H3

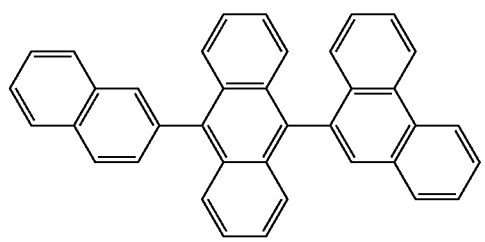

H4

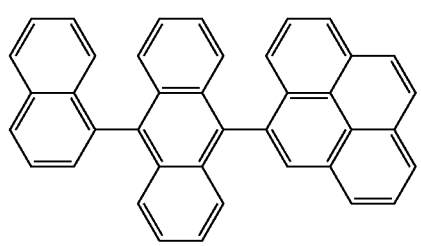

H5

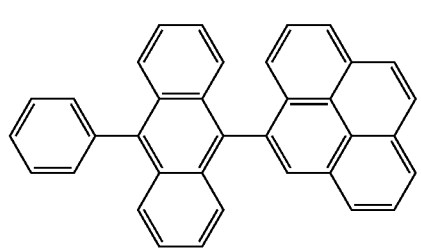

H6

H7
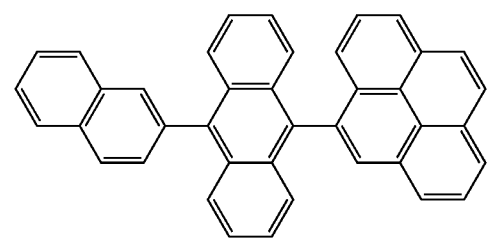
H8
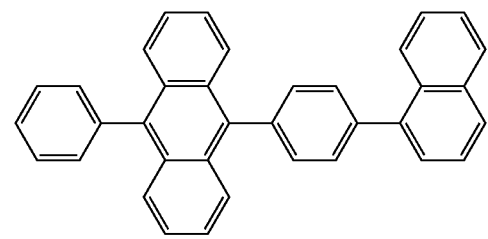
H9
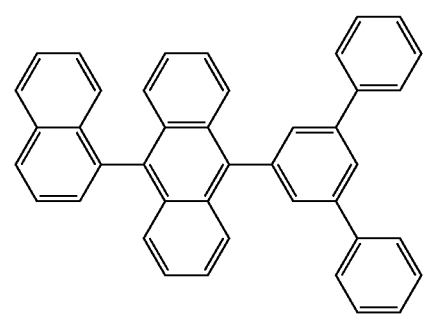
H10
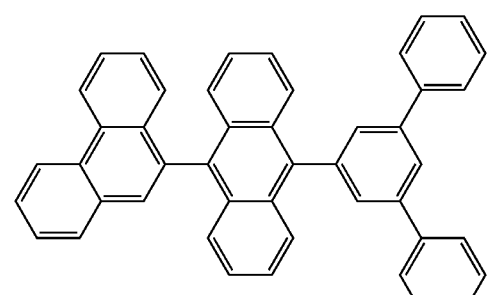
H11
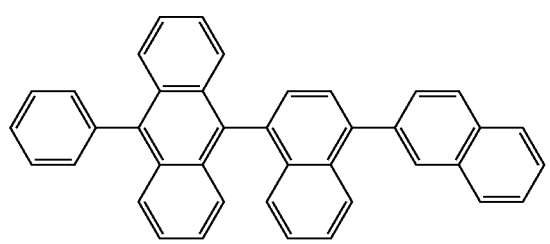
H12
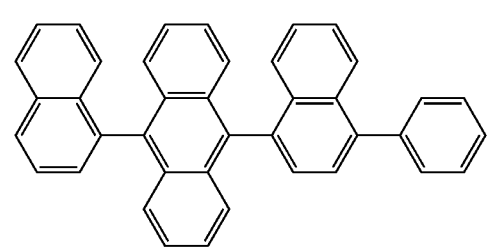
H13
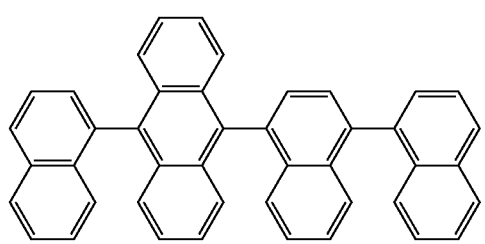
H14
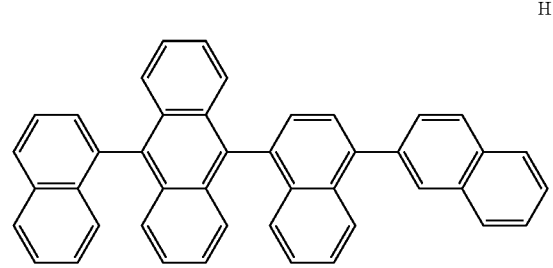
H15
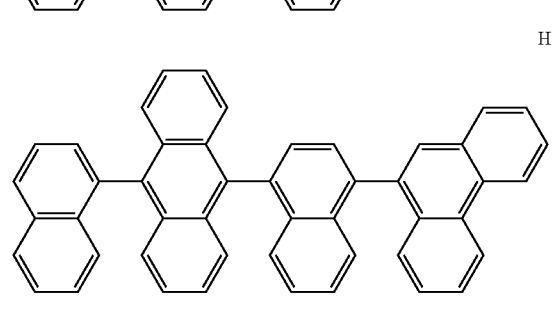
H16
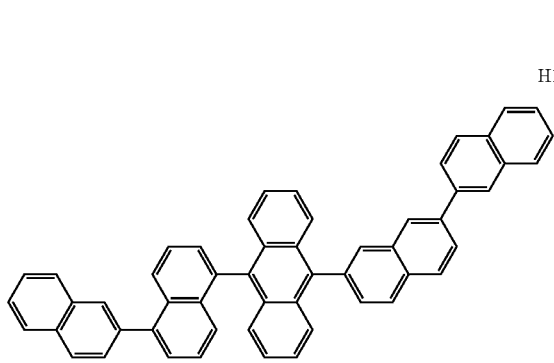
H17

H18
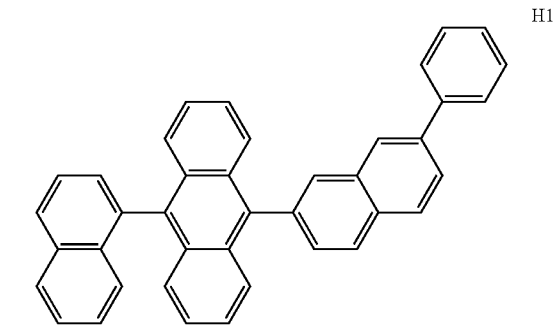
H19
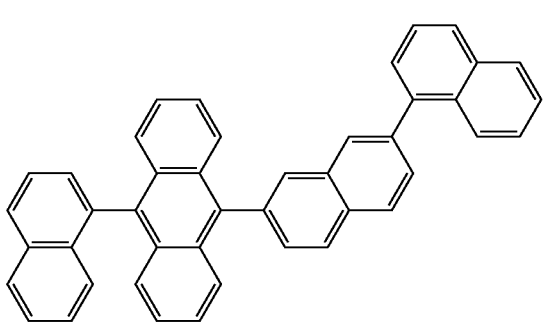
H20
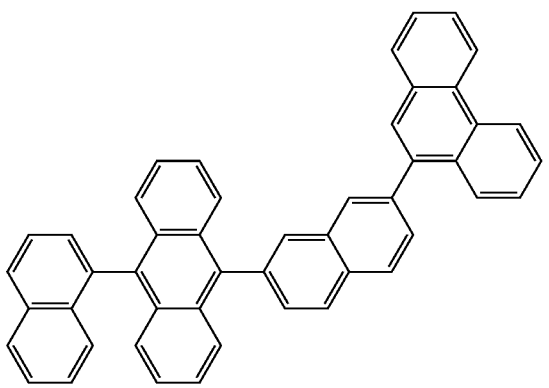
H21
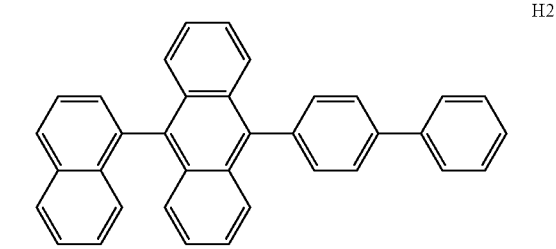
H22
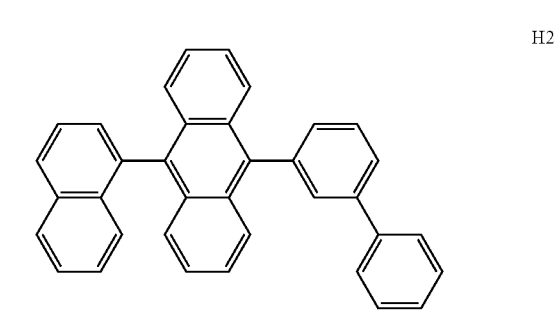
H23
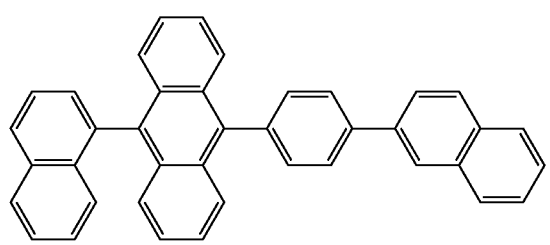
H24
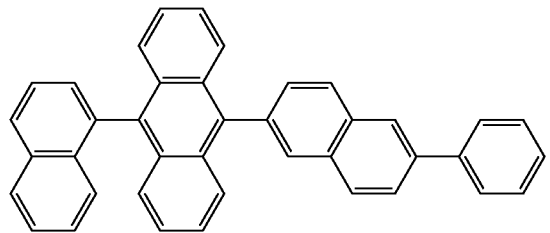
H25
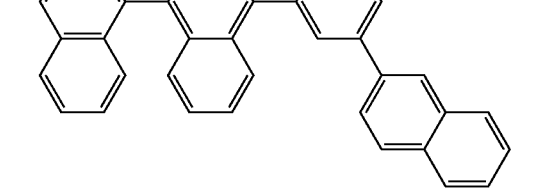
H26
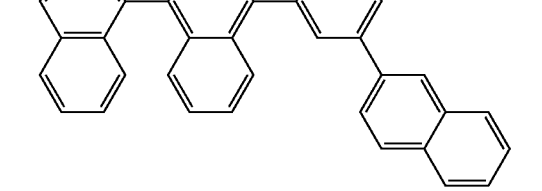
H27
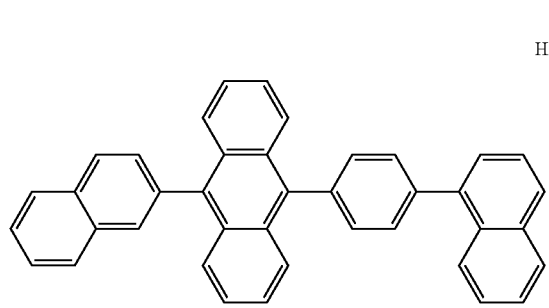

H28
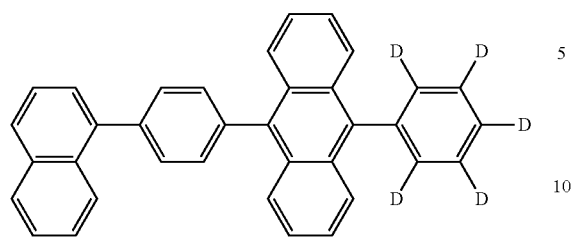
H29
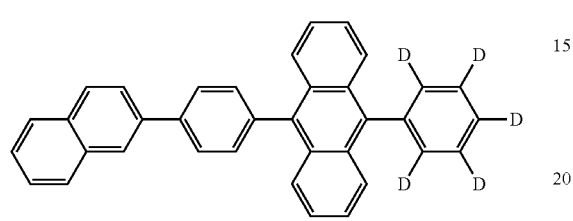
H30
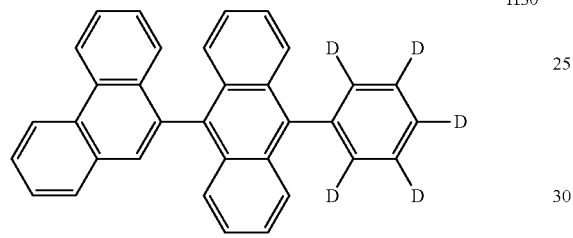
H31
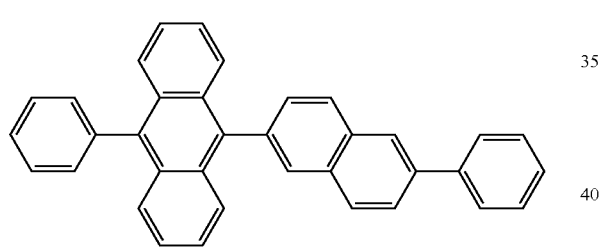
H32
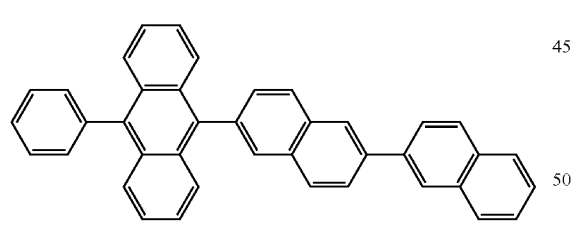
H33
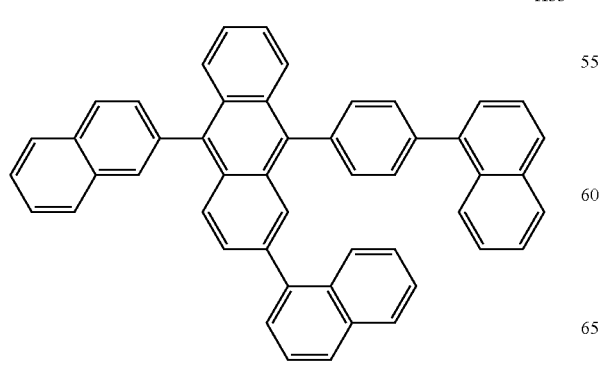
H34
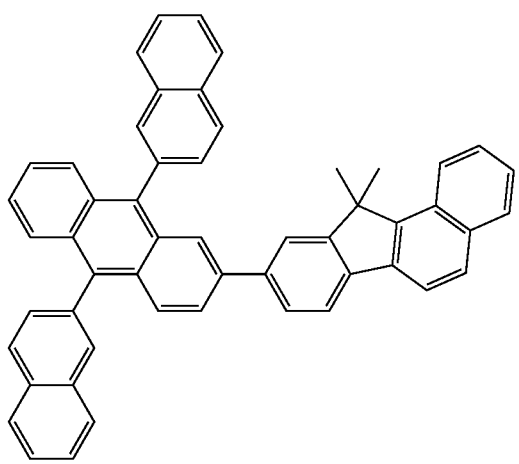
H35
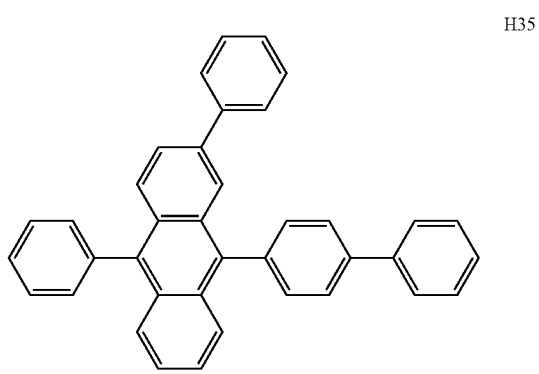
H36
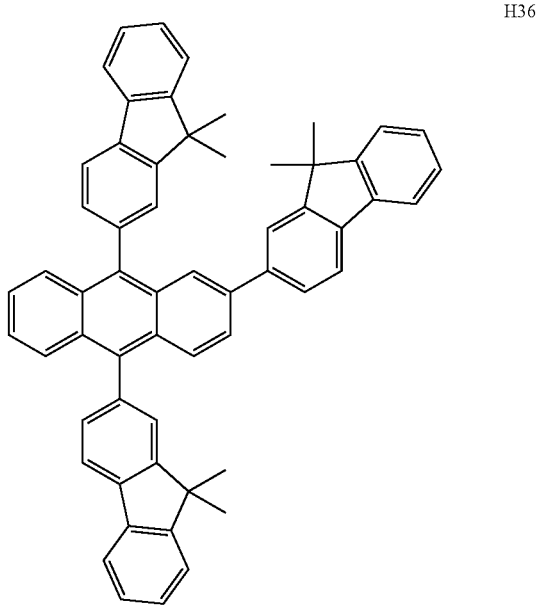

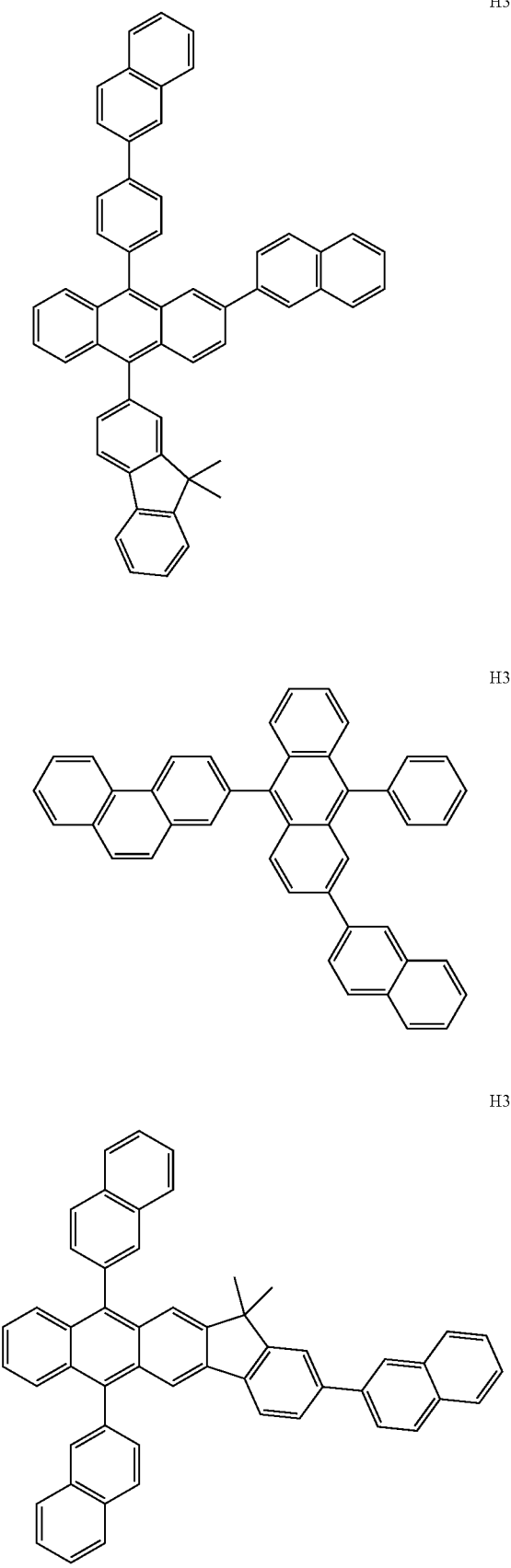
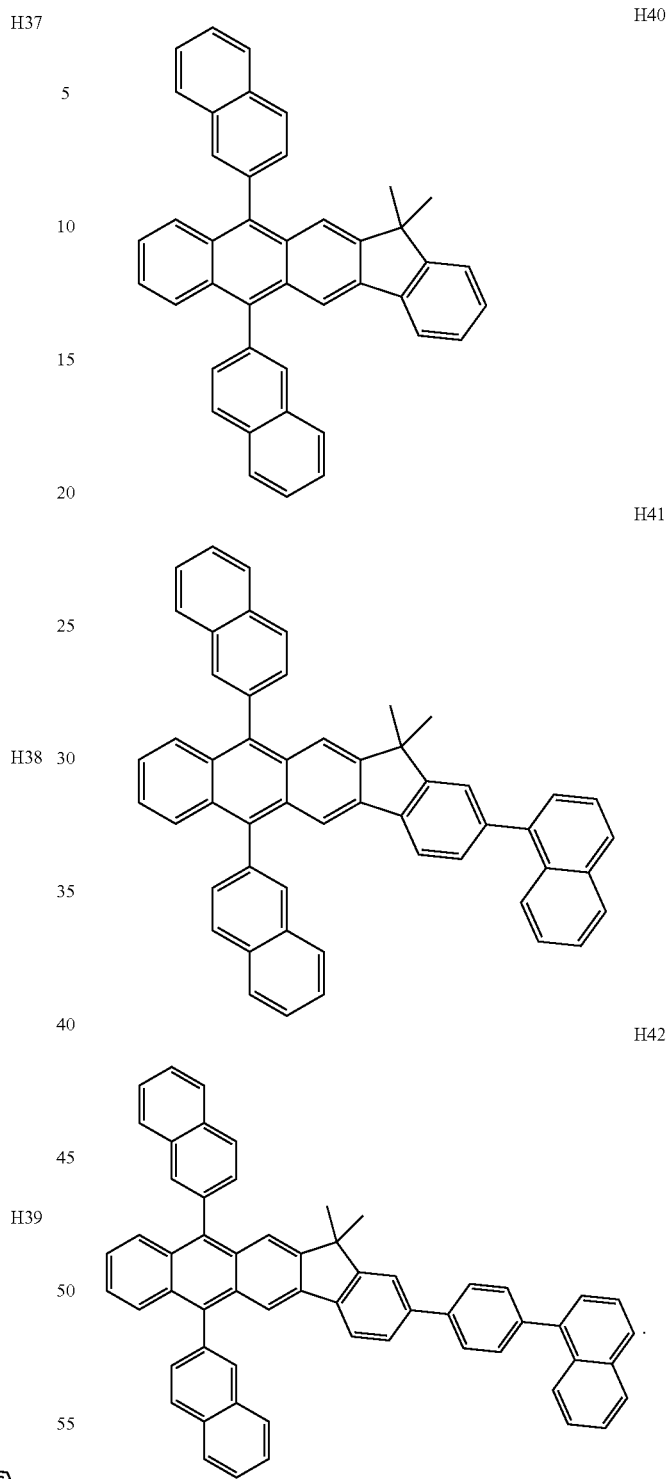

When the organic light-emitting device 10 is a full-color organic light-emitting device, the emission layer may be patterned into a red emission layer, a green emission layer, and a blue emission layer. In some embodiments, the emission layer may have a structure in which the red emission layer, the green emission layer, and/or the blue emission layer are layered so as to emit white light. In some embodiments, the structure of the emission layer may vary.

When the emission layer includes the host and the dopant, an amount of the dopant may be selected from a range of about 0.01 parts to about 15 parts by weight based on about 100 parts by weight of the host, but embodiments are not limited thereto.

The thickness of the emission layer may be in a range of about 100 Å to about 1,000 Å, and in some embodiments, about 200 Å to about 600 Å. While not wishing to be bound by theory, it is understood that when the thickness of the emission layer is within any of these ranges, improved luminous characteristics may be obtained without a substantial increase in driving voltage.

Next, an electron transport region may be formed on the emission layer.

The electron transport region may include a hole blocking layer, an electron transport layer, an electron injection layer, or a combination thereof.

In some embodiments, the electron transport region may have a hole blocking layer/electron transport layer/electron injection layer structure or an electron transport layer/electron injection layer structure, but embodiments are not limited thereto. The electron transport layer may have a single-layered structure or a multi-layered structure including two or more different materials.

The conditions for forming a hole blocking layer, an electron transport layer, and an electron injection layer may be inferred from the conditions for forming the hole injection layer.

When the electron transport region includes a hole blocking layer, the hole blocking layer may include, for example, at least one selected from BCP, Bphen, and BAlq, but embodiments are not limited thereto:

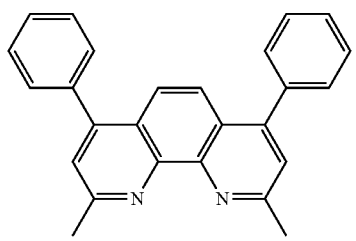

BCP

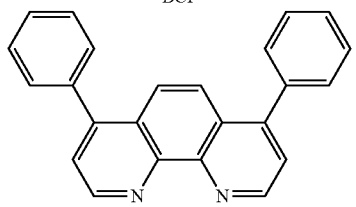

Bphen

The thickness of the hole blocking layer may be in a range of about 20 Å to about 1,000 Å, for example, about 30 Å to about 300 Å. While not wishing to be bound by theory, it is understood that when the thickness of the hole blocking layer is within these ranges, excellent hole blocking characteristics may be obtained without a substantial increase in driving voltage.

The electron transport layer may further include at least one selected from BCP, Bphen, Alq$_3$, BAlq, TAZ, and NTAZ:

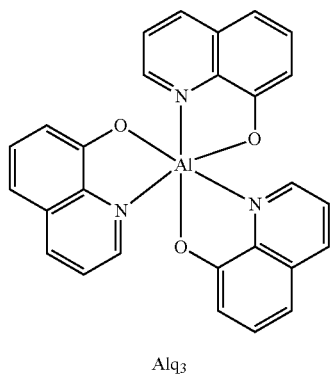

Alq$_3$

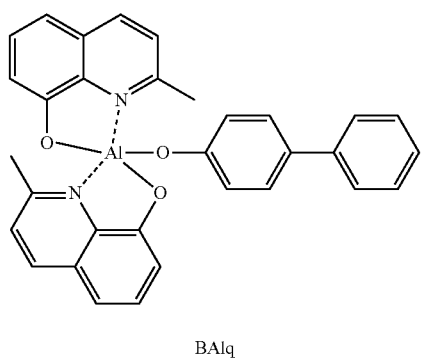

BAlq

TAZ

NTAZ

In some embodiments, the electron transport layer may include at least one selected from Compounds ET1 and ET2, but embodiments are not limited thereto:

ET1

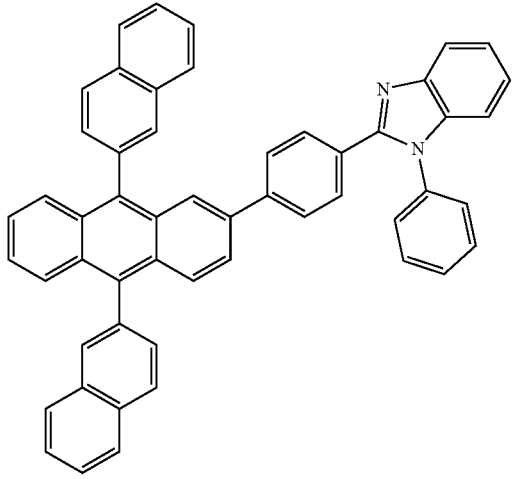

ET2

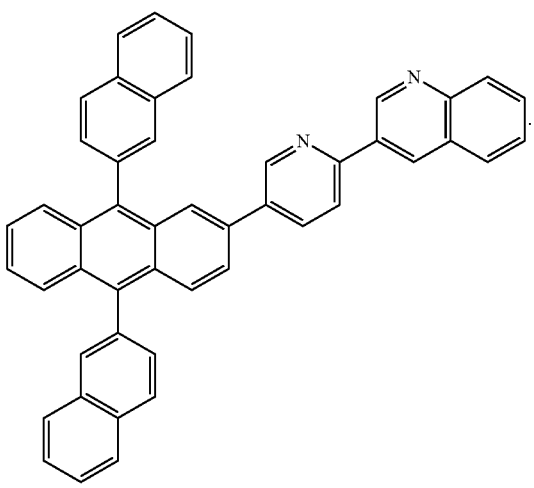

ET-D2

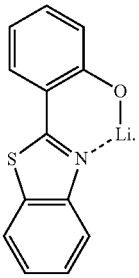

The electron transport region may include an electron injection layer that facilitates electron injection from the second electrode 19.

The electron injection layer may include at least one selected from, LiF, NaCl, CsF, $Li_2O$, and BaO.

The thickness of the electron injection layer may be in a range of about 1 Å to about 100 Å, and in some embodiments, about 3 Å to about 90 Å. While not wishing to be bound by theory, it is understood that when the thickness of the electron injection layer is within any of these ranges, excellent electron injection characteristics may be obtained without a substantial increase in driving voltage.

The second electrode 19 may be formed on the organic layer 15. The second electrode 19 may be a cathode. A material for forming the second electrode 19 may be a material with a relatively low work function, such as a metal, an alloy, an electrically conductive compound, or a mixture thereof. Examples of the material for forming the second electrode 19 may include lithium (Li), magnesium (Mg), aluminum (Al), aluminum-lithium (Al—Li), calcium (Ca), magnesium-indium (Mg—In), and magnesium-silver (Mg—Ag). In some embodiments, ITO or IZO may be used to form a transmissive second electrode 19 to manufacture a top-emission light-emitting device. In some embodiments, the material for forming the second electrode 19 may vary.

Hereinbefore the organic light-emitting device 10 has been described with reference to the FIGURE, but embodiments are not limited thereto.

According to an aspect of another embodiment, there is provided a diagnostic composition that includes at least one organometallic compound represented by Formula 1.

Since the organometallic compound represented by Formula 1 may provide high emission efficiency, the diagnostic efficiency of the diagnostic composition that includes the organometallic compound represented by Formula 1 may be excellent.

The diagnostic composition may be applied in various ways, such as in a diagnostic kit, a diagnostic reagent, a biosensor, or a biomarker.

The thickness of the electron transport layer may be in a range of about 100 Å to about 1,000 Å, and in some embodiments, about 150 Å to about 500 ÅA. While not wishing to be bound by theory, it is understood that when the thickness of the electron transport layer is within any of these ranges, excellent electron transport characteristics may be obtained without a substantial increase in driving voltage.

The electron transport layer may further include a material including metal, in addition to the materials described above.

The material including metal may include a lithium (Li) complex. The Li complex may include, e.g., Compound ET-D1 (lithium quinolate, LiQ) or Compound ET-D2:

ET-D1

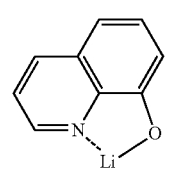

The terms "a thienopyridine group, a furopyridine group, a cyclopentapyridine group, a pyrrolopyridine group, a silolopyridine group, a benzothienopyridine group, a benzofuropyridine group, an indenopyridine group, an indolopyridine group, and a benzosilolopyridine group", as used herein, may each have the same backbone as "a benzothiophene group, a benzofuran group, an indene group, an indole group, a benzosilole group, a dibenzothiophene group, a dibenzofuran group, a fluorene group, a carbazole group, and a dibenzosilole group", respectively, each having a heterocyclic ring in which a ring-forming carbon atom is substituted with nitrogen atom.

The terms "a thienopyrimidine group, a furopyrimidine group, a cyclopentapyrimidine group, a pyrrolopyrimidine group, a silolopyrimidine group, a benzothienopyrimidine group, a benzofuropyrimidine group, an indenopyrimidine group, an indolopyrimidine group, and a benzosilolopyrimidine group", as used herein, may each have the same backbone as "a benzothiophene group, a benzofuran group, an indene group, an indole group, a benzosilole group, a dibenzothiophene group, a dibenzofuran group, a fluorene group, a carbazole group, and a dibenzosilole group", respectively, each having a heterocyclic ring in which two ring-forming carbon atoms are substituted with nitrogen atoms.

The term "$C_1$-$C_{60}$ alkyl group" as used herein refers to a linear or branched saturated aliphatic hydrocarbon monovalent group having 1 to 60 carbon atoms. Examples thereof include a methyl group, an ethyl group, a propyl group, an iso-butyl group, a sec-butyl group, a tert-butyl group, a pentyl group, an iso-amyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is a $C_1$-$C_{60}$ alkyl group). Examples thereof include a methoxy group, an ethoxy group, and an iso-propyloxy (iso-propoxy) group.

The term "$C_2$-$C_{60}$ alkenyl group" as used herein refers to a group formed by placing at least one carbon-carbon double bond in the middle or at the terminus of the $C_2$-$C_{60}$ alkyl group. Examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a group formed by placing at least one carbon-carbon triple bond in the middle or at the terminus of the $C_2$-$C_{60}$ alkyl group. Examples thereof include an ethenyl group and a propenyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent monocyclic saturated hydrocarbon group including 3 to 10 carbon atoms. Examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent monocyclic group including at least one heteroatom selected from N, O, P, Si, and S as a ring-forming atom, and 1 to 10 carbon atoms. Examples thereof include a tetrahydrofuranyl group and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in its ring, wherein the molecular structure as a whole is non-aromatic. Examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group including at least one heteroatom selected from N, O, P, Si, and S as a ring-forming atom, 1 to 10 carbon atoms, and at least one double bond in its ring. Examples of the $C_1$-$C_{10}$ heterocycloalkenyl group include a 2,3-dihydrofuranyl group and a 2,3-dihydrothiophenyl group. The term "$C_1$-$C_{10}$ heterocycloalkylene group" as used herein refers to a divalent group having the same structure as the $C_1$-$C_{10}$ heterocycloalkyl group.

The term "$C_6$-$C_{60}$ aryl group" as used herein refers to a monovalent group having a carbocyclic aromatic system having 6 to 60 carbon atoms. The term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include a plurality of rings, the plurality of rings may be fused to each other.

The term "$C_1$-$C_{60}$ heteroaryl group" as used herein refers to a monovalent group having a cyclic aromatic system having at least one heteroatom selected from N, O, P, Si, and S as a ring-forming atom, and 1 to 60 carbon atoms. The term "$C_1$-$C_{60}$ heteroarylene group" as used herein refers to a divalent group having a cyclic aromatic system having at least one heteroatom selected from N, O, P, Si, and S as a ring-forming atom, and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include a plurality of rings, the plurality of rings may be fused to each other.

The term "$C_6$-$C_{60}$ aryloxy group" as used herein indicates —$OA_{102}$ (wherein $A_{102}$ is a $C_6$-$C_{60}$ aryl group), and a $C_6$-$C_{60}$ arylthio group as used herein indicates —$SA_{103}$ (wherein $A_{103}$ is a $C_6$-$C_{60}$ aryl group).

The term "monovalent non-aromatic condensed polycyclic group" as used herein refers to a monovalent group that has two or more condensed rings and only carbon atoms (e.g., the number of carbon atoms may be in a range of 8 to 60) as ring-forming atoms, wherein the molecular structure as a whole is non-aromatic. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group that has two or more condensed rings and a heteroatom selected from N, O, P, Si, and S, and carbon atoms (e.g., the number of carbon atoms may be in a range of 1 to 60), as ring-forming atoms, wherein the molecular structure as a whole is non-aromatic. The monovalent non-aromatic condensed heteropolycyclic group may include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group including 5 to 30 carbon atoms only as ring-forming atoms. The $C_5$-$C_{30}$ carbocyclic group may be a monocyclic group or a polycyclic group.

The term "$C_1$-$C_{30}$ heterocyclic group" as used herein refers to saturated or unsaturated cyclic group including 1 to 30 carbon atoms and at least one heteroatom selected from N, O, P, Si, and S as ring-forming atoms. The $C_1$-$C_{30}$ heterocyclic group may be a monocyclic group or a polycyclic group.

At least one substituent of the substituted $C_5$-$C_{30}$ carbocyclic group, substituted $C_1$-$C_{30}$ heterocyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group may be selected from:

deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N(Q$_{11}$)(Q$_{12}$), —Si(Q$_{13}$)(Q$_{14}$)(Q$_{15}$), —B(Q$_{16}$)(Q$_{17}$), and —P(=O)(Q$_{18}$)(Q$_{19}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N(Q$_{21}$)(Q$_{22}$), —Si(Q$_{23}$)(Q$_{24}$)(Q$_{25}$), —B(Q$_{26}$)(Q$_{27}$), and —P(=O)(Q$_{28}$)(Q$_{29}$); and —N(Q$_{31}$)(Q$_{32}$), —Si(Q$_{33}$)(Q$_{34}$)(Q$_{35}$), —B(Q$_{36}$)(Q$_{37}$), and —P(=O)(Q$_{38}$)(Q$_{39}$), wherein $Q_1$ to $Q_9$, $Q_{11}$ to $Q_{19}$, $Q_{21}$ to $Q_{29}$, and $Q_{31}$ to $Q_{39}$ may each independently be selected from hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group; a $C_1$-$C_{60}$ alkyl group substituted with at least one of deuterium, a $C_1$-$C_{60}$ alkyl group, and a $C_6$-$C_{60}$ aryl group; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group; a $C_6$-$C_{60}$ aryl group substituted with at least one of deuterium, a $C_1$-$C_{60}$ alkyl group, and a $C_6$-$C_{60}$ aryl group; a $C_6$-$C_{60}$ aryloxy group; a $C_6$-$C_{60}$ arylthio group; a $C_1$-$C_{60}$ heteroaryl group; a monovalent non-aromatic condensed polycyclic group; and a monovalent non-aromatic condensed heteropolycyclic group.

When a group containing a specified number of carbon atoms is substituted with any of the groups listed in the preceding paragraph, the number of carbon atoms in the resulting "substituted" group is defined as the sum of the carbon atoms contained in the original (unsubstituted) group and the carbon atoms (if any) contained in the substituent. For example, when the term "substituted $C_1$-$C_{30}$ alkyl" refers to a $C_1$-$C_{30}$ alkyl group substituted with $C_6$-$C_{30}$ aryl group, the total number of carbon atoms in the resulting aryl substituted alkyl group is $C_7$-$C_{60}$.

Hereinafter, a compound and an organic light-emitting device according to an embodiment will be described in detail with reference to Synthesis Examples and Examples, however, the present disclosure is not limited thereto. The wording "B was used instead of A" used in describing Synthesis Examples means that an identical molar equivalent of B was used in place of A.

EXAMPLES

Synthesis Example 1

Synthesis of Compound 5

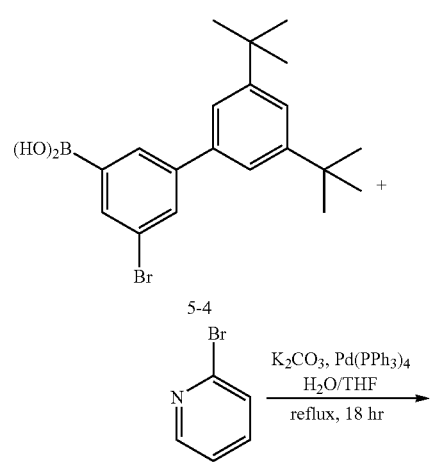

-continued

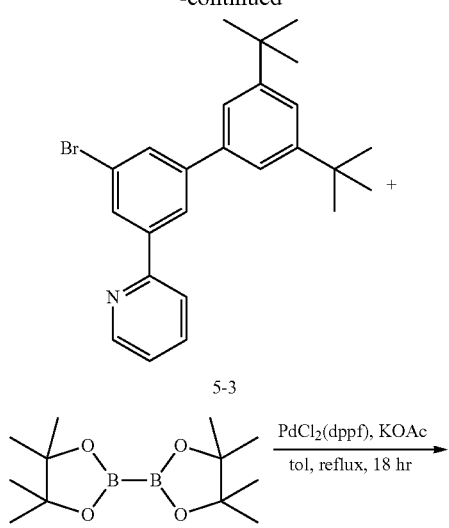
5-3

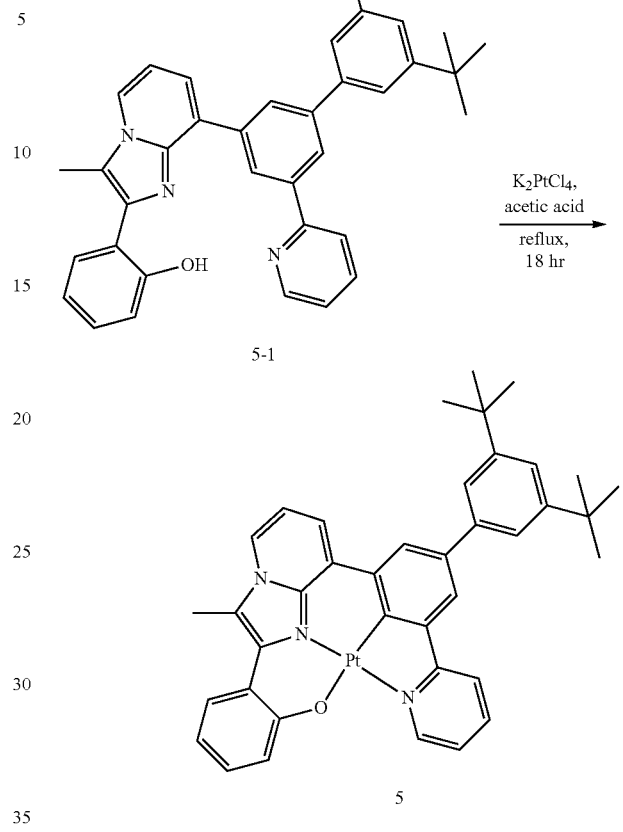
5-1

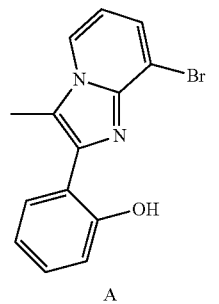
A

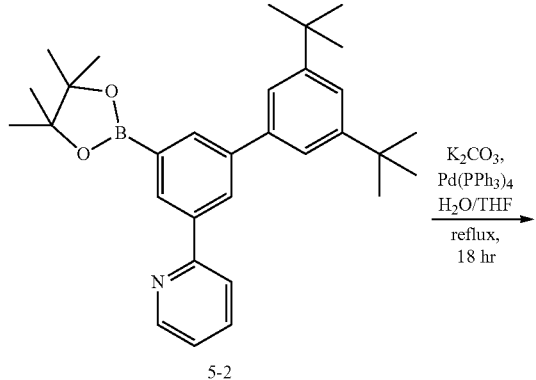
5-2

1) Synthesis of Intermediate 5-3

2 grams (g) (12.74 millimoles, mmol) of 2-bromopyridine, 5.9 g (15.29 mmol) of Compound 5-4, 4.4 g (31.86 mmol) of $K_2CO_3$, 1.0 g (0.89 mmol) of $Pd(PPh_3)_4$, 85 milliliters (mL) of THF, and 42.5 mL of $H_2O$ were added to a reaction vessel, and the mixture was stirred under reflux at a temperature of 80° C. for 16 hours. The reaction mixture was cooled to room temperature, and the organic layer was extracted therefrom using 400 mL of water and 400 mL of ethyl acetate. The organic layer was dried over $MgSO_4$, and the solvent was removed therefrom by evaporation. The resulting residue was then separated and purified through silica gel chromatography to obtain 3.9 g of Intermediate 5-3 (yield: 72%). The compound thus obtained was identified by using liquid chromatography-mass spectrometry (LC-MS).

$C_{25}H_{28}BrN$: $M^+$=421.14

2) Synthesis of Intermediate 5-2

3.9 g (9.17 mmol) of Intermediate 5-3, 3.5 g (13.75 mmol) of bis(pinacolato)diboron, 1.7 g (18.33 mmol) of potassium acetate, 0.37 g (0.46 mmol) of $Pd(PPh_3)_2Cl_2$, and 45 mL of toluene were added to a reaction vessel, and the mixture was stirred under reflux at a temperature of 120° C. for 8 hours. The reaction mixture was cooled to room temperature, and the organic layer was extracted therefrom using 300 mL of water and 300 mL of ethyl acetate. The organic layer was dried over $MgSO_4$, and the solvent was removed therefrom by evaporation. The resulting residue was then separated and purified through silica gel chromatography to obtain 3.2 g of Intermediate 5-2 (yield: 75%). The compound thus obtained was identified by using LC-MS.

$C_{31}H_{40}BNO_2$: $M^+$=469.32

3) Synthesis of Intermediate 5-1

3.2 g (15.8 mmol) of Intermediate 5-2, 3.2 g (6.9 mmol) of Intermediate A, 1.9 g (14.32 mmol) of $K_2CO_3$, 0.46 g (0.4 mmol) of $Pd(PPh_3)_4$, 40 mL of THF, and 20 mL of $H_2O$ were added to a reaction vessel, and the mixture was stirred under reflux at a temperature of 80° C. for 16 hours. The reaction mixture was cooled to room temperature, and the organic layer was extracted therefrom using 300 mL of water and 300 mL of ethyl acetate. The organic layer was dried over $MgSO_4$, and the solvent was removed therefrom by evaporation. The resulting residue was then separated and purified through silica gel chromatography to obtain 2.9 g of Intermediate 5-1 (yield: 75%). The compound thus obtained was identified by using LC-MS.

$C_{39}H_{39}N_3O$: $M^+=565.31$

4) Synthesis of Compound 5

2.9 g (5.13 mmol) of Intermediate 5-1, 2.5 g (6.16 mmol) of potassium tetrachloroplatinate, and 120 mL of acetic acid were added to a reaction vessel, and the mixture was stirred under reflux at a temperature of 120° C. for 16 hours. The reaction mixture was cooled to room temperature, and the organic layer was extracted therefrom using sodium hydrogen carbonate and 300 mL of ethyl acetate. The organic layer was dried over $MgSO_4$, and the solvent was removed therefrom by evaporation. The resulting residue was then separated and purified through silica gel chromatography to obtain 2.1 g of Compound 5 (yield: 55%). The compound thus obtained was identified by using LC-MS.

$C_{39}H_{37}N_3OPt$: $M^+=758.26$

Synthesis Example 2

Synthesis of Compound 7

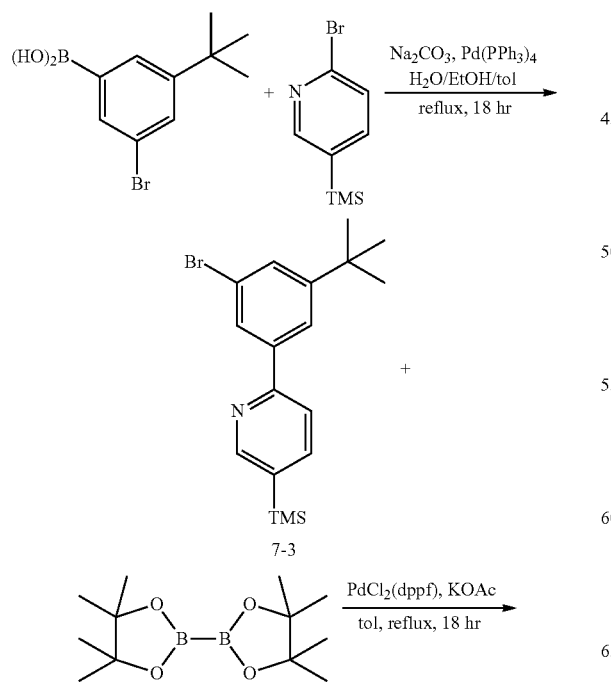

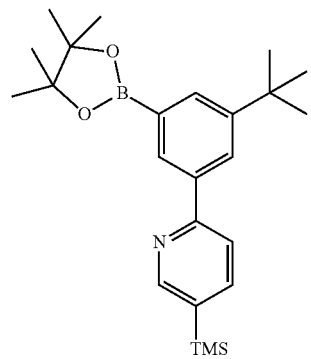

7-2

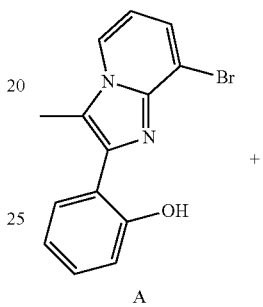

A

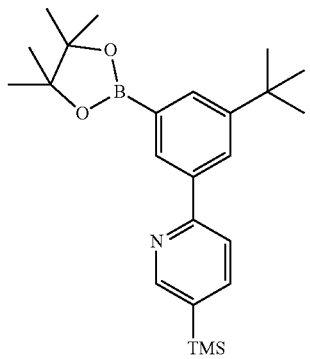

7-2

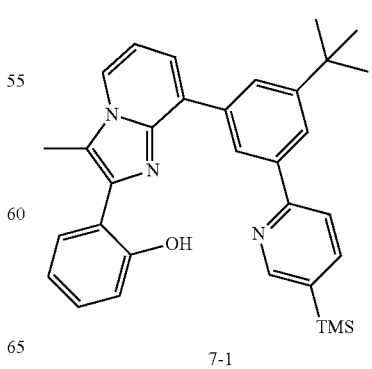

7-1

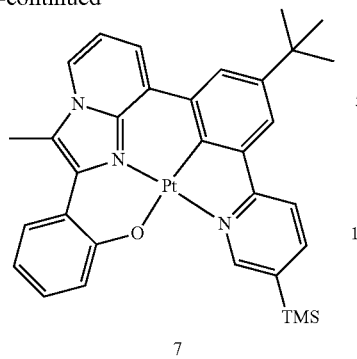

7

1) Synthesis of Intermediate 7-3

2 g (8.73 mmol) of 2-bromo-5-(trimethylsilyl)pyridine, 2.68 g (10.48 mmol) of (3-bromo-5-(tert-butyl)phenyl)boronic acid, 2.31 g (21.84 mmol) of Na$_2$CO$_3$, 0.7 g (0.07 mmol) of Pd(PPh$_3$)$_4$, 30 mL of toluene, 10 mL of H$_2$O, and 10 mL of ethyl alcohol (EtOH) were added to a reaction vessel, and the mixture was stirred under reflux at a temperature of 100° C. for 16 hours. The reaction mixture was cooled to room temperature, and the organic layer was extracted therefrom using 400 mL of water and 400 mL of ethyl acetate. The organic layer was dried over MgSO$_4$, and the solvent was removed therefrom by evaporation. The resulting residue was then separated and purified through silica gel chromatography to obtain 2.3 g of Intermediate 7-3 (yield: 74%). The compound thus obtained was identified by using LC-MS.

C$_{18}$H$_{24}$BrNSi: M$^+$=361.09

2) Synthesis of Intermediate 7-2

Intermediate 7-2 was synthesized in substantially the same manner as in Synthesis of Intermediate 5-2, except that Intermediate 7-3 was used instead of Intermediate 5-3. The compound thus obtained was identified by using LC-MS.

C$_{24}$H$_{36}$BNO$_2$Si: M$^+$=409.26

3) Synthesis of Intermediate 7-1

Intermediate 7-1 was synthesized in substantially the same manner as in Synthesis of Intermediate 5-1, except that Intermediate 7-2 was used instead of Intermediate 5-2. The compound thus obtained was identified by using LC-MS.

C$_{32}$H$_{35}$N$_3$OSi: M$^+$=505.25

4) Synthesis of Compound 7

2.0 g (5.13 mmol) of Intermediate 7-1, 1.86 g (5.13 mmol) of PtCl$_2$(NCPh)$_2$, and 20 mL of benzonitrile were added to a reaction vessel, and the mixture was stirred under reflux at a temperature of 125° C. for 7 hours. The reaction mixture was cooled to room temperature, and benzonitrile was removed therefrom by evaporation. The resulting residue was separated and purified through silica gel chromatography to obtain 2.1 g of Compound 7 (yield: 58%). The compound thus obtained was identified by using LC-MS.

C$_{32}$H$_{33}$N$_3$OPtSi: M$^+$=698.20

Synthesis Example 3

Synthesis of Compound 24

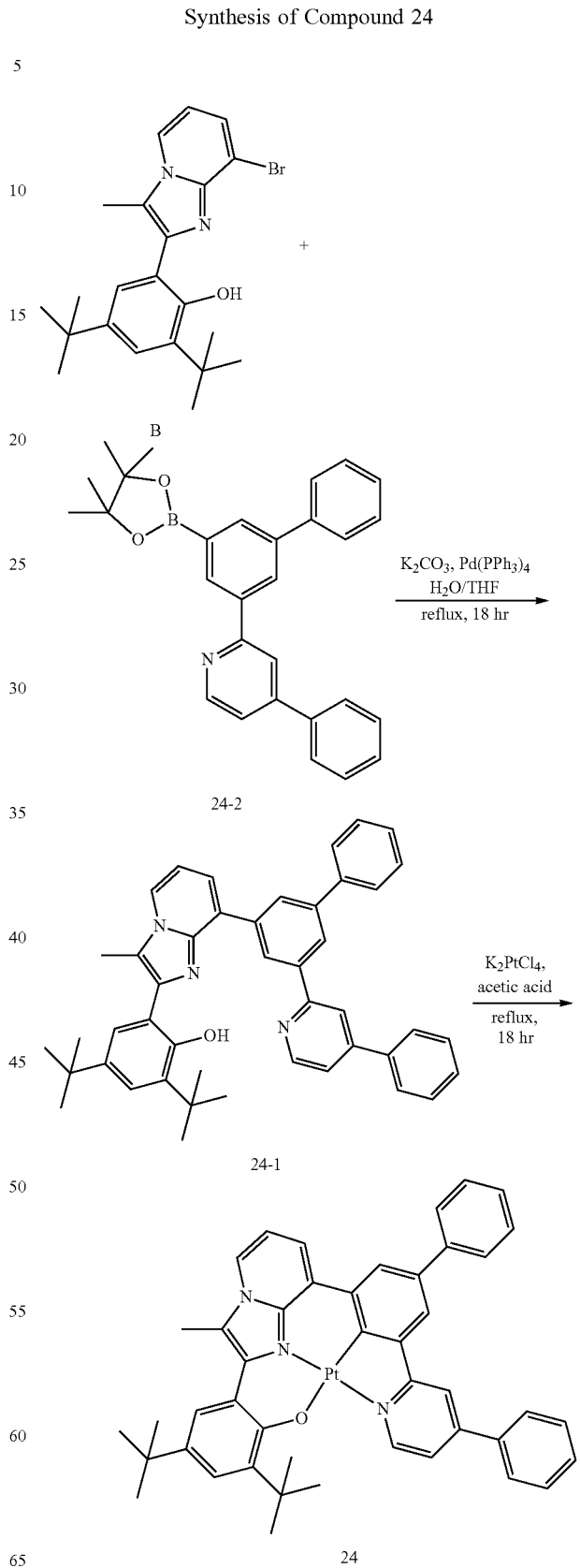

Intermediate 24-1 was synthesized in substantially the same manner as in Synthesis of Intermediate 5-1, except that Intermediate 24-2 was used instead of Intermediate 5-2, and Intermediate B was used instead of Intermediate A. Compound 24 was synthesized in substantially the same manner as in Synthesis of Compound 5, except that Intermediate 24-1 was used instead of Intermediate 5-1. The compound thus obtained was identified by using LC-MS.

$C_{45}H_{41}N_3OPt$: $M^+=834.29$

Synthesis Example 4

Synthesis of Compound 64

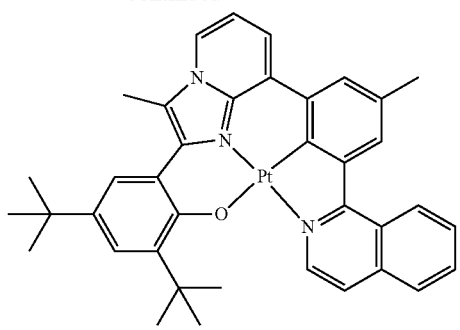

64

Intermediate 64-1 was synthesized in substantially the same manner as in Synthesis of Intermediate 5-1, except that Intermediate 64-2 was used instead of Intermediate 5-2, and Intermediate B was used instead of Intermediate A. Compound 64 was synthesized in substantially the same manner as in Synthesis of Compound 5, except that Intermediate 64-1 was used instead of Intermediate 5-1. The compound thus obtained was identified by using LC-MS.

$C_{38}H_{37}N_3OPt$: $M^+=746.26$

Synthesis Example 5

Synthesis of Compound 65

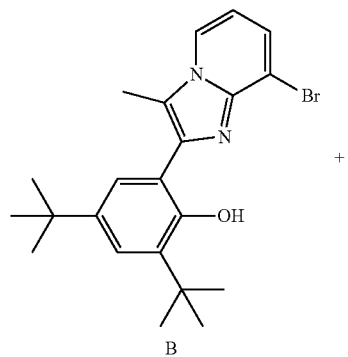

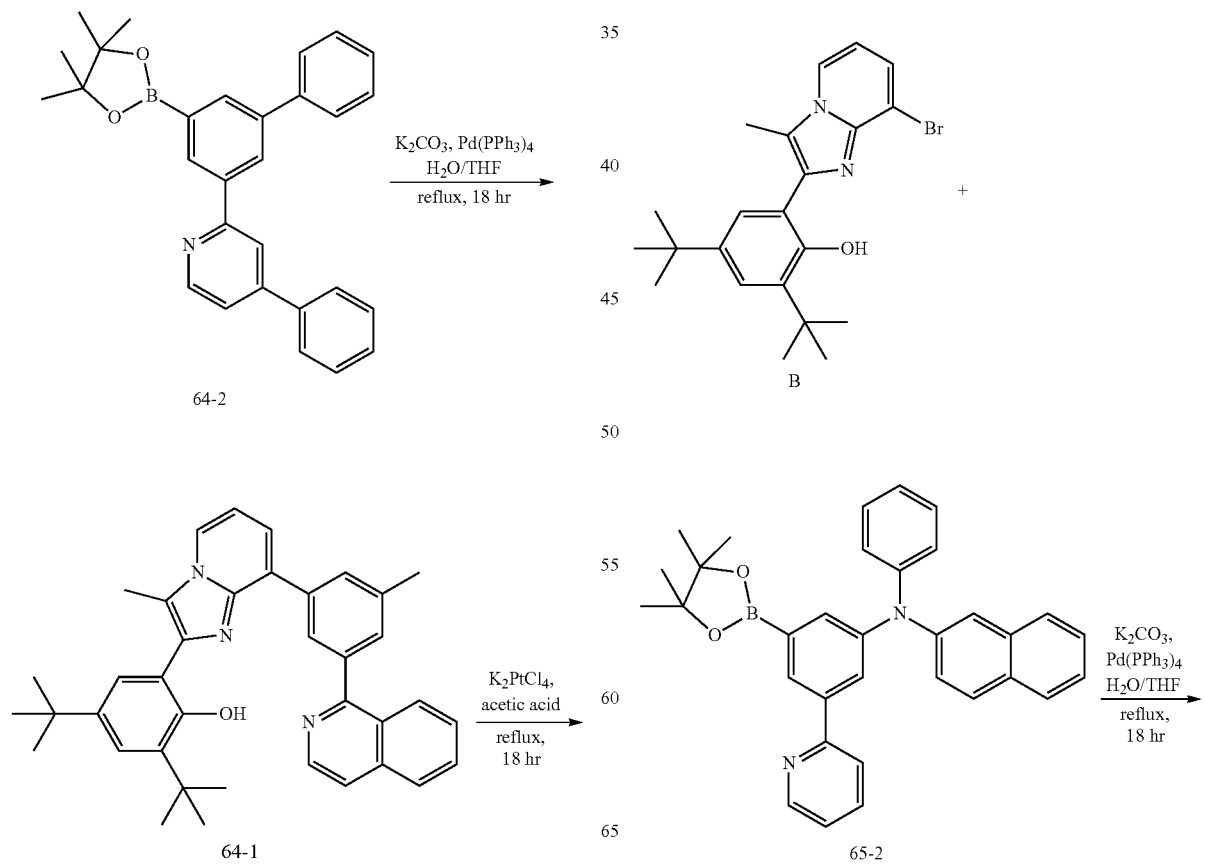

-continued

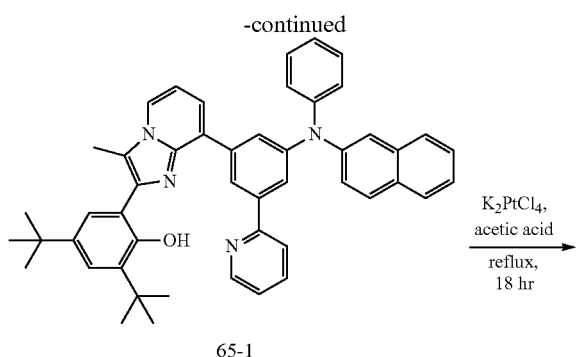

65-1

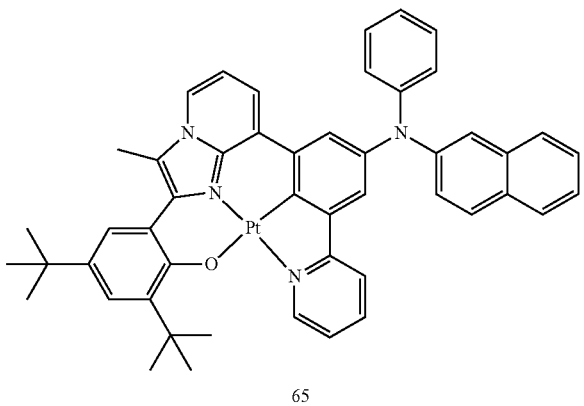

65

Intermediate 65-1 was synthesized in substantially the same manner as in Synthesis of Intermediate 5-1, except that Intermediate 65-2 was used instead of Intermediate 5-2, and Intermediate B was used instead of Intermediate A. Compound 65 was synthesized in substantially the same manner as in Synthesis of Compound 5, except that Intermediate 65-1 was used instead of Intermediate 5-1. The compound thus obtained was identified by using LC-MS.

$C_{49}H_{44}N_4OPt$: $M^+=899.32$

Example 1

An ITO glass substrate was cut to a size of 50 millimeters (mm)×50 mm×0.5 mm. Then, the glass substrate was sonicated in acetone iso-propyl alcohol and pure water for about 15 minutes each, and cleaned by exposure to ultraviolet rays and ozone for 30 minutes.

Thereafter, a hole injection layer was formed to have a thickness of about 600 Å on the ITO electrode (anode) on the glass substrate by depositing m-MTDATA at a rate of about 1 Å/sec. A hole transport layer was formed to have a thickness of about 250 Å on the hole injection layer by depositing α-NPD at a rate of about 1 Å/sec.

An emission layer was formed to have a thickness of about 400 Å on the hole transport layer by co-depositing Compound 5 (as a dopant) and CBP (as a host) at a rate of about 0.1 Å/sec and 1 Å/sec, respectively.

A hole blocking layer was formed on the emission layer by depositing BAlq at a rate of 1 Å/sec to have a thickness of about 50 Å. Then, an electron transport layer was formed on the hole blocking layer by depositing $Alq_3$ to have a thickness of about 300 Å. An electron injection layer was formed on the electron transport layer by depositing LiF to have a thickness of about 10 Å. A second electrode (cathode) was formed on the electron injection layer by vacuum-depositing Al to have a thickness of about 1,200 Å. Therefore, the manufacture of an organic light-emitting device was completed, in which the organic light-emitting device included an ITO/m-MTDATA (600 Å)/α-NPD (250 Å)/CBP+10% Compound 5 (400 Å)/Balq (50 Å)/$Alq_3$ (300 Å)/LiF (10 Å)/Al (1,200 Å) structure.

Example 2

An organic light-emitting device was manufactured in substantially the same manner as in Example 1, except that Compound 7 was used instead of Compound 5 as a dopant in the formation of the emission layer.

Example 3

An organic light-emitting device was manufactured in substantially the same manner as in Example 1, except that Compound 24 was used instead of Compound 5 as a dopant in the formation of the emission layer.

Example 4

An organic light-emitting device was manufactured in substantially the same manner as in Example 1, except that Compound 64 was used instead of Compound 5 as a dopant in the formation of the emission layer.

Example 5

An organic light-emitting device was manufactured in substantially the same manner as in Example 1, except that Compound 65 was used instead of Compound 5 as a dopant in the formation of the emission layer.

Comparative Example 1

An organic light-emitting device was manufactured in substantially the same manner as in Example 1, except that PtOEP was used instead of Compound 5 as a dopant in the formation of the emission layer.

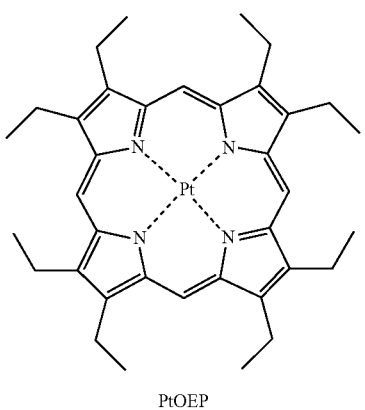

PtOEP

Evaluation Example 1

Evaluation of Characteristics of Organic Light-Emitting Device

The driving voltage, current efficiency, color-coordination, quantum efficiency, roll-off, and lifespan ($T_{95}$) of the organic light-emitting devices manufactured in Examples 1 to 5 and Comparative Example 1 were evaluated. The results thereof are shown in Table 2. A Keithley 2400 current voltmeter and a luminance meter (Minolta Cs-1000A) were used for the evaluation. The lifespan ($T_{95}$) refers to time required for the initial luminance of 6,000 nits of the organic light-emitting device to reduce by 95%. The roll-off was calculated by the following Equation 20:

Roll-off={1−(efficiency(at 9,000 nit)/maximum emission efficiency)}×100%   Equation 20

Referring to Table 2, the organic light-emitting device of Examples 1 to 5 were found to have excellent driving voltage, current efficiency, quantum efficiency, roll-off, and lifespan characteristics, as compared with the organic light-emitting device of Comparative Example 1.

As apparent from the foregoing description, the organometallic compound has excellent electrical characteristics and thermal stability. Accordingly, an organic light-emitting device employing the organometallic compound has a low driving voltage, high efficiency, high power, high color coordination, and excellent lifespan characteristics. Further, a diagnostic composition that includes the organometallic compound has high diagnostic efficiency, since the organometallic compound has excellent luminosity, particularly, excellent phosphorescent luminosity.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the FIGURES, it will be understood by those of ordinary skill in the art that various changes in form and details may be made therein without departing from the spirit and scope of the present disclosure as defined by the following claims.

What is claimed is:
1. An organometallic compound represented by Formula 1:

Formula 1

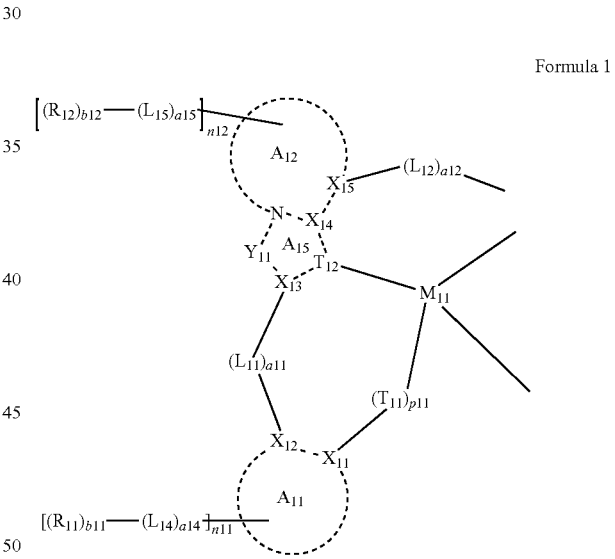

TABLE 2

| | Dopant | Driving voltage (V) | Current efficiency (cd/A) | CIEx | CIEy | Quantum efficiency (%) | Roll off (%) | Lifespan ($T_{95}$) (hr) |
|---|---|---|---|---|---|---|---|---|
| Example 1 | 5 | 5.5 | 33 | 0.60 | 0.40 | 17 | 15 | 100 |
| Example 2 | 7 | 5.0 | 30 | 0.61 | 0.39 | 18.2 | 11 | 85 |
| Example 3 | 24 | 5.1 | 50 | 0.64 | 0.34 | 27.5 | 9 | 180 |
| Example 4 | 64 | 5.6 | 45 | 0.65 | 0.35 | 25.3 | 8 | 110 |
| Example 5 | 65 | 5.4 | 47 | 0.66 | 0.34 | 24.2 | 10 | 125 |
| Comparative Example 1 | PtOEP | 7.3 | 22 | 0.67 | 0.32 | 15.2 | 9 | 80 |

-continued

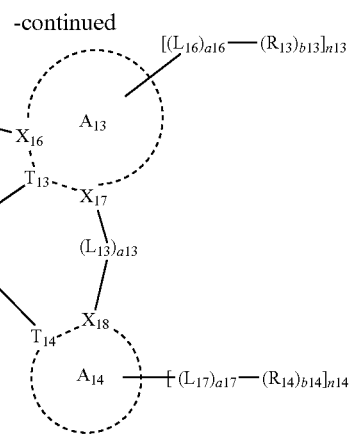

wherein, in Formula 1, $M_{11}$ is selected from beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver, (Ag), rhenium (Re), platinum (Pt), and gold (Au), $T_{11}$ is selected from oxygen (O) and sulfur (S), p11 is selected from 0 and 1; provided that when p11 is 0, *-$(T_{11})_{p11}$-*' is a single bond, $T_{12}$ to $T_{14}$ are each independently selected from nitrogen (N) and carbon (C), when p11 is 0, a bond between $X_{11}$ and $M_{11}$ is a covalent bond or a coordinate bond;

when p11 is 1, a bond between $T_{11}$ and $M_{11}$ is a covalent bond, i) when p11 is 0, two bonds selected from a bond between $X_{11}$ and $M_{11}$, a bond between $T_{12}$ and $M_{11}$, a bond between $T_{13}$ and $M_{11}$, and a bond between $T_{14}$ and $M_{11}$ are each a covalent bond, and the other two bonds are each a coordinate bond; or ii) when p11 is 1, two bonds selected from a bond between $T_{11}$ and $M_{11}$, a bond between $T_{12}$ and $M_{11}$, a bond between $T_{13}$ and $M_{11}$, and a bond between $T_{14}$ and $M_{11}$ are each a covalent bond, and the other two bonds are each a coordinate bond, $X_{11}$ to $X_{18}$ are each independently selected from C and N, a bond between $X_{11}$ and $X_{12}$, a bond between $X_{13}$ and $T_{12}$, a bond between $X_{13}$ and $Y_{11}$, a bond between $T_{12}$ and $X_{14}$, a bond between $X_{14}$ and N, a bond between $X_{14}$ and $X_{15}$, a bond between $Y_{11}$ and N, a bond between $X_{16}$ and $T_{13}$, a bond between $T_{13}$ and $X_{17}$, and a bond between $X_{18}$ and $T_{14}$ are each independently selected from a single bond and a double bond, $A_{11}$, $A_{13}$, and $A_{14}$ are each independently selected from a $C_5$-$C_{30}$ carbocyclic group and a $C_1$-$C_{30}$ heterocyclic group, $A_{12}$ and $A_{15}$ are each independently selected from a $C_1$-$C_{30}$ heterocyclic group, $L_{11}$ to $L_{13}$ are each independently selected from *—O—*', *—S—*', *—[C($R_{15}$)($R_{16}$)]$_{k11}$—*', *—C($R_{15}$)=*', *=($R_{15}$)—*', *—C($R_{15}$)=C($R_{16}$)—*', *—C(=O)—*', *—C(=S)—*', *—C≡C—*', *—N($R_{15}$)—*', *—P($R_{14}$)—*', *—[Si($R_{15}$)($R_{16}$)]$_{k11}$—*', and *—P($R_{15}$)($R_{16}$)—*', $R_{15}$ and $R_{16}$ are optionally bound via a first linking group to form a substituted or unsubstituted $C_5$-$C_{30}$ carbocyclic group or a substituted or unsubstituted $C_1$-$C_{30}$ heterocyclic group, k11 is selected from 1 and 2, a11 to a13 are each independently selected from 0, 1, 2, and 3; when a11 is 0, *-$(L_{11})_{a11}$-*' is a single bond; when a12 is 0, *-$(L_{12})_{a12}$-*' is a single bond; when a13 is 0, *-$(L_{13})_{a13}$-*' is a single bond, $Y_{11}$ is selected from N($R_{17}$), N, C($R_{17}$)($R_{18}$), C($R_{17}$), Si($R_{17}$)($R_{18}$), Si($R_{17}$), and C(=O), $R_{17}$ and $R_{18}$ are optionally bound via a second linking group to form a substituted or unsubstituted $C_5$-$C_{30}$ carbocyclic group or a substituted or unsubstituted $C_1$-$C_{30}$ heterocyclic group, $L_{14}$ to $L_{17}$ are each independently selected from a substituted or unsubstituted $C_5$-$C_{30}$ carbocyclic group and a substituted or unsubstituted $C_1$-$C_{30}$ heterocyclic group, a14 to a17 are each independently selected from 0, 1, 2, 3, 4, and 5, $R_{11}$ to $R_{18}$ are each independently selected from hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(=O)($Q_8$)($Q_9$), b11 to b14 are each independently selected from 1, 2, 3, 4, and 5, n11 to n14 are each independently selected from 0, 1, 2, 3, 4, and 5, two adjacent groups RH of a plurality of groups RH are optionally bound to form a substituted or unsubstituted $C_5$-$C_{30}$ carbocyclic group or a substituted or unsubstituted $C_1$-$C_{30}$ heterocyclic group, two adjacent groups $R_{12}$ of a plurality of groups $R_{12}$ are optionally bound to form a substituted or unsubstituted $C_5$-$C_{30}$ carbocyclic group or a substituted or unsubstituted $C_1$-$C_{30}$ heterocyclic group, two adjacent groups $R_{13}$ of a plurality of groups $R_{13}$ are optionally bound to form a substituted or unsubstituted $C_5$-$C_{30}$ carbocyclic group or a substituted or unsubstituted $C_1$-$C_{30}$ heterocyclic group, two adjacent groups $R_{14}$ of a plurality of groups $R_{14}$ are optionally bound to form a substituted or unsubstituted $C_5$-$C_{30}$ carbocyclic group or a substituted or unsubstituted $C_1$-$C_{30}$ heterocyclic group, at least two of $R_{11}$ to $R_{14}$, wherein the at least two of RH to $R_{14}$ are adjacent to each other, are optionally bound to form a substituted or unsubstituted $C_5$-$C_{30}$ carbocyclic group or a substituted or unsubstituted $C_1$-$C_{30}$ heterocyclic group, wherein $Q_1$ to $Q_9$ are each independently selected from hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group; a $C_1$-$C_{60}$ alkyl group substituted with at least one of deuterium, a $C_1$-$C_{60}$ alkyl group, and a $C_6$-$C_{60}$ aryl group; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group; a $C_6$-$C_{60}$ aryl group substituted with at least one of deuterium, a $C_1$-$C_{60}$ alkyl group, and a $C_6$-$C_{60}$ aryl group; a $C_6$-$C_{60}$ aryloxy group; a $C_6$-$C_{60}$ arylthio group; a $C_1$-$C_{60}$ heteroaryl group; a monovalent non-aromatic condensed polycyclic group; and a monovalent non-aromatic condensed heteropolycyclic group, and and *' each independently indicate a binding site to an adjacent atom.

2. The organometallic compound of claim 1, wherein a cyclometalated ring formed of $A_{15}$, $A_{12}$, $A_{13}$, and $M_{11}$ is selected from a 6-membered ring, a 7-membered ring, and an 8-membered ring.

3. The organometallic compound of claim 1, wherein a cyclometalated ring formed of $A_{15}$, $A_{12}$, $A_{13}$, and $M_{11}$ is a 6-membered ring.

4. The organometallic compound of claim 1, wherein p11 is 1, and a bond between $T_{11}$ and $M_{11}$ is a covalent bond.

5. The organometallic compound of claim 1, wherein when p11 is 0, $X_{11}$ and $T_{12}$ are each C, $T_{13}$ and $T_{14}$ are each N, a bond between $X_{11}$ and $M_{11}$ and a bond between $T_{12}$ and $M_{11}$ are each a covalent bond, and a bond between $T_{13}$ and $M_{11}$ and a bond between $T_{14}$ and $M_{11}$ are each a coordinate bond;

when p11 is 0, $X_{11}$ and $T_{14}$ are each C, $T_{12}$ and $T_{13}$ are each N, a bond between $X_{11}$ and $M_{11}$ and a bond between $T_{14}$ and $M_{11}$ are each a covalent bond, and a bond between $T_{12}$ and $M_{11}$ and a bond between $T_{13}$ and $M_{11}$ are each a coordinate bond;

when p11 is 0, $X_{11}$ and $T_{13}$ are each C, $T_{12}$ and $T_{14}$ are each N, a bond between $X_{11}$ and $M_{11}$ and a bond between $T_{13}$ and $M_{11}$ are each a covalent bond, and a bond between $T_{12}$ and $M_{11}$ and a bond between $T_{14}$ and $M_{11}$ are each a coordinate bond;

when p11 is 0, $X_{11}$ and $T_{12}$ are each N, $T_{13}$ and $T_{14}$ are each C, a bond between $X_{11}$ and $M_{11}$ and a bond between $T_{12}$ and $M_{11}$ are each a coordinate bond, and a bond between $T_{13}$ and $M_{11}$ and a bond between $T_{14}$ and $M_{11}$ are each a covalent bond;

when p11 is 0, $X_{11}$ and $T_{14}$ are each N, $T_{12}$ and $T_{13}$ are each C, a bond between $X_{11}$ and $M_{11}$ and a bond between $T_{14}$ and $M_{11}$ are each a coordinate bond, and a bond between $T_{12}$ and $M_{11}$ and a bond between $T_{13}$ and $M_{11}$ are each a covalent bond;

when p11 is 0, $X_{11}$ and $T_{13}$ are each N, $T_{12}$ and $T_{14}$ are each C, a bond between $X_{11}$ and $M_{11}$ and a bond between $T_{13}$ and $M_{11}$ are each a coordinate bond, and a bond between $T_{12}$ and $M_{11}$ and a bond between $T_{14}$ and $M_{11}$ are each a covalent bond;

when p11 is 1, $T_{12}$ is C, $T_{13}$ and $T_{14}$ are each N, a bond between $T_{11}$ and $M_{11}$ and a bond between $T_{12}$ and $M_{11}$ are each a covalent bond, and a bond between $T_{13}$ and $M_{11}$ and a bond between $T_{14}$ and $M_{11}$ are each a coordinate bond;

when p11 is 1, $T_{14}$ is C, $T_{12}$ and $T_{13}$ are each N, a bond between $T_{11}$ and $M_{11}$ and a bond between $T_{14}$ and $M_{11}$ are each a covalent bond, and a bond between $T_{12}$ and $M_{11}$ and a bond between $T_{13}$ and $M_{11}$ are each a coordinate bond; or when p11 is 1, $T_{13}$ is C, $T_{12}$ and $T_{14}$ are each N, a bond between $T_{11}$ and $M_{11}$ and a bond between $T_{13}$ and $M_{11}$ are each a covalent bond, and a bond between $T_{12}$ and $M_{11}$ and a bond between $T_{14}$ and $M_{11}$ are each a coordinate bond.

6. The organometallic compound of claim 1, wherein $X_{12}$ to $X_{18}$ are each C.

7. The organometallic compound of claim 1, wherein $A_{11}$, $A_{13}$, and $A_{14}$ are each independently selected from a benzene group, a naphthalene group, an anthracene group, a phenanthrene group, a triphenylene group, a pyrene group, a chrysene group, a cyclopentadiene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an indenopyridine group, an indolopyridine group, a benzofuropyridine group, a benzothienopyridine group, a benzosilolopyridine group, an indenopyrimidine group, an indolopyrimidine group, a benzofuropyrimidine group, a benzothienopyrimidine group, a benzosilolopyrimidine group, a dihydropyridine group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, and a 5,6,7,8-tetrahydroquinoline group, and $A_{12}$ and $A_{15}$ are each independently selected from an indole group, a carbazole group, an indenopyridine group, an indolopyridine group, a benzofuropyridine group, a benzothienopyridine group, a benzosilolopyridine group, a dihydropyridine group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, and a 5,6,7,8-tetrahydroquinoline group.

8. The organometallic compound of claim 1, wherein $A_{11}$, $A_{13}$, and $A_{14}$ are each independently selected from a benzene group, a naphthalene group, a 1,2,3,4-tetrahydronaphthalene group, a dibenzofuran group, a dibenzothiophene group, a benzofuropyridine group, a benzothienopyridine group, a benzofuropyrimidine group, a benzothienopyrimidine group, a dihydropyridine group, a pyridine group, a quinoline group, an isoquinoline group, a pyrrole group, an imidazole group, a benzimidazole group, a 5,6,7,8-tetrahydroisoquinoline group, and a 5,6,7,8-tetrahydroquinoline group, and $A_{12}$ and $A_{15}$ are each independently selected from a dihydropyridine group, a pyridine group, a quinoline group, an isoquinoline group, a pyrrole group, an imidazole group, a 5,6,7,8-tetrahydroisoquinoline group, and a 5,6,7,8-tetrahydroquinoline group.

9. The organometallic compound of claim 1, wherein $Y_{11}$ is selected from N and $C(R_{17})$.

10. The organometallic compound of claim 1, wherein $L_{14}$ to $L_{17}$ are each independently selected from a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an indenopyridine group, an indolopyridine group, a benzofuropyridine group, a benzothienopyridine group, a benzosilolopyridine group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, and a benzothiadiazole group; and a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an indenopyridine group, an indolopyridine group, a benzofuropyridine group, a benzothienopyridine group, a benzosilolopyridine group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, and a benzothiadiazole group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a pyridinyl group, a pyrimidinyl group, a triazinyl group, a fluorenyl group, a dimethylfluorenyl group, a diphenylfluorenyl group, a carbazolyl group, a phenylcarbazolyl group, a dibenzofuranyl group, a dibenzothiophenyl group, a dibenzosilolyl group, a dimethyldibenzosilolyl group, a diphenyldibenzosilolyl group, —N($Q_{31}$)($Q_{32}$), —Si($Q_{33}$)($Q_{34}$)($Q_{35}$), —B($Q_{36}$)($Q_{37}$), and —P(=O)($Q_{38}$)($Q_{39}$), wherein $Q_{31}$ to $Q_{39}$ are each independently selected from —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group.

11. The organometallic compound of claim 1, wherein $R_{11}$ to $R_{18}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —$CD_3$, —$CD_2H$, —$CDH_2$, —$CF_3$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclopentyl group substituted with deuterium, a cyclohexyl group, a cyclohexyl group substituted with deuterium, a cycloheptyl group, a cycloheptyl group substituted with deuterium, a cyclooctyl group, a cyclooctyl group substituted with deuterium, a bicyclo[2.2.1]heptanyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, a bicyclo[2.2.1]heptanyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, a bicyclo[2.2.1]heptanyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C$_1$-C$_{20}$ alkyl group, a C$_1$-C$_{20}$ alkoxy group, a cyclopentyl group, a cyclopentyl group substituted with deuterium, a cyclohexyl group, a cyclohexyl group substituted with deuterium, a cycloheptyl group, a cycloheptyl group substituted with deuterium, a cyclooctyl group, a cyclooctyl group substituted with deuterium, a bicyclo[2.2.1]heptanyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, and —Si(Q$_{33}$)(Q$_{34}$)(Q$_{35}$); and —N(Q$_1$)(Q$_2$), —Si(Q$_3$)(Q$_4$)(Q$_5$), —B(Q$_6$)(Q$_7$), and —P(=O)(Q$_8$)(Q$_9$), wherein Q$_1$ to Q$_9$ and Q$_{33}$ to Q$_{35}$ are each independently selected from —CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, and —CD$_2$CDH$_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a C$_1$-C$_{10}$ alkyl group, and a phenyl group.

12. The organometallic compound of claim 1, wherein R$_{11}$ to R$_{18}$ are each independently selected from hydrogen, deuterium, —F, a cyano group, a nitro group, —SF$_5$, a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, a bicyclo[2.2.1]heptanyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a fluorenyl group, a carbazolyl group, a dibenzofuranyl group, a dibenzothiophenyl group, and a dibenzosilolyl group;

a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, a bicyclo[2.2.1]heptanyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a fluorenyl group, a carbazolyl group, a dibenzofuranyl group, a dibenzothiophenyl group, and a dibenzosilolyl group, each substituted with at least one selected from deuterium, —F, —CD$_3$, —CD$_2$H, —CDH$_2$, —CF$_3$, —CF$_2$H, —CFH$_2$, a cyano group, a nitro group, a C$_1$-C$_{10}$ alkyl group, a C$_1$-C$_{10}$ alkoxy group, a cyclopentyl group, a cyclopentyl group substituted with deuterium, a cyclohexyl group, a cyclohexyl group substituted with deuterium, a cycloheptyl group, a cycloheptyl group substituted with deuterium, a cyclooctyl group, a cyclooctyl group substituted with deuterium, a bicyclo[2.2.1]heptanyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a fluorenyl group, a carbazolyl group, a dibenzofuranyl group, a dibenzothiophenyl group, a dibenzosilolyl group, and —Si(Q$_{33}$)(Q$_{34}$)(Q$_{35}$); and —N(Q$_1$)(Q$_2$), —Si(Q$_3$)(Q$_4$)(Q$_5$), —B(Q$_6$)(Q$_7$), and —P(=O)(Q$_8$)(Q$_9$), wherein Q$_1$ to Q$_9$ and Q$_{33}$ to Q$_{35}$ are each independently selected from —CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, and —CD$_2$CDH$_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a C$_1$-C$_{10}$ alkyl group, and a phenyl group.

13. The organometallic compound of claim 1, wherein R$_{11}$ to R$_{18}$ are each independently selected from hydrogen, deuterium, —F, a cyano group, a nitro group, —SF$_5$, —CH$_3$, —CD$_3$, —CD$_2$H, —CDH$_2$, —CF$_3$, —CF$_2$H, —CFH$_2$, groups represented by Formulae 9-1 to 9-21, groups represented by Formulae 10-1 to 10-246, —N(Q$_1$)(Q$_2$), —Si(Q$_3$)(Q$_4$)(Q$_5$), —B(Q$_6$)(Q$_7$), and —P(=O)(Q$_8$)(Q$_9$):

9-1

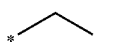

9-2

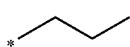

9-3

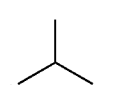

9-4

9-5

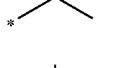

-continued 9-6

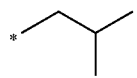

9-7

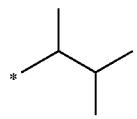

9-8

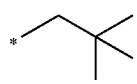

9-9

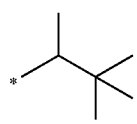

9-10

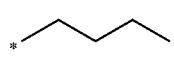

9-11

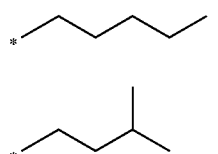

9-12

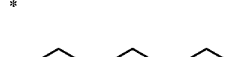

9-13

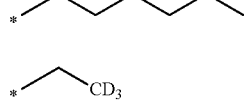

9-14

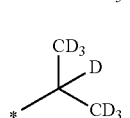

9-15

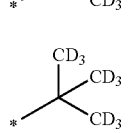

9-16

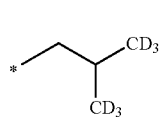

9-17

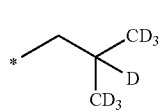

9-18

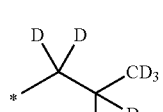

9-19

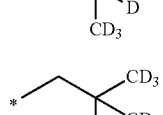

9-20

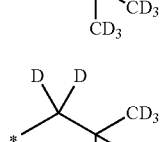

9-21

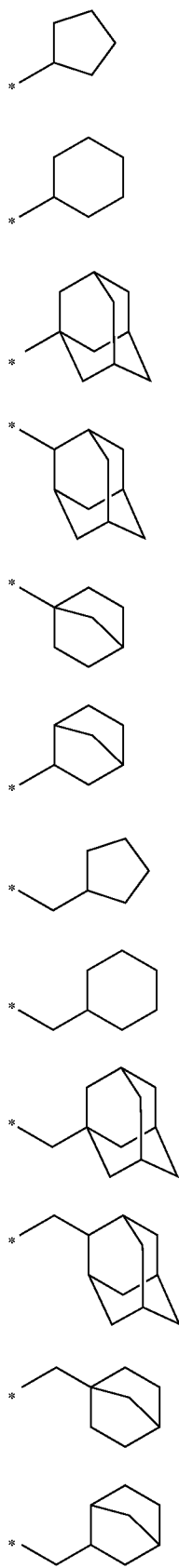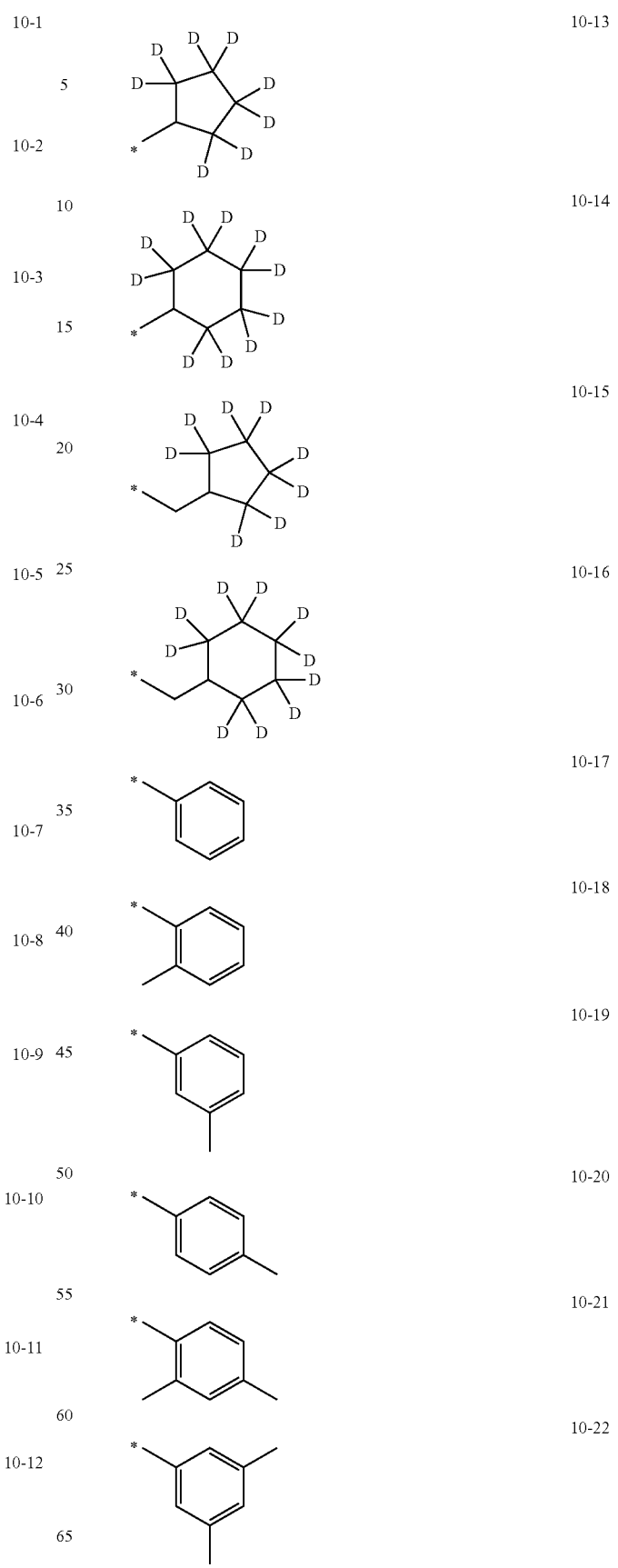

-continued
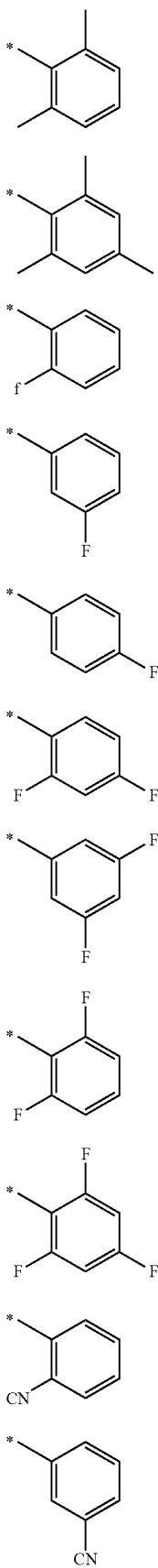
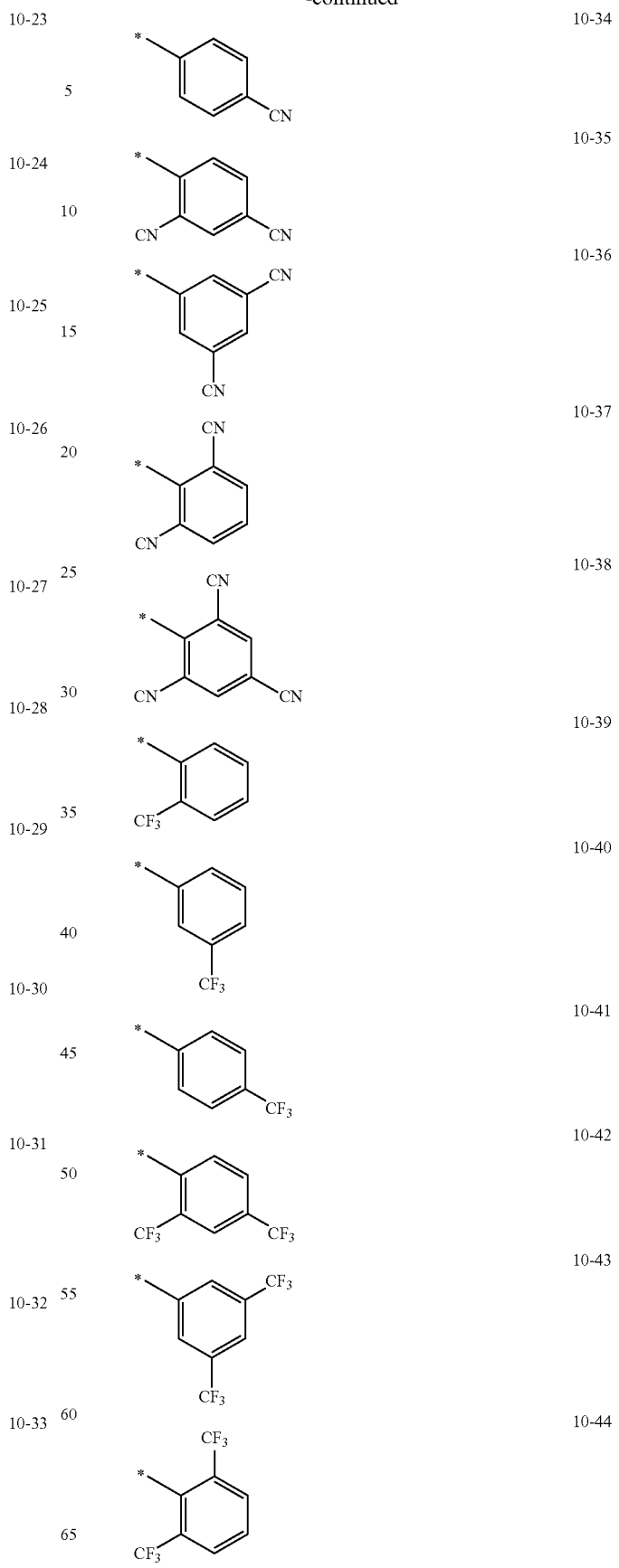

-continued
10-34 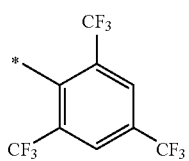
10-35 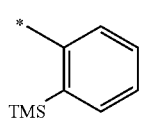
10-36 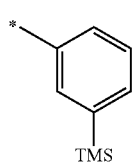
10-37 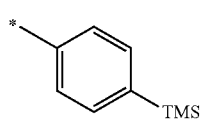
10-38 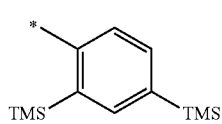
10-39 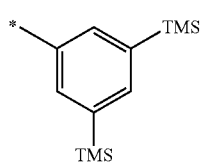
10-40 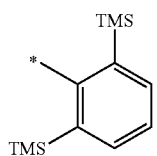
10-41 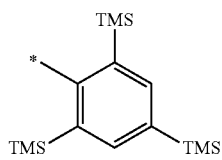
10-42 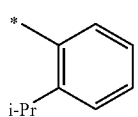
10-43 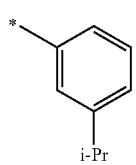
10-44 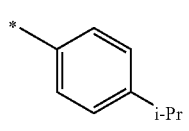
-continued
10-45 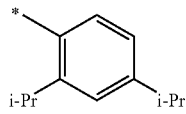
10-46 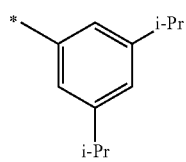
10-47 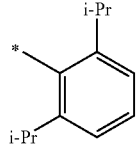
10-48 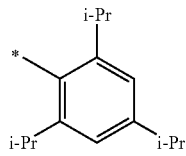
10-49 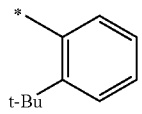
10-50 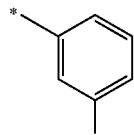
10-51
10-52 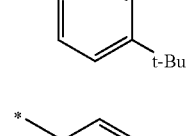
10-53 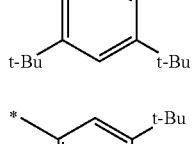
10-54
10-55 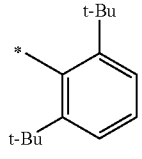
10-56
10-57
10-58
10-59
10-60
10-61
10-62
10-63
10-64
10-65

-continued
10-66 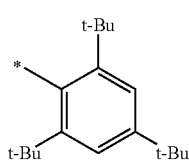
10-67 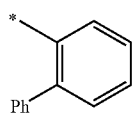
10-68 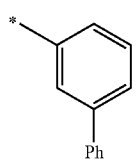
10-69 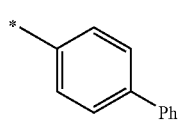
10-70 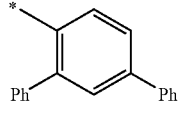
10-71 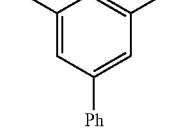
10-72 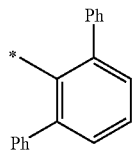
10-73 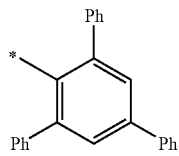
10-74 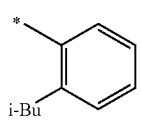
10-75 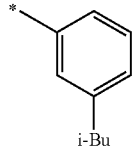
10-76 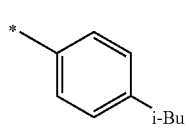
-continued
10-77 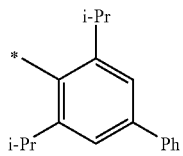
10-78 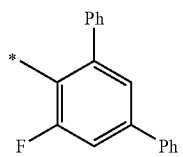
10-79 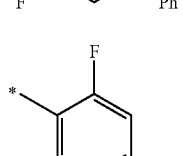
10-80 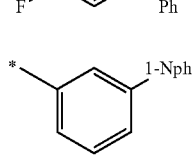
10-81 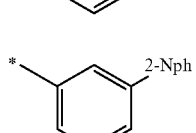
10-82 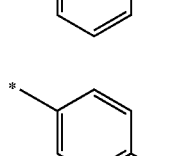
10-83 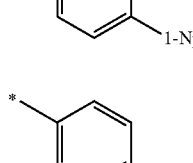
10-84 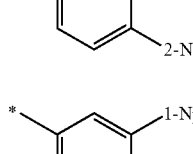
10-85 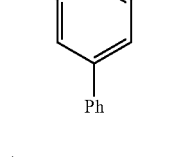
10-86 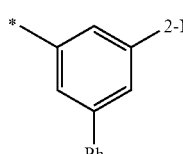
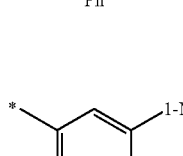

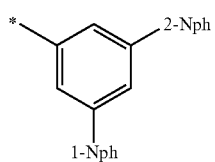
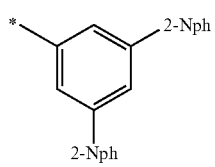
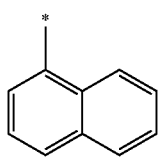
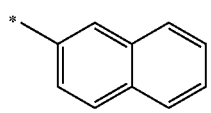
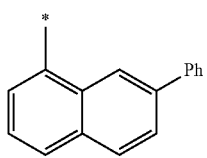
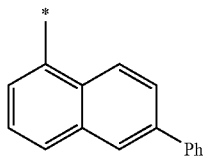
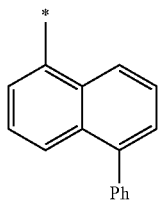
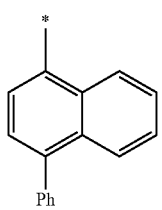
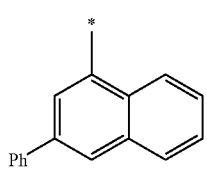
10-87
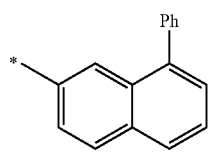
10-88
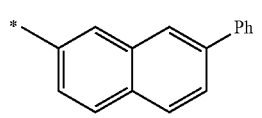
10-89
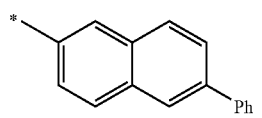
10-90
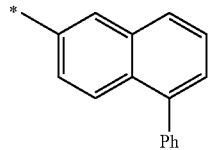
10-91
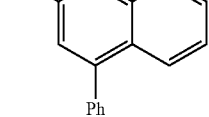
10-92
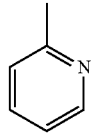
10-93
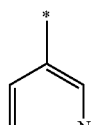
10-94
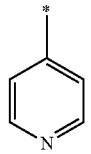
10-95
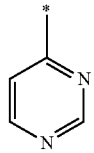
10-96
10-97
10-98
10-99
10-100
10-101
10-102
10-103
10-104
10-105
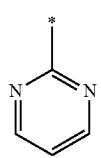

-continued
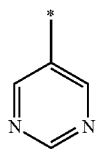
10-106
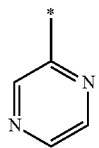
10-107
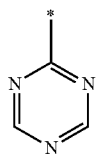
10-108
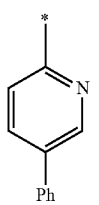
10-109
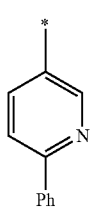
10-110
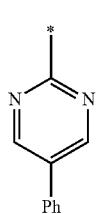
10-111
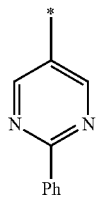
10-112
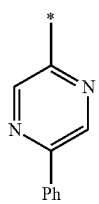
10-113
-continued
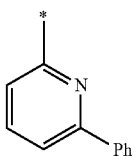
10-114
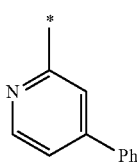
10-115
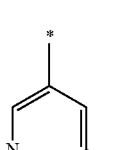
10-116
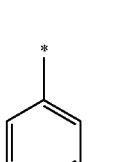
10-117
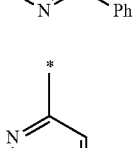
10-118
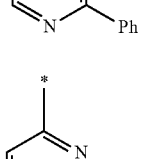
10-119
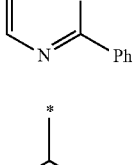
10-120
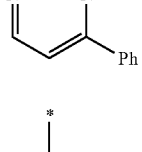
10-121
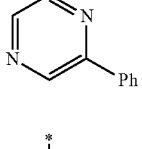
10-122
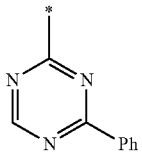

-continued
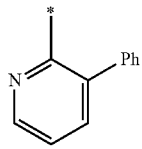
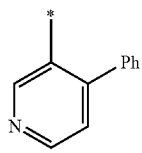
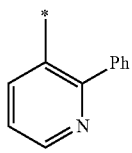
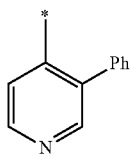
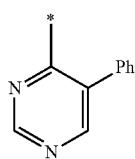
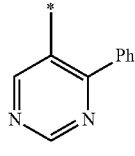
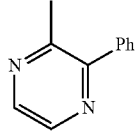
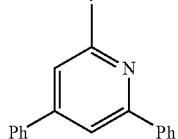
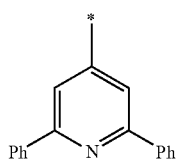
-continued
10-123
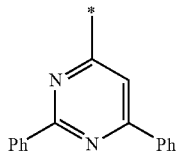
10-124
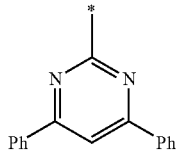
10-125
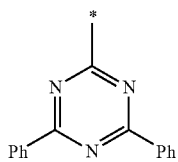
10-126
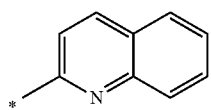
10-127
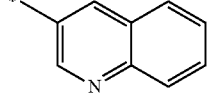
10-128
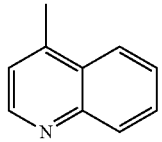
10-129
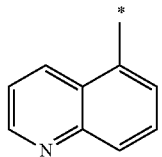
10-130
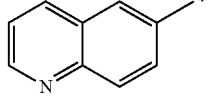
10-131
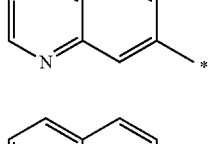
10-132
10-133
10-134
10-135
10-136
10-137
10-138
10-139
10-140
10-141
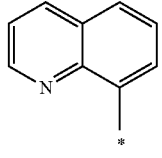

155
-continued
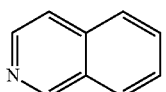
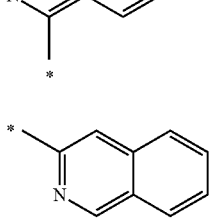
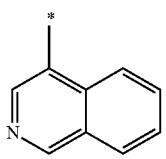
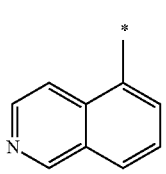
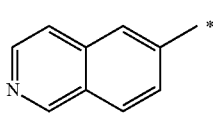
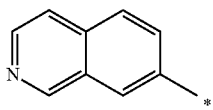
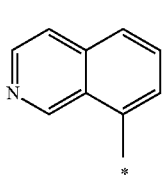
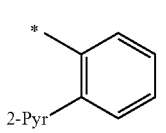
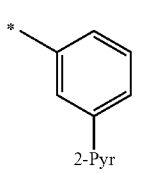
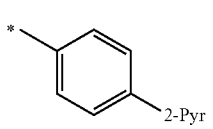
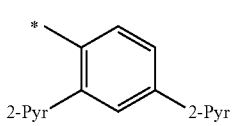
156
-continued
10-142
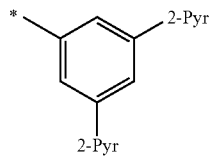
10-143
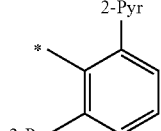
10-144
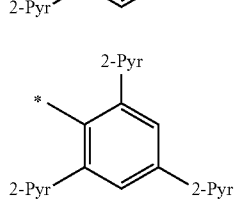
10-145
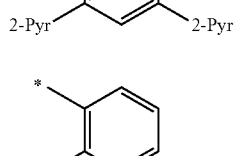
10-146
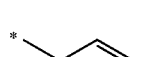
10-147
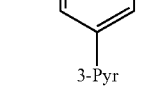
10-148
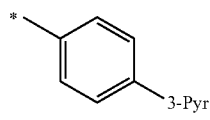
10-149
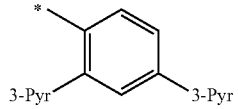
10-150
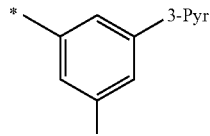
10-151
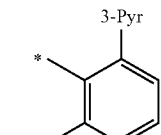
10-152
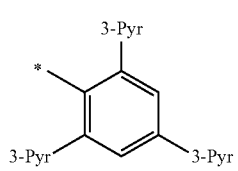
10-153
10-154
10-155
10-156
10-157
10-158
10-159
10-160
10-161
10-162

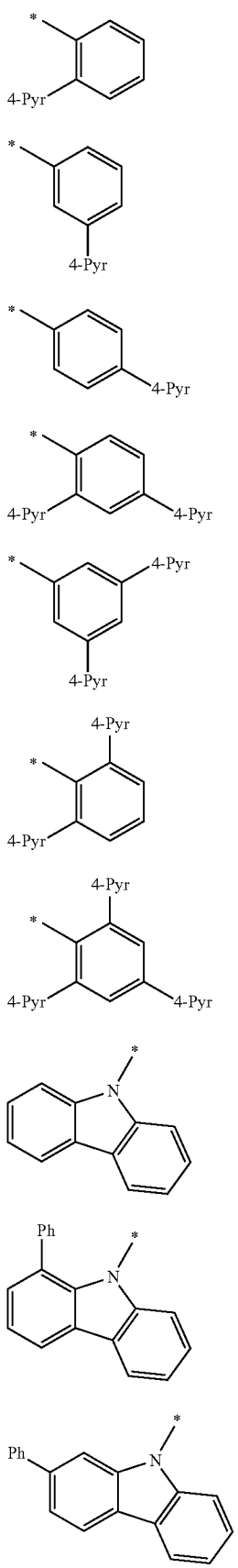
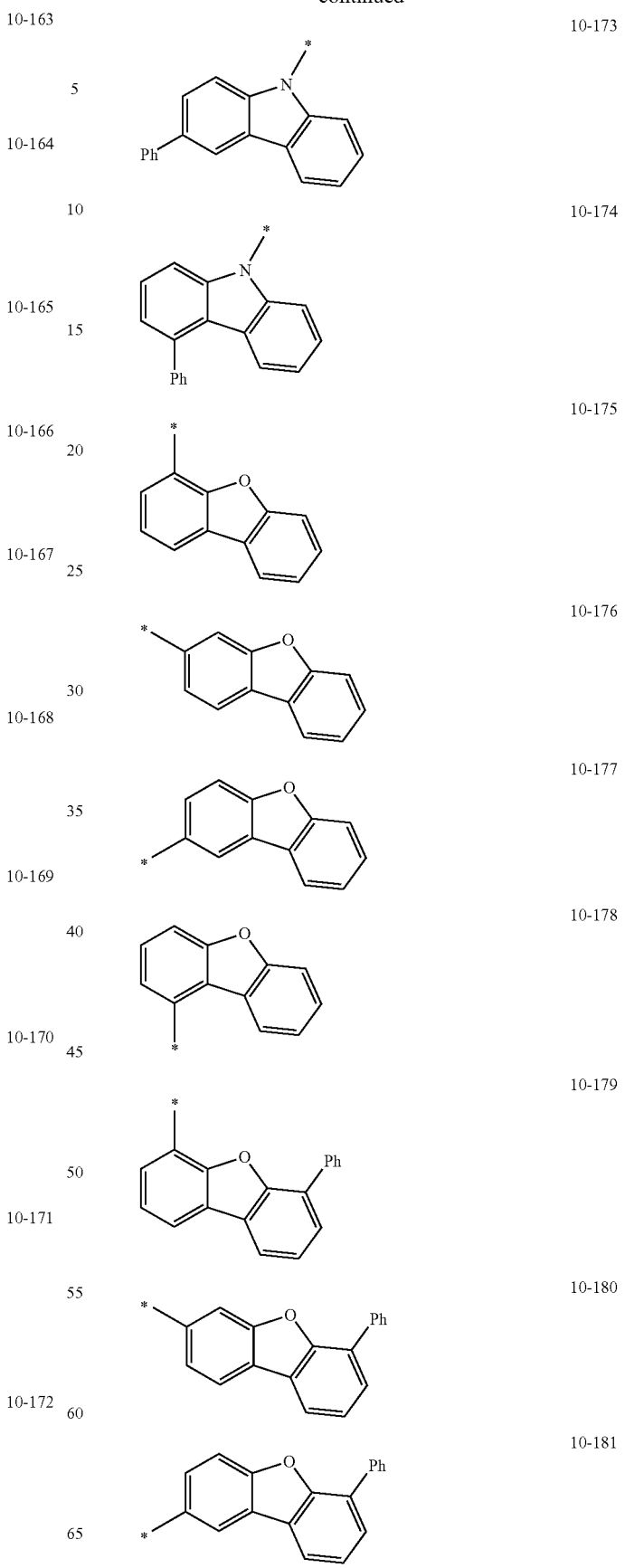

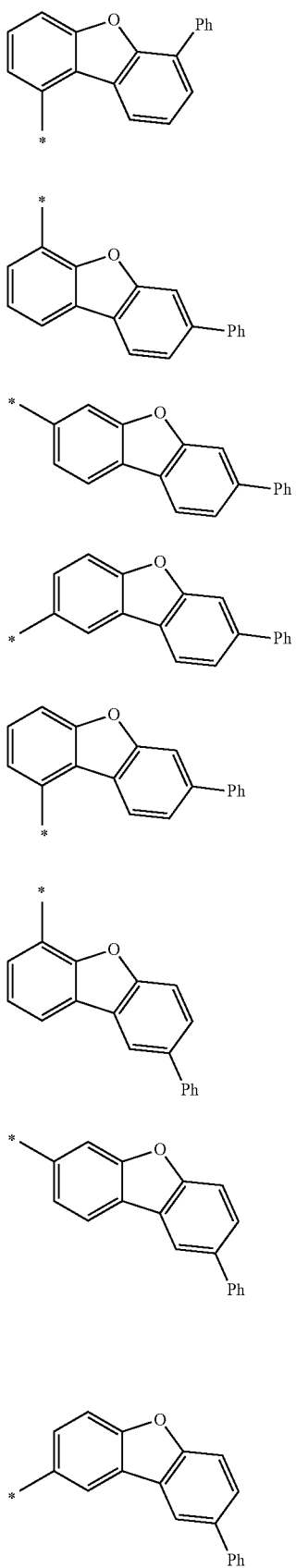
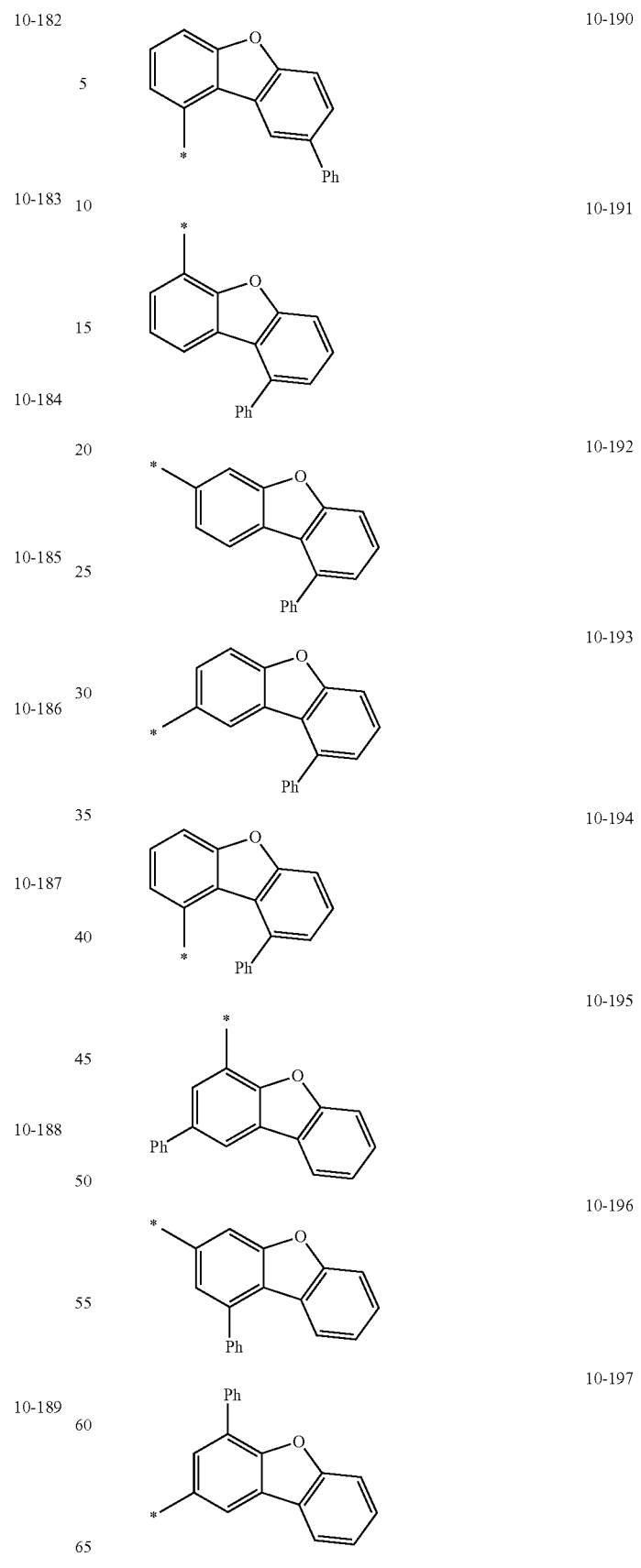

10-198 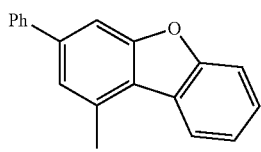
10-199 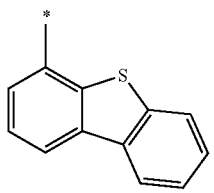
10-200 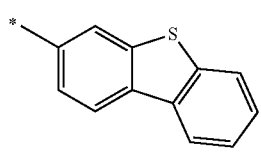
10-201 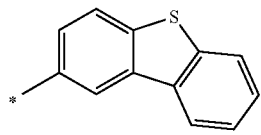
10-202 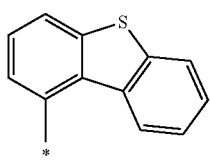
10-203 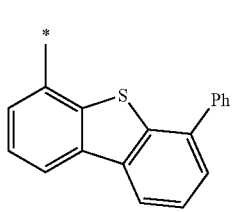
10-204 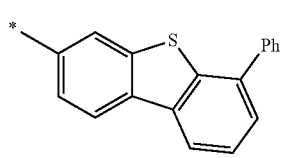
10-205 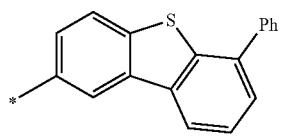
10-206 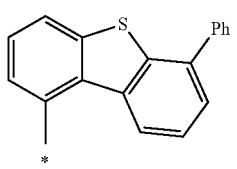
10-207 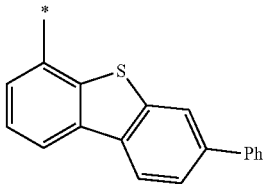
10-208 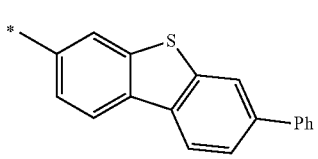
10-209 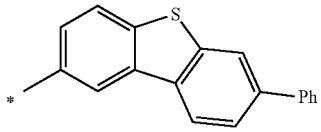
10-210 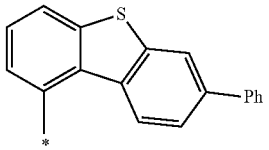
10-211 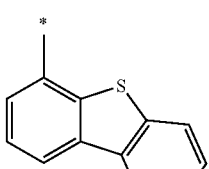
10-212 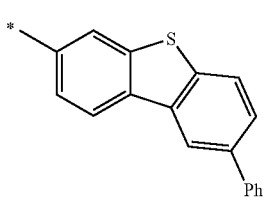
10-213 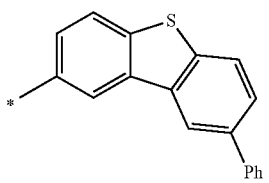
10-214 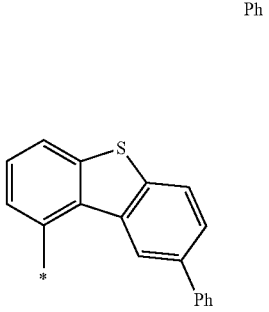

-continued
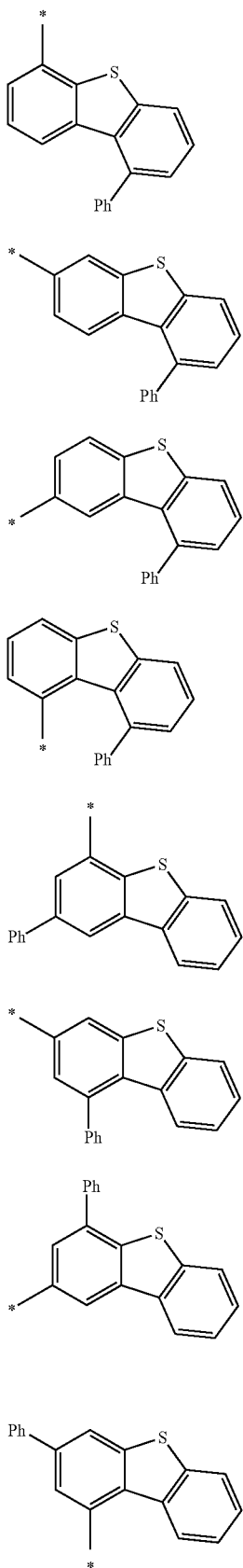
-continued
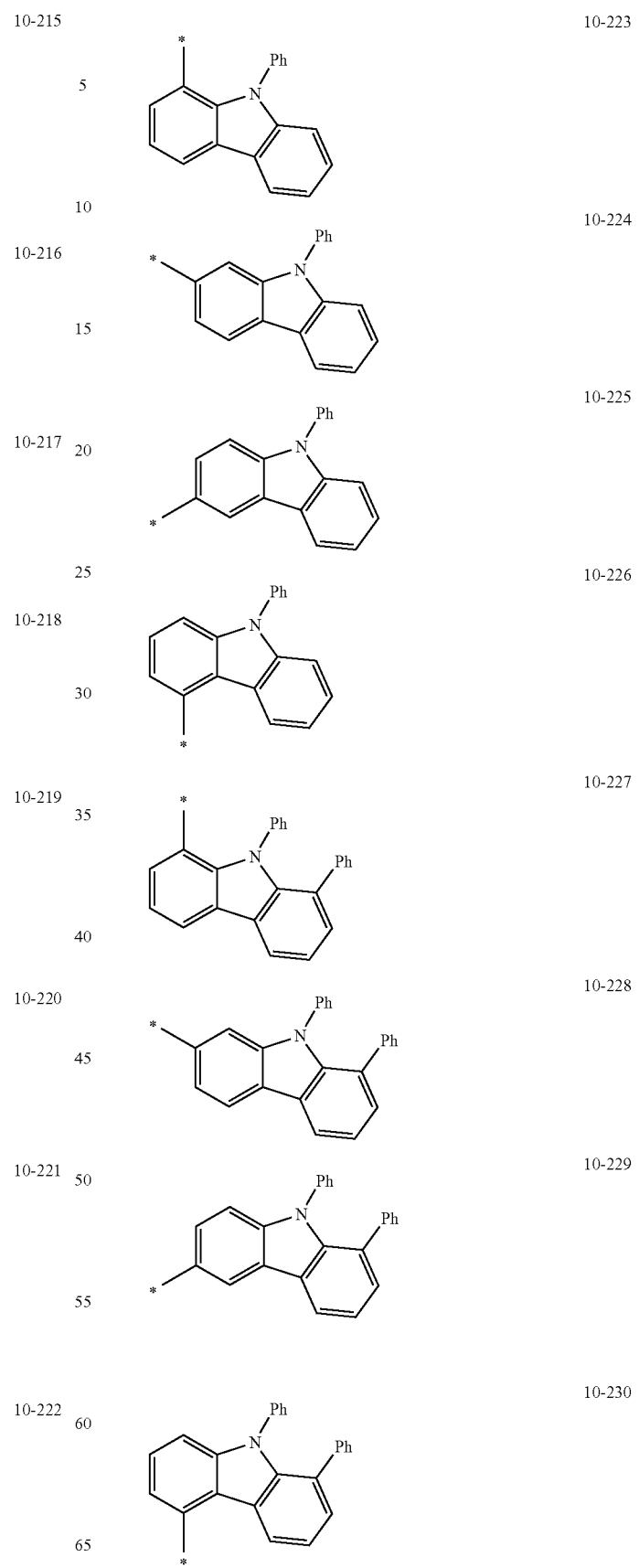

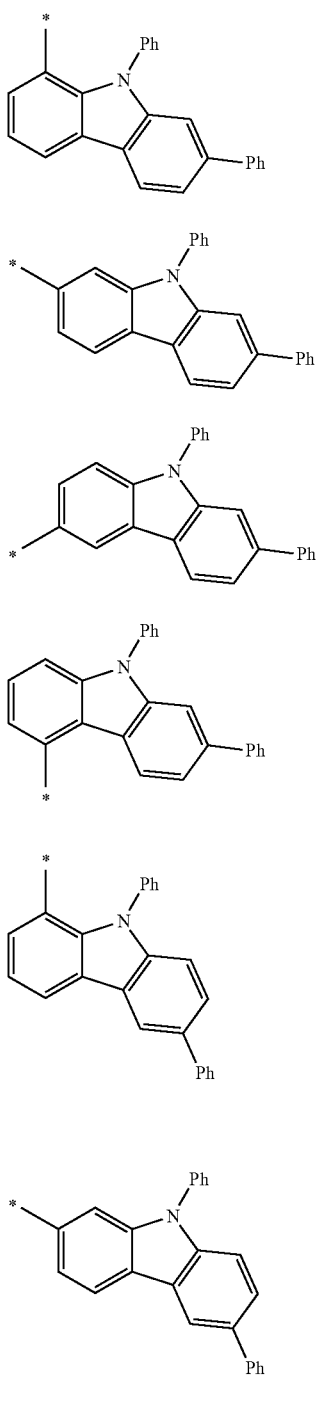
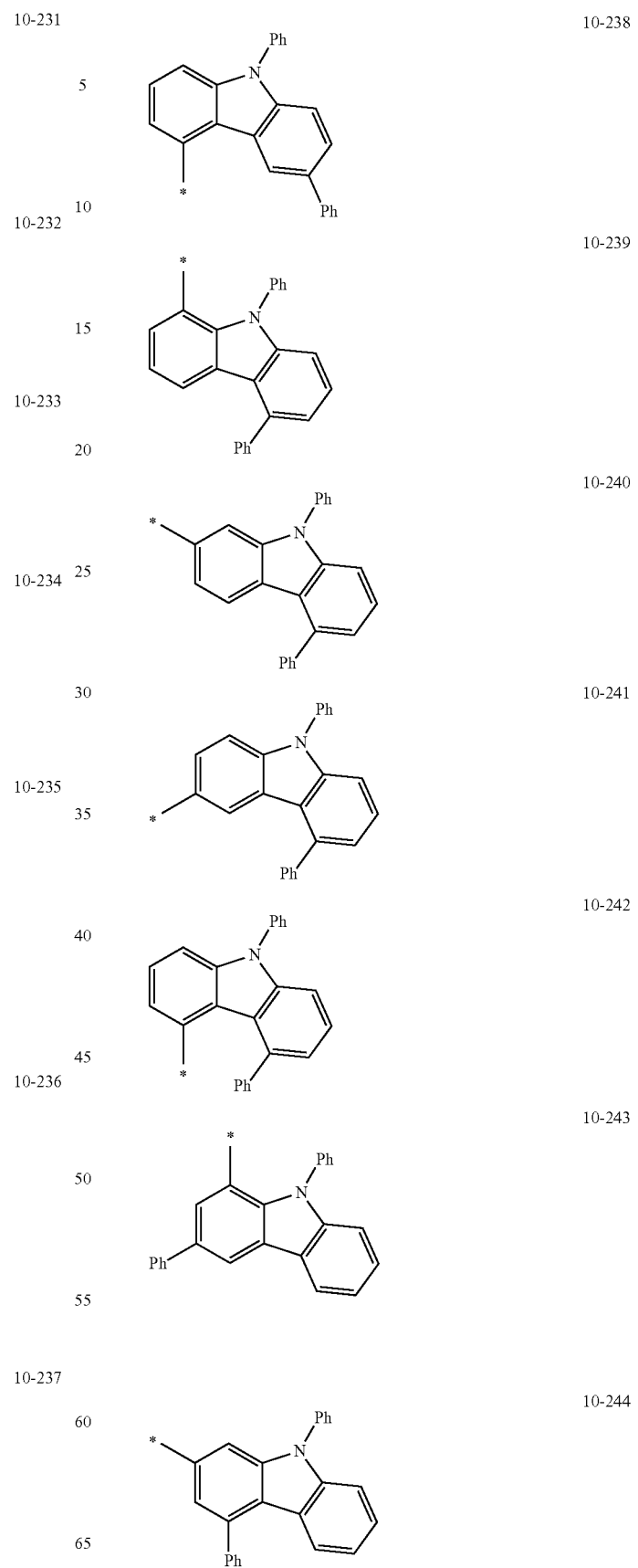
10-231
10-232
10-233
10-234
10-235
10-236
10-237
10-238
10-239
10-240
10-241
10-242
10-243
10-244

-continued

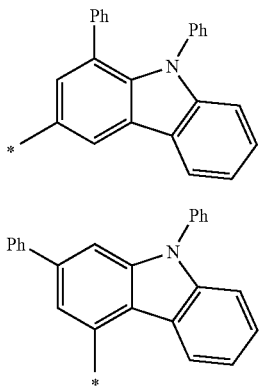

10-245

10-246 wherein Q₁ to Q₉ are each independently selected from —CH₃, —CD₃, —CD₂H, —CDH₂, —CH₂CH₃, —CH₂CD₃, —CH₂CD₂H, —CH₂CDH₂, —CHDCH₃, —CHDCD₂H, —CHDCDH₂, —CHDCD₃, —CD₂CD₃, —CD₂CD₂H, and —CD₂CDH₂;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group, in Formulae 9-1 to 9-21 and 10-1 to 10-246, \* indicates a binding site to an adjacent atom, the term "i-Pr" represents an iso-propyl group, the term "i-Bu" represents an iso-butyl group, the term "t-Bu" represents a t-butyl group, the term "Ph" represents a phenyl group, the term "1-Nph" represents a 1-naphthyl group, the term "2-Nph" represents a 2-naphthyl group, the term "2-Pyr" represents a 2-pyridyl group, the term "3-Pyr" represents a 3-pyridyl group, the term "4-Pyr" represents a 4-pyridyl group, and the term "TMS" represents a trimethylsilyl group.

14. The organometallic compound of claim 1, wherein the organometallic compound is represented by any one of Formulae 1-1 to 1-4:

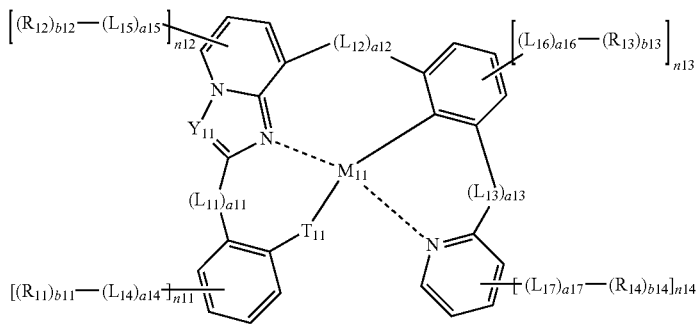

1-1

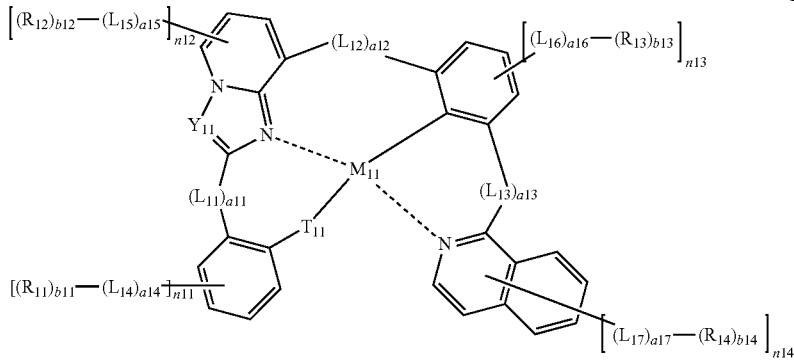

1-2

-continued
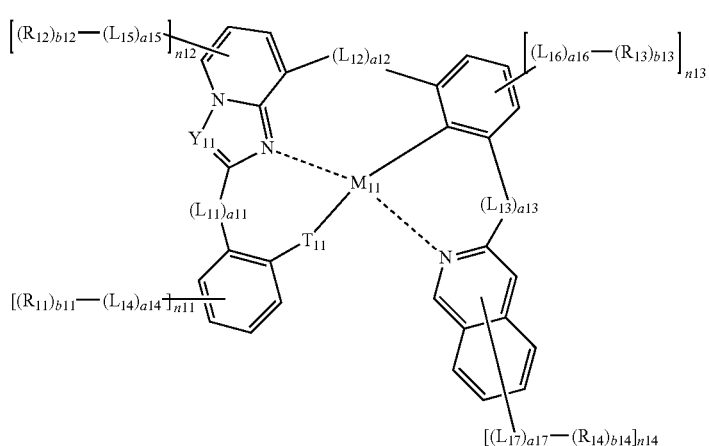
1-3
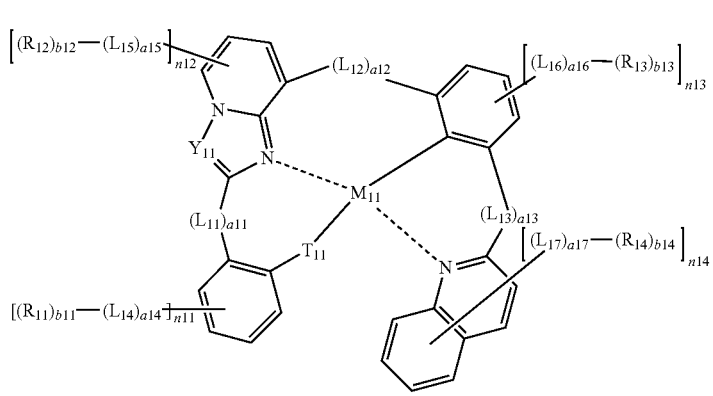
1-4
wherein, in Formulae 1-1 to 1-4, $M_{11}$, $T_{11}$, $Y_{11}$, $L_{11}$ to $L_{17}$, a11 to a17, $R_{11}$ to $R_{14}$, b11 to b14, and n11 to n14 are the same as those defined with reference to Formula 1.
15. The organometallic compound of claim 1, wherein the organometallic compound is selected from Compounds 1 to 89:
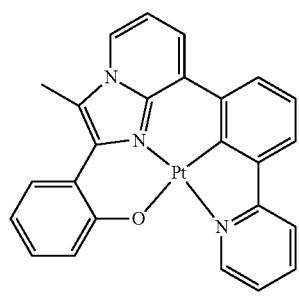
1
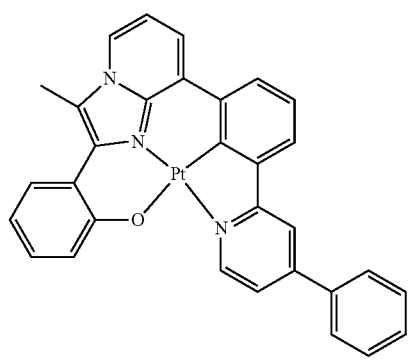
2
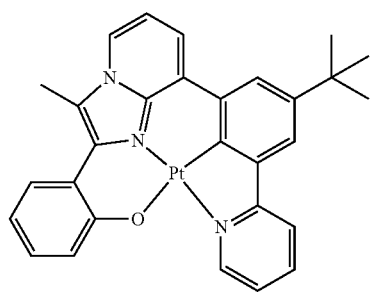
3

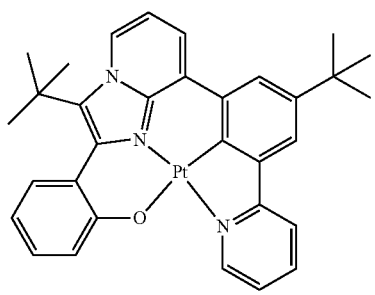
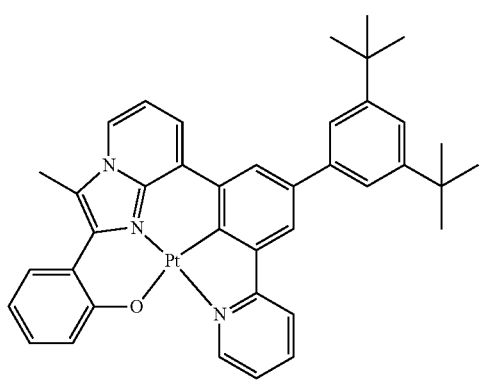
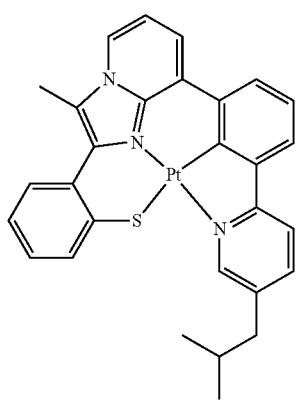
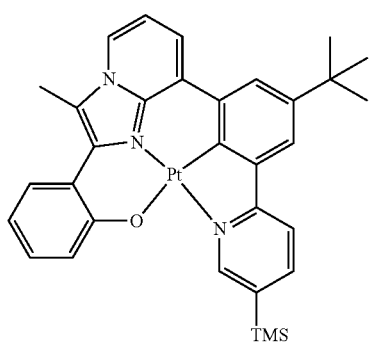
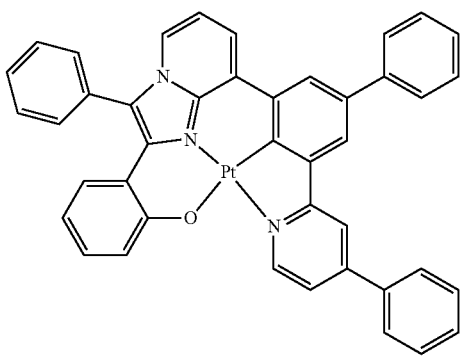
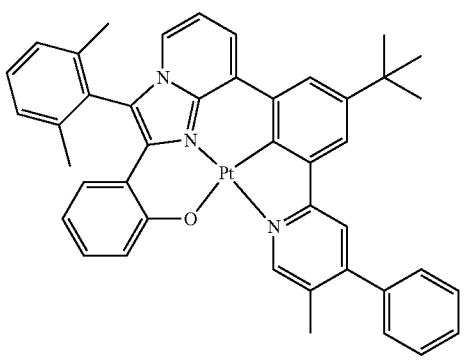
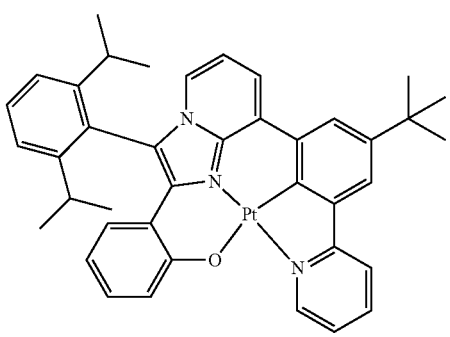
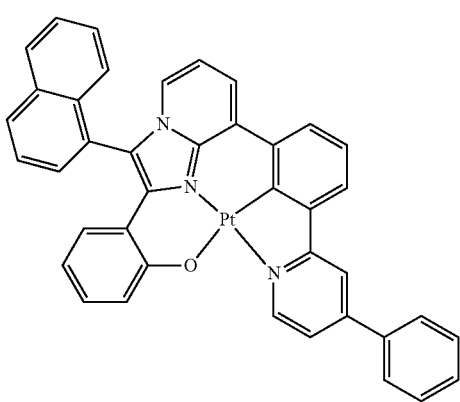

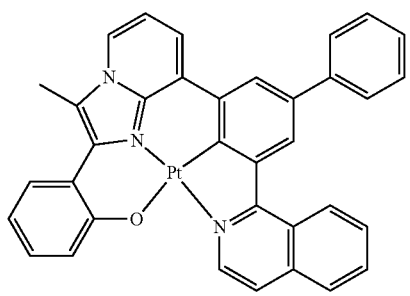
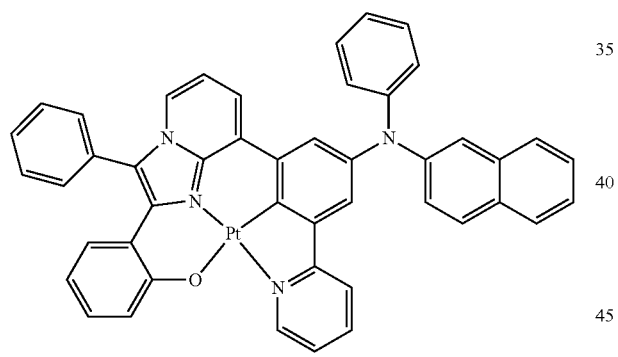
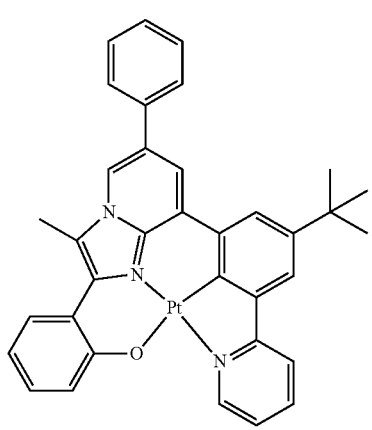
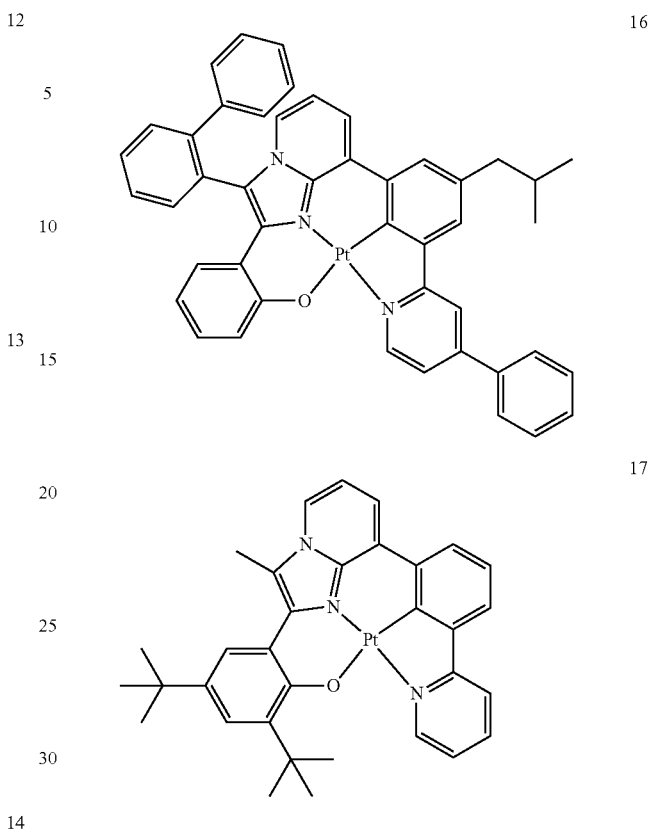
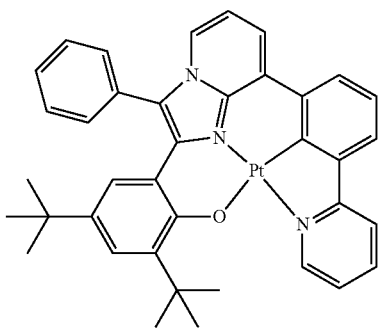

20
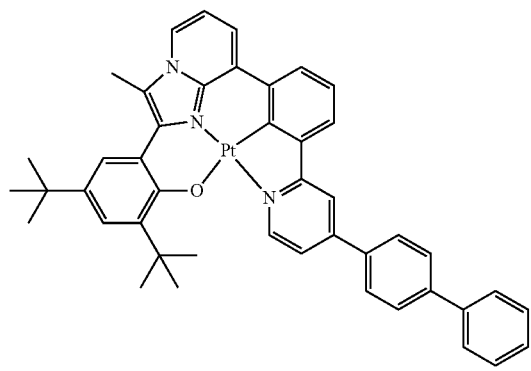
21
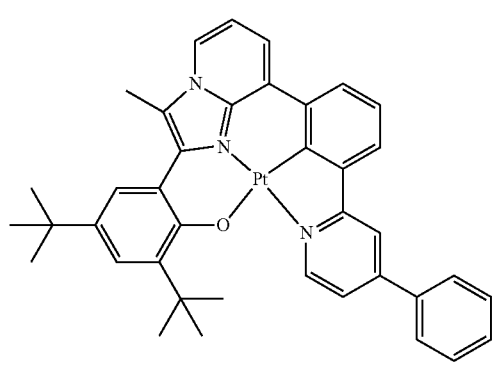
22
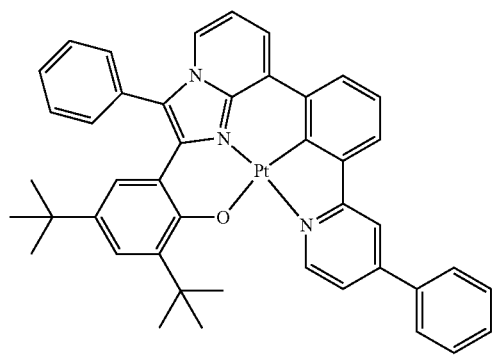
23
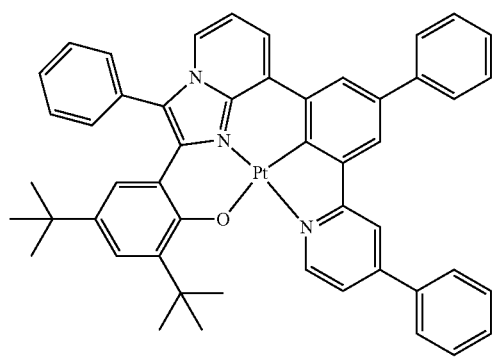
24
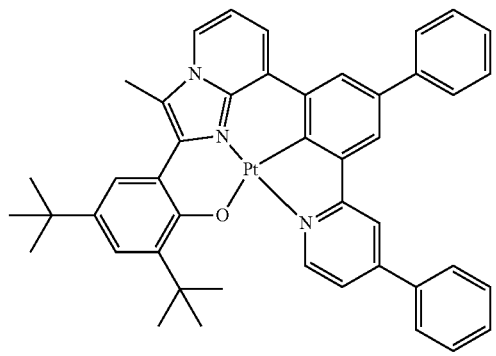
25
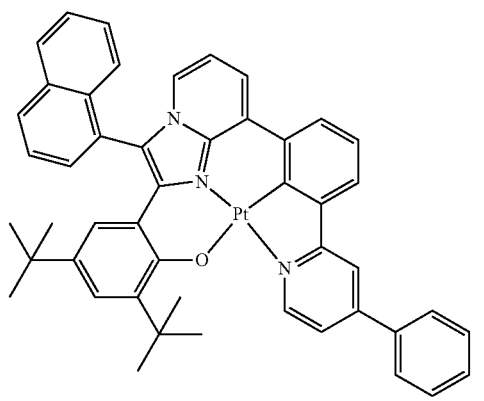
26
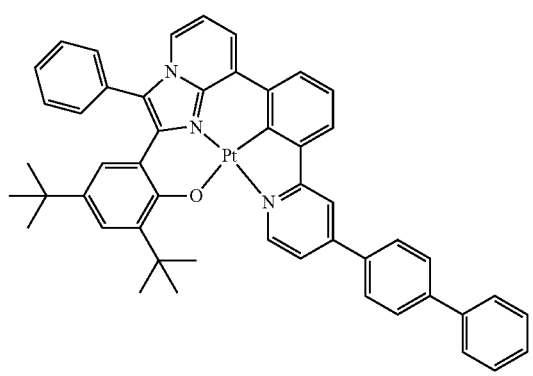
27
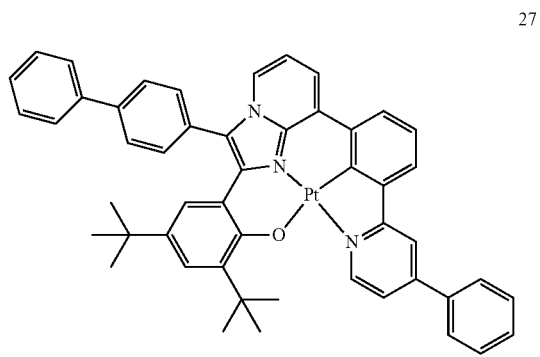

28
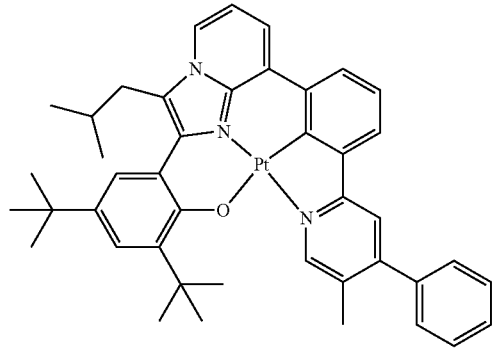
29
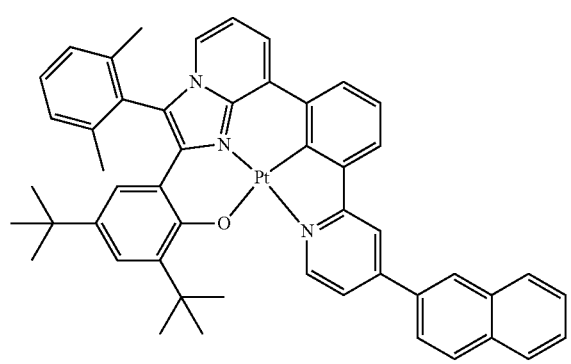
30
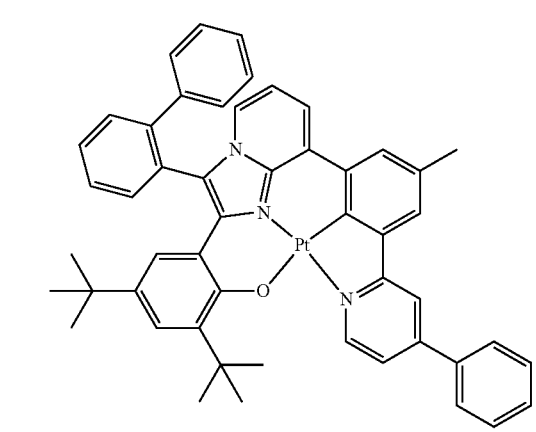
31
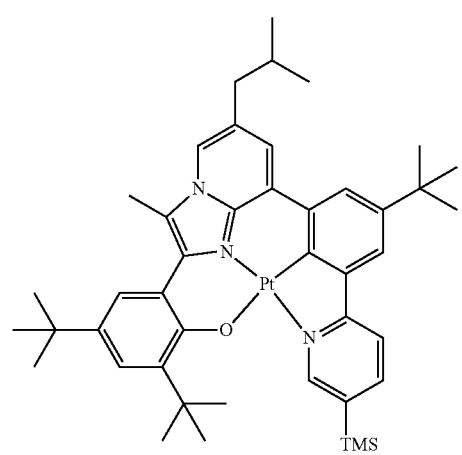
32
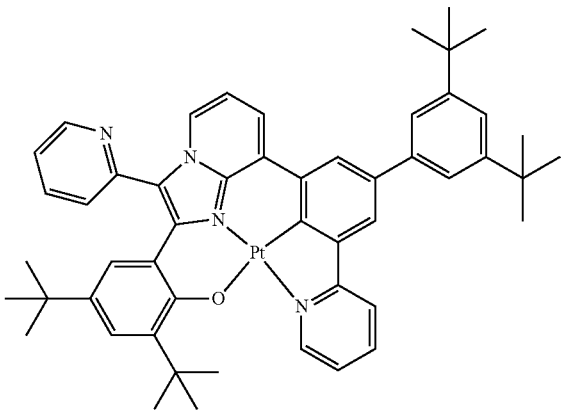
33
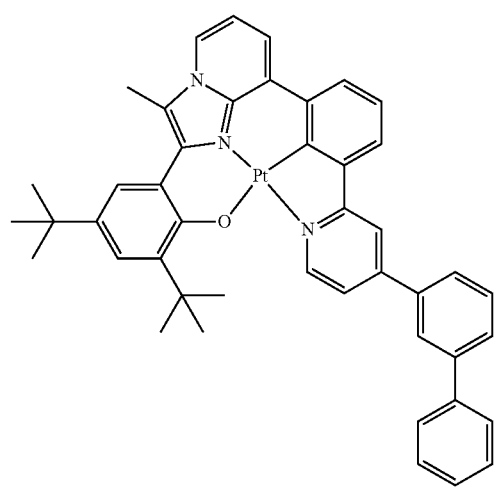
34
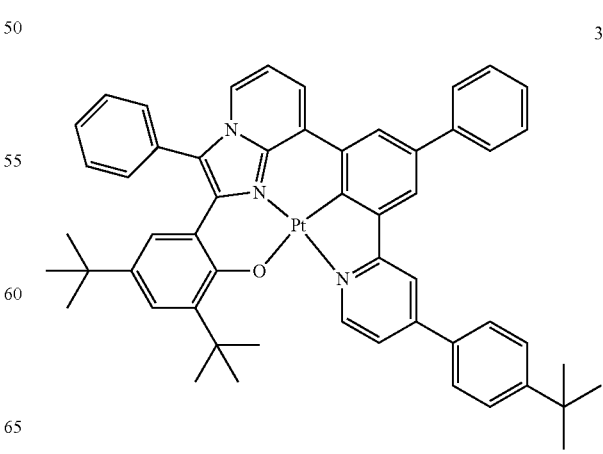

| 35 | 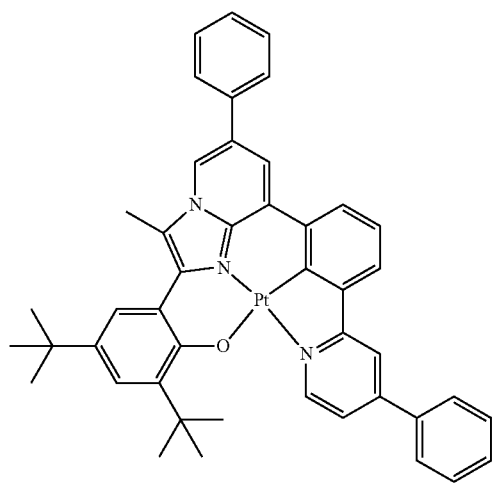 | 38 | 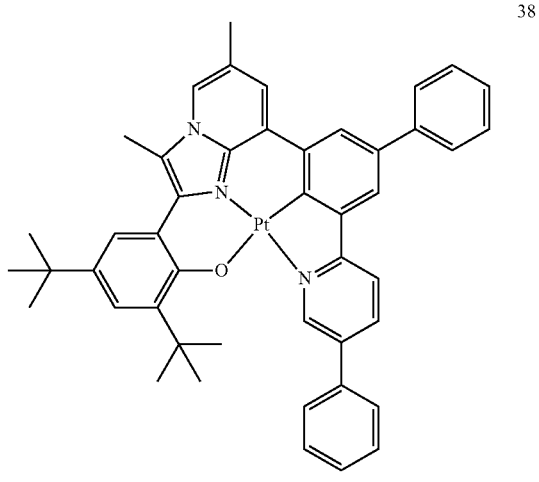 |
| 36 | 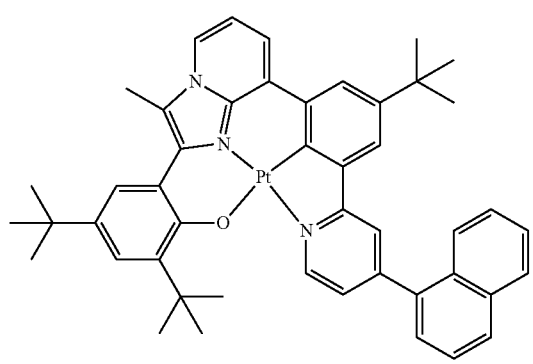 | 39 | 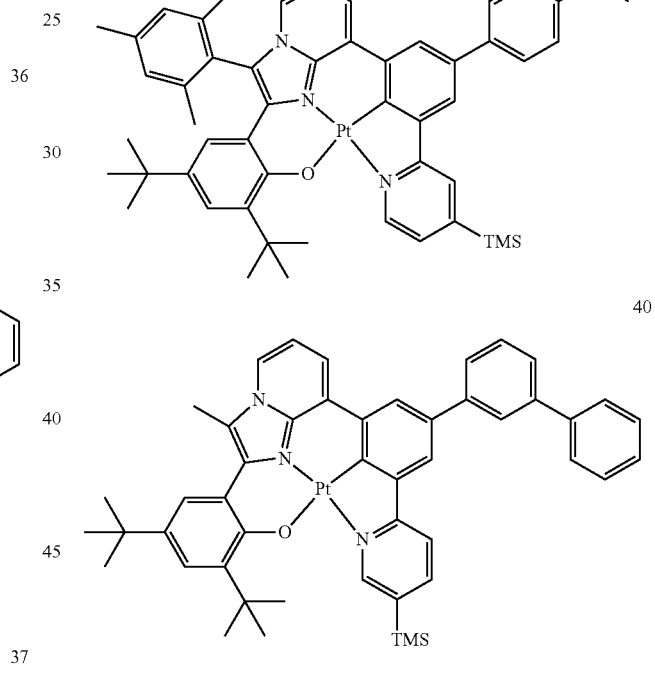 |
| 37 | 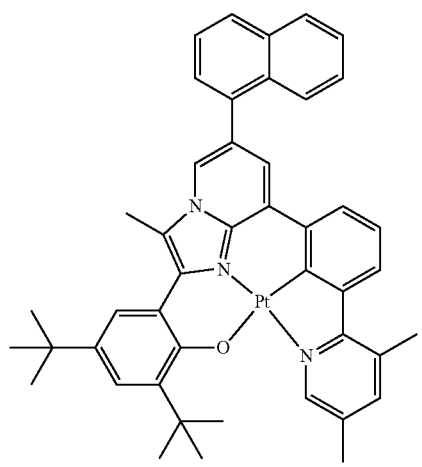 | 40 | |
| | | 41 | 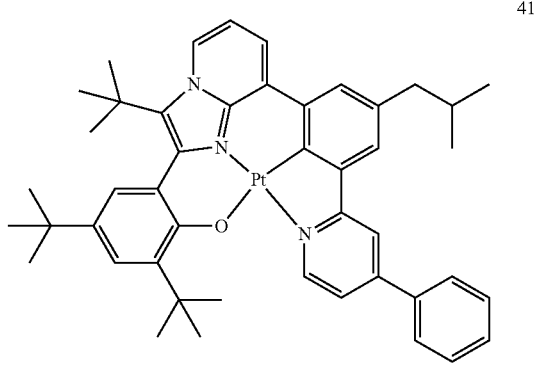 |

42
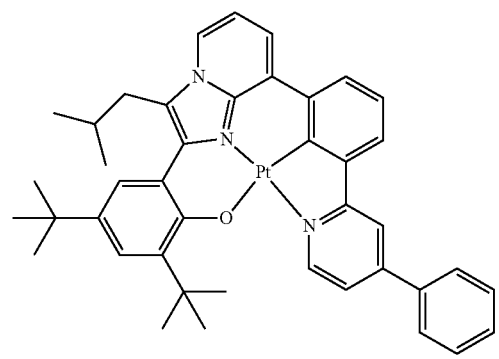
43
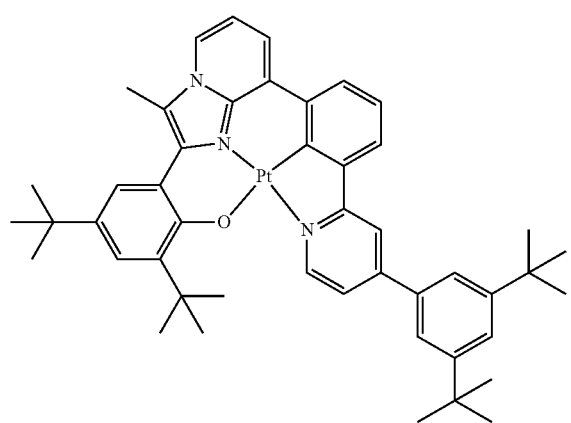
44
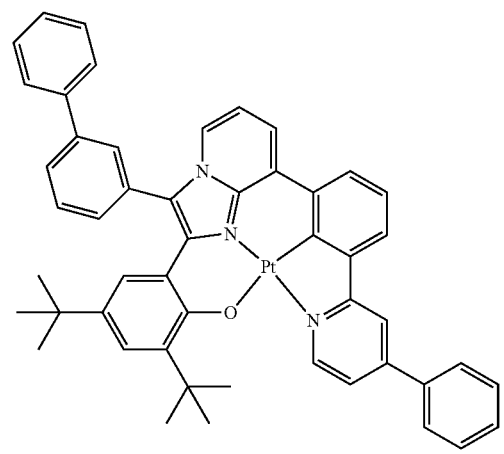
45
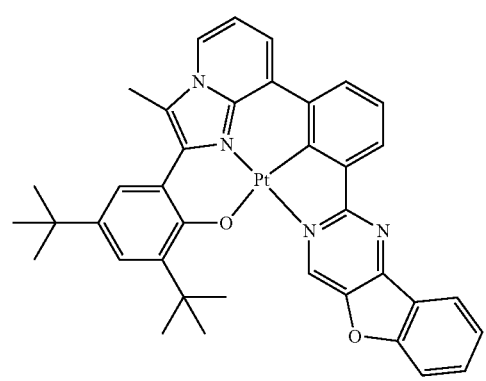
46
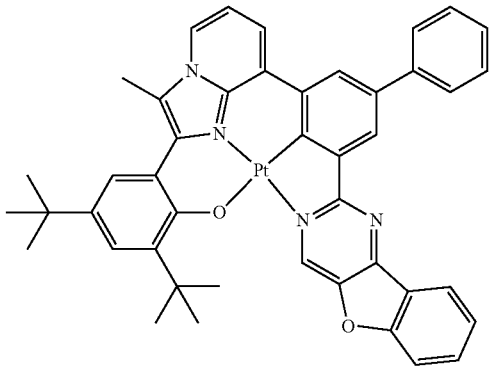
47
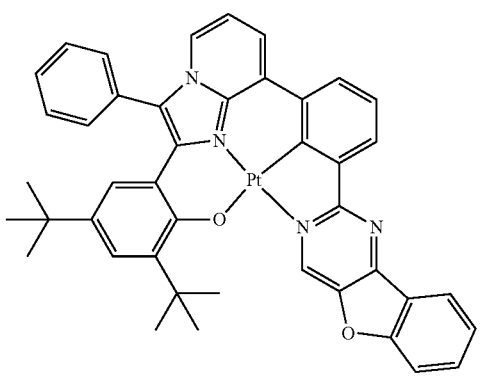
48
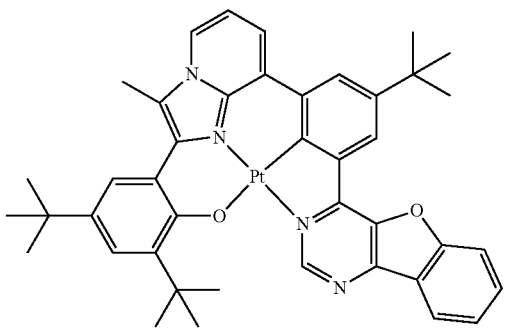
49
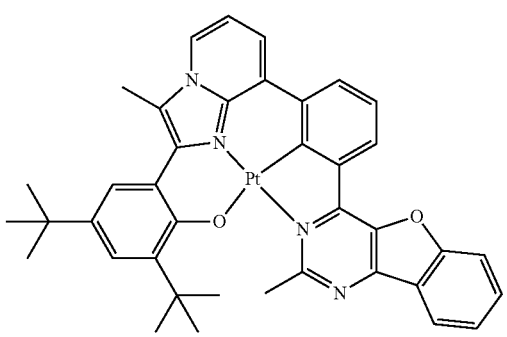

183
-continued
50
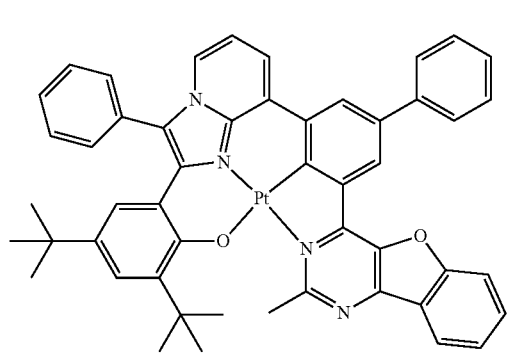
51
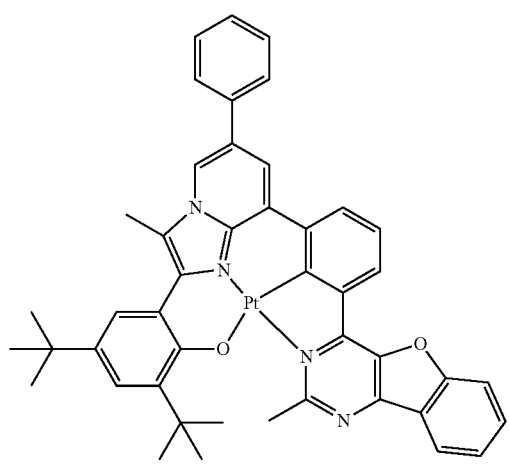
52
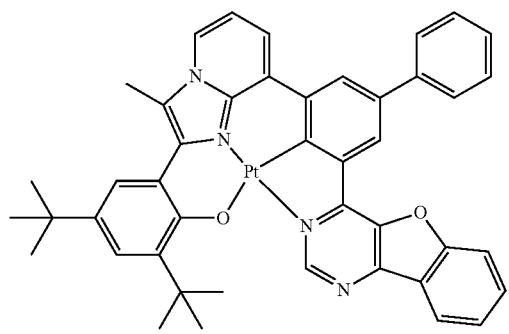
53
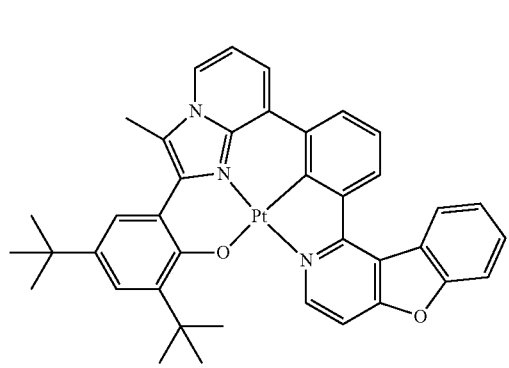
184
-continued
54
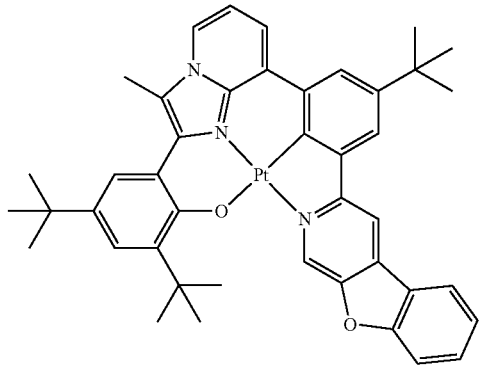
55
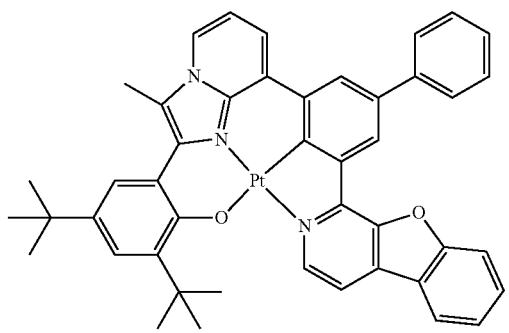
56
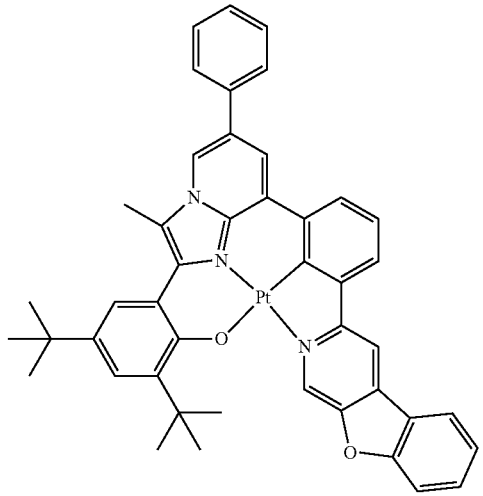
57
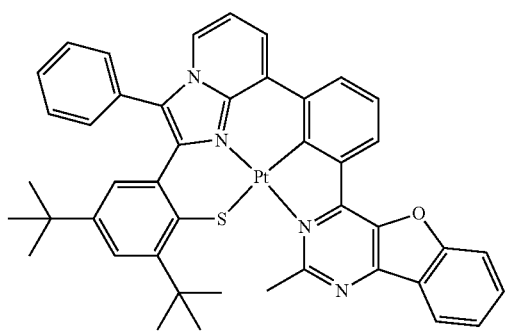

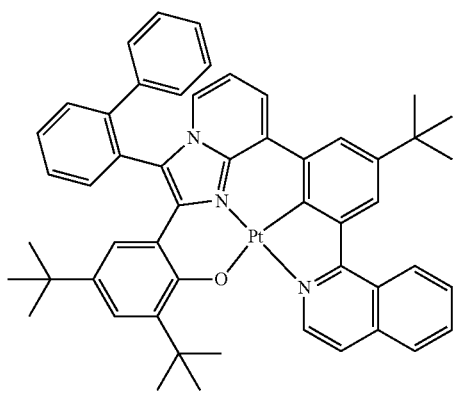
58
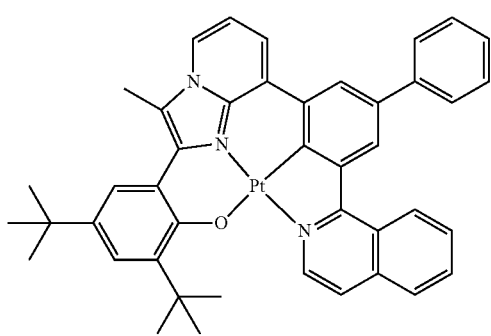
59
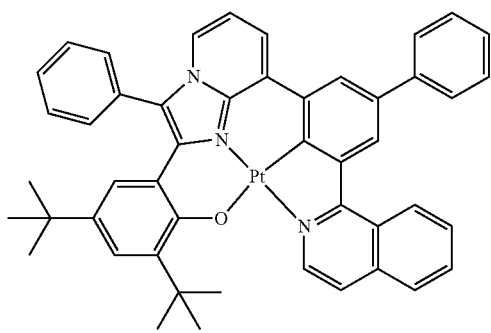
60
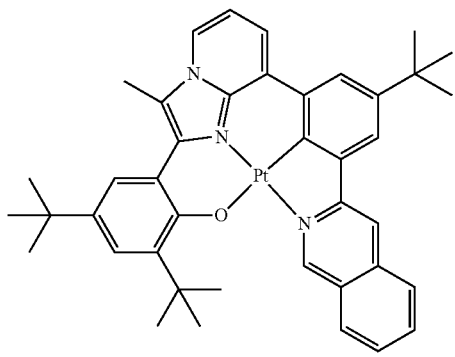
61
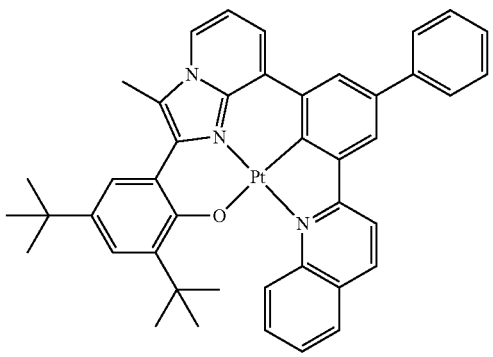
62
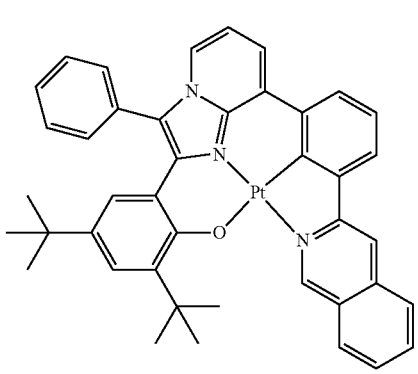
63
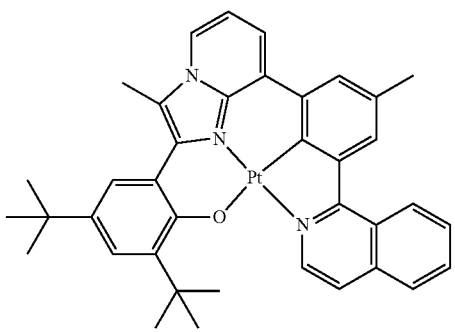
64
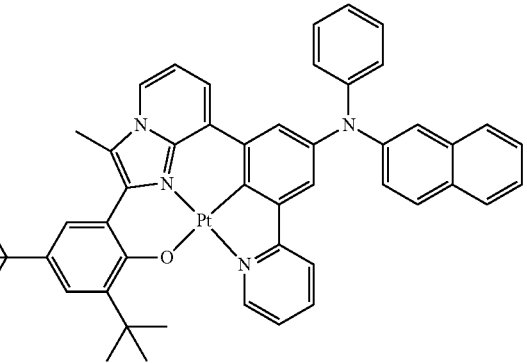
65

-continued
66
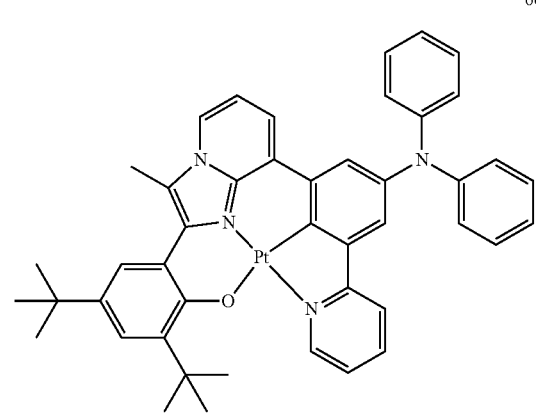
67
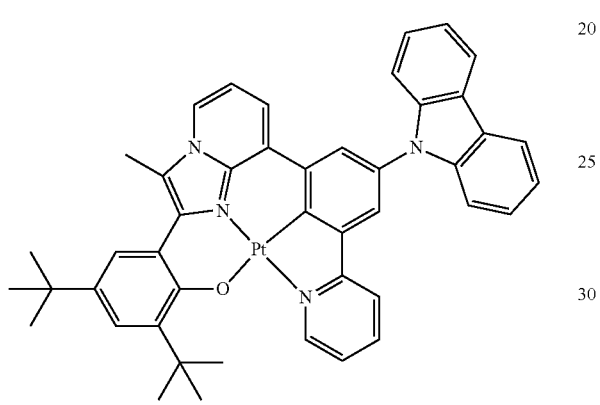
68
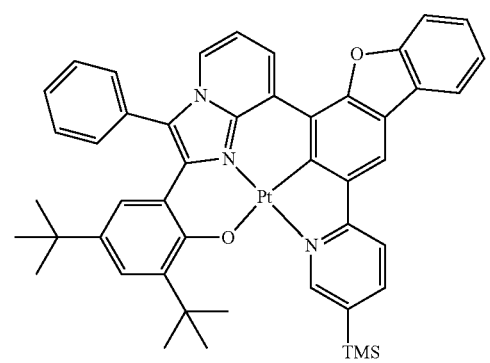
69
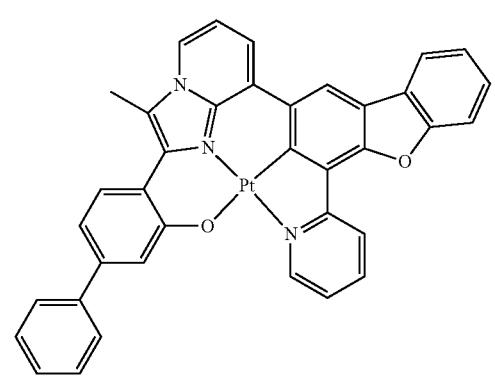
-continued
70
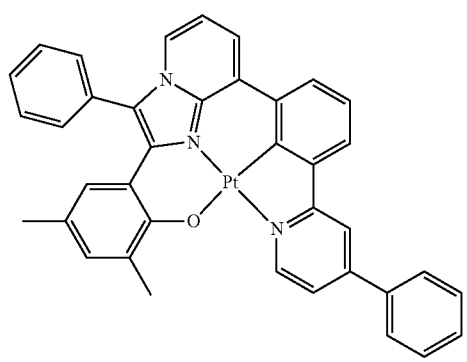
71
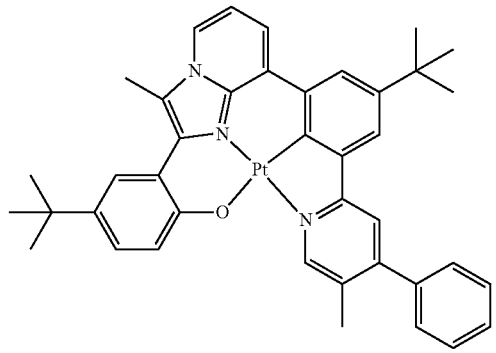
72
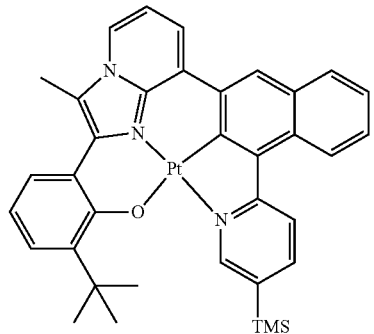
73
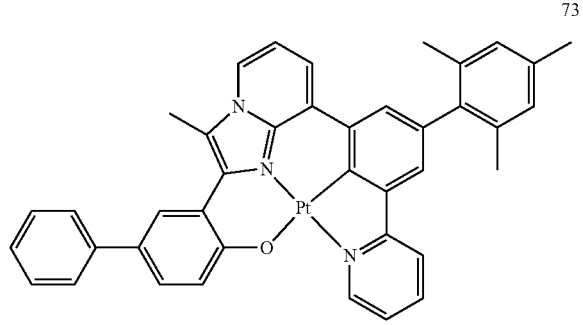

-continued
74
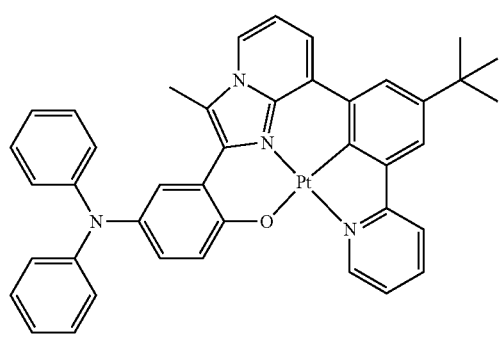
75
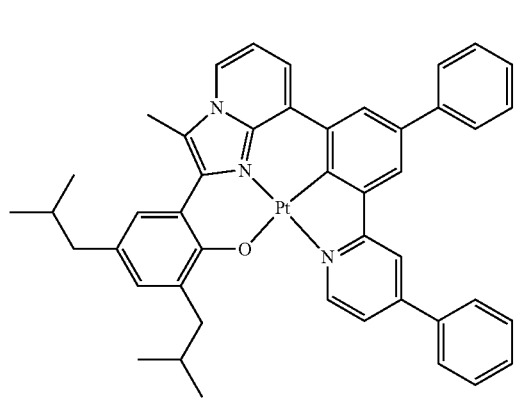
76
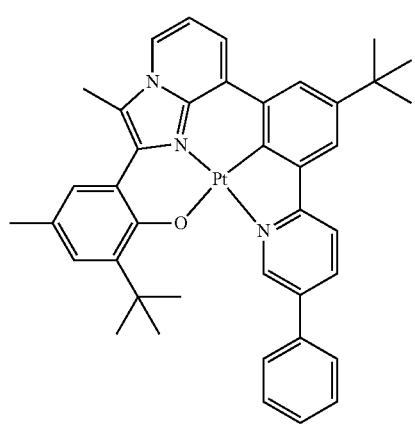
77
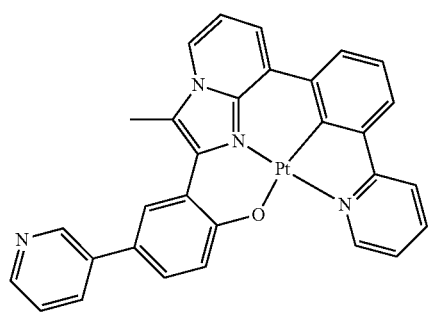
-continued
78
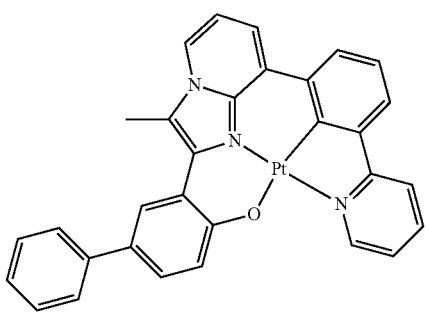
79
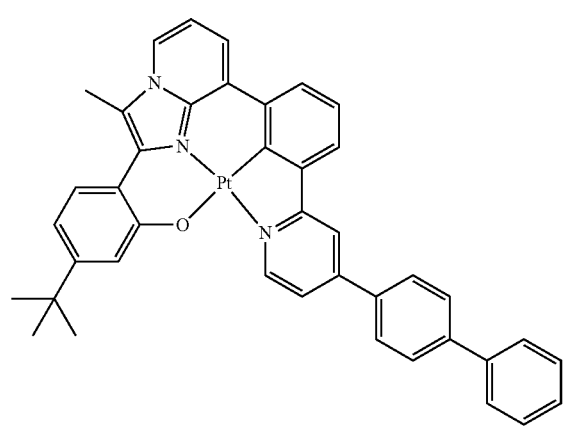
80
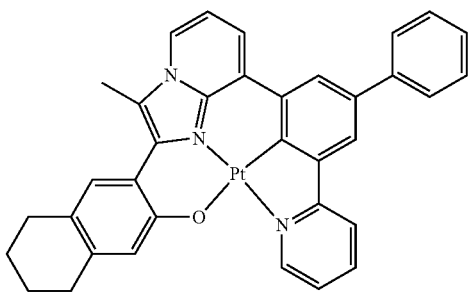
81
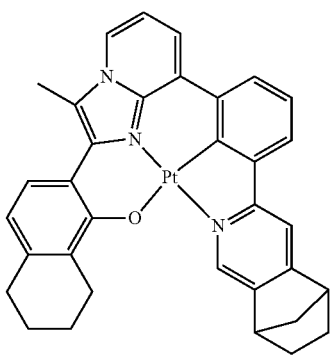

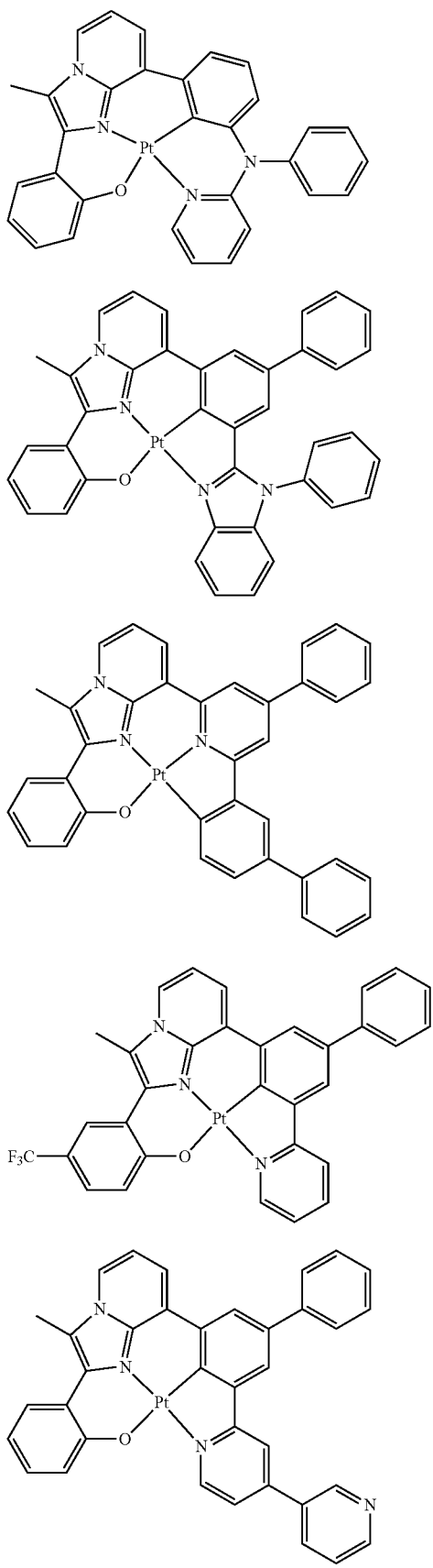

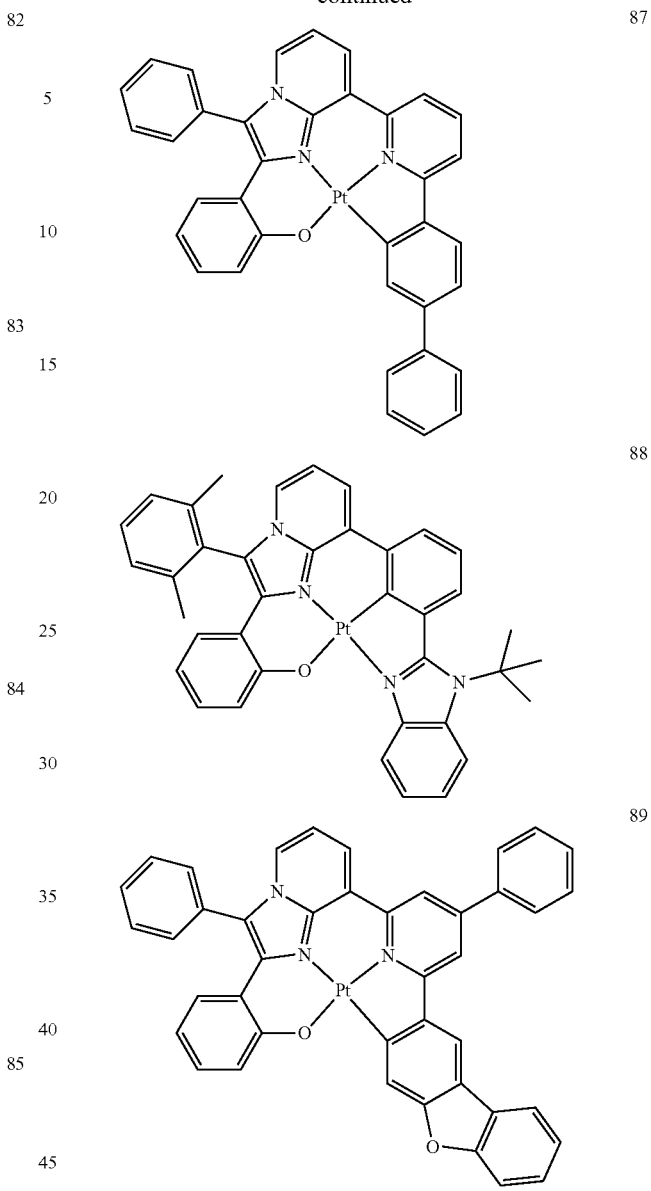

wherein in Formulae 7, 19, 31, 39, 40, 68, and 72, the term "TMS" represents a trimethylsilyl group.

16. An organic light-emitting device comprising:
a first electrode;
a second electrode; and
an organic layer disposed between the first electrode and the second electrode,
wherein the organic layer comprises an emission layer and at least one organometallic compound of claim 1.

17. The organic light-emitting device of claim 16, wherein
the first electrode is an anode,
the second electrode is a cathode, and
the organic layer comprises a hole transport region disposed between the first electrode and the emission layer and an electron transport region disposed between the emission layer and the second electrode,
wherein the hole transport region comprises at least one of a hole injection layer, a hole transport layer, and an electron blocking layer, and wherein the electron transport region comprises at least one of a hole blocking layer, an electron transport layer, and an electron injection layer.

18. The organic light-emitting device of claim 16, wherein the emission layer comprises the organometallic compound.

19. The organic light-emitting device of claim 18, wherein the emission layer further comprises a host in an amount of greater than an amount of the organometallic compound.

20. A diagnostic composition comprising at least one of the organometallic compound of claim 1.

21. The organometallic compound of claim 14, wherein $M_{11}$ is Pt, Pd, Cu, Ag, or Au; $Y_{11}$ is $CR_{17}$; and $a_{11}$, $a_{12}$, and $a_{13}$, are each 0; and $R_{17}$ is selected from a substituted or unsubstituted $C_1$-$C_{60}$ alkyl group, a substituted or unsubstituted $C_3$-$C_{10}$ cycloalkyl group, a substituted or unsubstituted $C_1$-$C_{10}$ heterocycloalkyl group, a substituted or unsubstituted $C_6$-$C_{60}$ aryl group, or a substituted or unsubstituted $C_1$-$C_{60}$ heteroaryl group.

* * * * *